(12) United States Patent
Nakao et al.

(10) Patent No.: US 6,890,692 B2
(45) Date of Patent: May 10, 2005

(54) METHOD OF FOCUS MONITORING AND MANUFACTURING METHOD FOR AN ELECTRONIC DEVICE

(75) Inventors: Shuji Nakao, Hyogo (JP); Yuki Miyamoto, Hyogo (JP); Naohisa Tamada, Hyogo (JP); Shinroku Maejima, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 41 days.

(21) Appl. No.: 10/860,244

(22) Filed: Jun. 4, 2004

(65) Prior Publication Data

US 2004/0219441 A1 Nov. 4, 2004

Related U.S. Application Data

(62) Division of application No. 10/115,246, filed on Apr. 4, 2002, now Pat. No. 6,764,794.

(30) Foreign Application Priority Data

Oct. 15, 2001 (JP) ........................................ 2001-316718

(51) Int. Cl.$^7$ ................................................. G03F 9/00
(52) U.S. Cl. ........................................ 430/30; 430/311
(58) Field of Search ................................ 430/5, 30, 311

(56) References Cited

U.S. PATENT DOCUMENTS

| 5,300,786 A | 4/1994 | Brunner et al. ............. 250/548 |
| 2003/0219655 A1 | 11/2003 | Sutani et al. .................. 430/5 |

FOREIGN PATENT DOCUMENTS

| JP | 63-306626 | 12/1988 |
| JP | 6-120116 A | 4/1994 |
| JP | 11-102061 A | 4/1999 |
| JP | P2002-289494 A | 10/2002 |

OTHER PUBLICATIONS

T.A. Brunner et al., "Simulations and experiments with the phase shift focus monitor", SPIE vol. 2726, pp. 236–243.

*Primary Examiner*—Christopher G. Young
(74) *Attorney, Agent, or Firm*—McDermott Will & Emery LLP

(57) ABSTRACT

A photomask for focus monitoring of the present invention is provided with a substrate that allows the exposure light to pass through and a unit mask structure for focus monitoring. Unit mask structure for focus monitoring has two patterns, and that are formed on the surface of substrate and a light blocking film that has a rear surface pattern that is formed on the rear surface of substrate for substantially differentiating the incident directions of the exposure light that enters two patterns, and for position measurement. When the dimension of rear surface pattern is L and the wavelength of the exposure light is $\lambda$, $L/\lambda$ is 10, or greater.

4 Claims, 41 Drawing Sheets

REAR SURFACE OF MASK

TOP SURFACE OF MASK

REAR SURFACE OF MASK

TOP SURFACE OF MASK

Z = +DEFOCUS

IMAGE INTENSITY

Z = OPTIMAL

—·— IMAGE RESULTING FROM ILLUMINATION OF LEFT HALF

—··— IMAGE RESULTING FROM ILLUMINATION OF RIGHT HALF

—— IMAGE RESULTING FROM ENTIRETY OF ILLUMINATION

Z = −DEFOCUS

205b1  −1 ORDER   0 ORDER   205b2         +1 ORDER LIGHT
       LIGHT     LIGHT

ILLUMINATION OF SMALL σ OF
WHICH THE INTERFERENCE IS HIGH

METHOD OF FOCUS MONITORING AND MANUFACTURING METHOD FOR AN ELECTRONIC DEVICE

This application is a divisional of application Ser. No. 10/115,246 filed Apr. 4, 2002, now U.S. Pat. No. 6,764,794.

BACKGROUND OF THE INVENTION

1. Field of the Invention

The present invention relates to a photomask for focus monitoring, a method of focus monitoring, a unit for focus monitoring and a manufacturing method of the electronic device.

2. Description of the Background Art

Increases in the integration and the miniaturization in semiconductor integrated circuits have been remarkable in recent years. Together with that, the miniaturization of the circuit pattern formed on a semiconductor substrate (hereinafter referred to simply as a wafer) has greatly progressed.

In particular, photolithographic technology is widely recognized as a basic technology in the pattern formation. Accordingly, a variety of developments and improvements have been carried out up to the present time. However, the miniaturization of patterns shows no signs of slowing down and demand for increase in resolution of the patterns is on the increase.

Such a photolithographic technology is a technology for transcribing patterns from a photomask (original image) to a photoresist applied on a wafer so that an etched film in the lower layer is patterned by using this transcribed photoresist.

At this time of photoresist transcription, a development treatment is carried out on the photoresist and a photoresist wherein the portion hit by light through this development treatment is removed is called a positive type while a photoresist wherein the portion hit by light is not removed is called a negative type photoresist.

In general, the resolution limit R (nm) in photolithographic technology using a downscaling exposure method is represented as:

$$R = k_1 \cdot \lambda / (NA)$$

Here, $\lambda$ is the wavelength (nm) of the utilized light, NA is the numerical aperture in the projection optical lens system and $k_1$ is a constant depending on the image formation condition and the resist process.

As is seen from the above equation, there is a method of making the values of $k_1$ and $\lambda$ smaller and of making the value of NA larger in order to achieve an increase in the resolution limit R, that is to say, to gain microscopic patterns. That is to say, in addition to making the constant, which depends on the resist process, smaller, a shortening of the wavelength and an increase of NA may be implemented.

From among these, a shortening of the wavelength of the light source is technically difficult and, therefore, it becomes necessary to increase the NA for the same wavelength. When an increase in NA is implemented, however, the focal depth $\delta(\delta = k_2 \cdot \lambda / (NA)^2)$ of light becomes shallow and, therefore, there are problems such that deterioration in form and in dimension precision of formed patterns is caused.

In order to expose a photoresist according to the patterns of a photomask with a high resolution using such photolithographic technology, it is necessary to carry out the exposure under the condition wherein the photoresist accords with the optimal image formation surface (optimal focus surface) of the projection optical system within the range of the focal depth. Therefore, it is necessary to precisely find the distance from the surface of the exposed substrate to the projection optical system. The process of finding this distance is called focus monitoring.

Concerning conventional focus monitoring, there is, for example, the method of phase shift focus monitoring developed by Brunner of IBM Corporation and sold by Benchmark Technology Corporation of the United States and the phase shift focus monitoring mask that is used in this method.

FIG. 56 is a view for describing the operational principle of the method of phase shift focus monitoring. In reference to FIG. 56, a phase shift focus monitoring mask 105 is used in this method of phase shift focus monitoring. This phase shift focus monitoring mask 105 has a transparent substrate 105a, a light blocking film 105b having a predetermined pattern and a phase shifter 105c that is formed on this predetermined pattern.

Concretely, this phase shift focus monitoring mask 105 has a pattern wherein a thin light blocking pattern 105b is arranged between sufficiently thick transmission portions 105d and 105e, as shown in FIG. 57. Here, a phase shifter 105c is not placed in transmission portion 105d while a phase shifter 105c is placed on transmission portion 105e.

In reference to FIG. 56, in this method of phase shift focus monitoring, first, phase shift focus monitoring mask 105 is irradiated with light. At this time, since phase shifter 105c is formed so as to shift the phase of the transmission light by approximately 90°, in the case that the light that has passed through transmission portion 105e precedes the light that has passed through the transmission portion 105d by the optical path difference of 1/4 $\lambda$, 5/4 $\lambda$ . . . , or in the case that the light that has passed through transmission portion 105e succeeds the light that has passed through the transmission portion 105d by the optical path difference of 3/4 $\lambda$, 7/4 $\lambda$ . . . , the light acts in a mutually reinforcing manner. Thereby, the light after passing through phase shift focus monitoring mask 105 has an asymmetric intensity distribution with respect to the z axis (optical axis). This light that has passed through phase shift focus monitoring mask 105 is condensed by means of projection lens 119a and 119b so as to form an image on a photoresist 121b, which is on a semiconductor substrate 121a.

According to this method of phase shift focus monitoring, an image is formed on photoresist 121b under the condition wherein the intensity distribution of the diffracted light is asymmetric with respect to the z axis (optical axis: the longitudinal direction in the figure). Therefore, an image of the pattern shifts in the direction (x-y direction: lateral direction in the figure) perpendicular to the z axis (optical axis) on wafer 121 due to the shift of wafer 121 in the z direction. By measuring this amount of shift of the image of the pattern in the x-y direction, the measurement of the position in the z direction, that is to say the measurement of the focus, becomes possible.

In addition to the above described method of phase shift focus monitoring there is a method disclosed in, for example, Japanese Patent Laying-Open No. 6-120116(1994) that is a method of focus monitoring. In this method, a first predetermined pattern in the photomask surface is first irradiated with an exposure light of which the main light beam has the first angle of inclination and, thereby, the first image of the first predetermined pattern is exposed on a substrate of photosensitive material. After that, a second predetermined pattern that is different from the above first predetermined pattern is irradiated with an exposure light of which the main light beam has a second angle of inclination that differs from the first angle of inclination and, thereby, the second image of the second predetermined pattern is exposed on the substrate of the photosensitive material. By measuring the distance between the exposed first and second images, the distance from the position of the substrate of the photosensitive material to the optimal image formation surface can be found from the relationship between this distance and the amount of defocus.

In this method, a predetermined pattern on the photomask surface is irradiated according to the first angle of inclination or according to the second angle of inclination and, therefore, a photomask 205 having the structure as shown in FIG. 58 is used.

In reference to FIG. 58, this photomask 205 has a transparent substrate 205a, marks for position measurement 205$b_1$ and 205$b_2$ formed on the surface of this transparent substrate 205a and a diffraction grid pattern 205c formed on the rear surface of transparent substrate 205a. That is to say, an exposure light that has struck photomask 205 is diffracted by diffraction grid pattern 205c so that mark for position measurement 205$b_1$ is irradiated according to the first angle of inclination and mark for position measurement 205$b_2$ is irradiated according to the second angle of inclination.

In the above described phase shift focusing monitor, however, it is necessary to use a phase shift mask of a specific structure as photomask 105. There is a problem point that the photomask becomes expensive because a photomask of such a specific structure is necessary.

In addition, in a conventional method of phase shift focus monitoring, it is necessary to use illumination which is isotropic (pupil plane is circular) and of which the angle spread is small, that is to say that has a small a value, in order to gain a high detection sensitivity in the z direction (ratio of the of shift amount in the x-y direction to the shift amount in the z direction). This is described in T. A Brunner et al., "Simulations and experiments with the phase shift focus monitor," SPIE Vol. 2726, pp. 236–243. In particular, FIG. 4 of the above reference shows that when the σ value is 0.3, the shift amount in the x-y direction of the pattern (focus monitor overlay error) becomes of the maximum and the detection sensitivity in the z direction becomes high.

It is necessary to reduce the diameter of aperture 14d of illumination aperture unit 14, such as the illumination diaphram as shown in, for example, FIG. 59.

However, when the device pattern is formed by using illumination of which the σ value is small, such as approximately 0.3, the coherence of the light is too intense and transformation of the secondary pattern transcribed to the photoresist becomes significant. In order to prevent such transformation of the secondary pattern, it is necessary to make the σ value be, for example, 0.6 or higher, by making the diameter of the aperture of the illumination aperture unit 14 used at the time device pattern formation greater than the diameter of the aperture of the illumination aperture unit 14 used at the time of focus monitoring. Therefore, illumination aperture unit 14 must be replaced at the time between focus monitoring and device pattern formation and, therefore, there is a problem that labor and maintenance become necessary for the replacement.

In addition, since at the time of replacement the lenses become clouded in the case that an oxygen mixture remains in the illumination optical system, it is necessary to carry out oxygen purging by introducing nitrogen for a long period of time after the replacement and, therefore, there is a problem such that the operation becomes complicated.

In addition, in a method disclosed in the Japanese Patent Laying-Open No. 6-120116(1994), it is necessary to form a diffraction grid pattern 205c on the rear surface of a photomask 205 as shown in FIG. 58. It is necessary for this diffraction grid pattern 205c to be a microscopic pattern so as to allow light to diffract. There is a problem point that the process dimensions become small because of the necessity for forming such a microscopic pattern and the fabrication of the photomask becomes difficult.

In addition, it is necessary to illuminate only the portion of the rear surface of photomask 205 where diffraction grid pattern 205c exists with an exposure light and, therefore, there is also a problem that the illumination range must be concentrated in one small portion.

SUMMARY OF THE INVENTION

A purpose of the present invention is to provide a photomask for focus monitoring, a method of focus monitoring, a unit for focus monitoring and a manufacturing method for the electronic device, wherein the fabrication of the photomask is easy and the replacement of the illumination aperture unit is unnecessary while focus monitoring of which the detection sensitivity in the z direction is high becomes possible.

A photomask for focus monitoring of the present invention is a photomask for focus monitoring that is used for focus monitoring wherein a position in an optical system of the exposed surface is measured in order to adjust the focus of the optical image on the exposed surface at the time of pattern exposure and is provided with a substrate that allows the exposure light to pass through and unit mask structures for focus monitoring. A unit mask structure for focus monitoring is provided with two patterns for position measurement and a light blocking film. The two patterns for position measurement are formed on the surface of the substrate in order to measure the relationship between the mutual positions. The light blocking film is formed on the rear surface of the substrate and has a rear surface pattern for substantially differentiating the incident directions of the exposure light that enters the two patterns for position measurement. When the dimension of the rear surface pattern is L and the wavelength of the exposure light is λ, L/λ is 10 or higher.

According to the photomask for focus monitoring of the present invention, the dimension L of the rear surface pattern is determined so that L/λ becomes 10 or higher, and, therefore, the dimensions of the pattern can be sufficiently enlarged to the degree such that diffraction can be ignored. Since the process dimensions of the rear surface pattern become enlarged in such a manner, the fabrication of the photomask for focus monitoring becomes easy.

In addition, by sufficiently differentiating the incident directions of the exposure light that enters the two patterns for position measurement through the provision of such a rear surface pattern, a high detection sensitivity in the z direction, of which the degree is approximately the same as that of the method of phase shift focus monitoring wherein the σ value is reduced using the conventional illumination, can be gained. In addition, it is not necessary to reduce the σ value as in the phase shift focusing monitoring method and, therefore, it is not necessary to replace the illumination aperture unit at the time between focus monitoring and device pattern formation.

In the above described photomask for focus monitoring, the rear surface pattern formed in the light blocking film, on the rear surface of the substrate, is preferably formed so as to block a portion the exposure light that enters, at least, either of the two patterns for position measurement and so as to allow only the remaining exposure light to enter in the case that the light blocking film is not formed.

Thereby, the incident directions of the exposure light that enters the two patterns for position measurement can be made to differ substantially by providing a light blocking film having patterns.

In the above described photomask for focus monitoring, the rear surface pattern preferably consists of a group of patterns that are shared by the two patterns for position measurement.

Thereby, it is not necessary to provide the rear surface patterns in the same number as the number of patterns for position measurement so that the number of rear surface patterns can be reduced.

In the above described photomask for focus monitoring, the rear surface pattern preferably consists of a pattern that is symmetrically arranged with respect to a point of the rear surface of the substrate facing the central point between the two patterns for position measurement.

Thereby, design of the rear surface pattern becomes easy.

In the above described photomask for focus monitoring, the above described pattern symmetrically arranged with respect to the point on the rear surface of the substrate is preferably arranged symmetrically with respect to the second fictitious line gained by projecting the bisector perpendicular to the first fictitious line connecting two patterns for position measurement to the rear surface of the substrate.

Thereby, telecentricity of the exposure light that irradiates the two patterns for position measurement can be made to be symmetric.

In the above described photomask for focus monitoring, the rear surface pattern is preferably an aperture pattern that is substantially circular.

The incident direction of the exposure light that enters the two patterns for position measurement can be made to differ substantially even when such a circular aperture pattern is used.

In the above described photomask for focus monitoring, when the aperture diameter of the circular aperture pattern that becomes the rear surface pattern is r, the depth of the substrate is D, the numerical aperture is NA and the coherence that is the coherency index of the exposure light is $\sigma$, the value of $\sin(\tan^{-1}(r/D))$ is preferably smaller than the INA value(=NA×$\sigma$/projection magnification) that is the amount of spread of illumination.

In the case that the value of $\sin(\tan^{1}(r/D))$ is the INA value or higher, a portion of the exposure light that enters the patterns for position measurement cannot be blocked depending on the arrangement position of the rear surface pattern and, thereby, the incident directions of the exposure light that enters the two patterns for position measurement cannot be made to differ.

In the above described photomask for focus monitoring, when the aperture diameter of the circular aperture pattern that becomes the rear surface pattern is r, the depth of the substrate is D, the numerical aperture is NA and the coherence that is the coherency index of the exposure light is $\sigma$, the value of $\sin(\tan^{-1}(r/D))$ is greater than the value of the INA value(=NA×$\sigma$/projection magnification), which is the amount of spread of illumination, multiplied by 0.1.

In the case that the value of $\sin(\tan^{-1}(r/D))$ is the value of the INA value multiplied by 0.1 or less, the amount of the exposure light becomes ¹⁄₁₀₀ of the case of the conventional transcription or less, and it becomes difficult to transcribe the patterns for position measurement to the photosensitive material. As a result, the throughput of the measurement of the focus is lowered.

In the above described photomask for focus monitoring, the rear surface pattern is preferably a pattern that allows a light blocking film to remain in a substantially a circular form.

The incident directions of the exposure light that enters the two patterns for position measurement can be made to differ substantially by using, in the above manner, the pattern that allows a circular light blocking film to remain.

In the above described photomask for focus monitoring, when the aperture diameter of the pattern that allows a circular light blocking film to remain that becomes the rear surface pattern is r, the depth of the substrate is D, the numerical aperture is NA and the coherence that is the coherency index of the exposure light is $\sigma$, the value of $\sin(\tan^{-1}(r/D))$ is preferably smaller than the INA value (=NA×$\sigma$/projection magnification) that is the amount of spread of illumination.

In the case that the value of $\sin(\tan^{-1}(r/D))$ is the INA value or higher, a portion of the exposure light that enters the patterns for position measurement cannot be blocked depending on the arrangement position of the rear surface pattern and, thereby, the incident directions of the exposure light that enters the two patterns for position measurement cannot be made to differ.

In the above described photomask for focus monitoring, when the aperture diameter of the pattern that allows a circular light blocking film to remain which becomes the rear surface pattern is r, the depth of the substrate is D, the numerical aperture is NA and the coherence that is the coherency index of the exposure light is $\sigma$, the value of $\sin(\tan^{-1}(r/D))$ is preferably greater than the value of the INA value (=NA×$\sigma$/projection magnification), which is the amount of spread of illumination, multiplied by 0.5.

In the case that the value of $\sin(\tan^{-1}(r/D))$ is the value of the INA value multiplied by 0.5 or less, the light blocking portion becomes small and it becomes difficult to secure the non-telecentric characteristics of the exposure light. As a result, the detection sensitivity of the pattern in focus monitoring is lowered.

Now, the meaning of non-telecentric characteristics is that, for example, the main light beam of the exposure light enters the exposed body with an inclination relative to the optical axis of the illumination optical system.

In the above described photomask for focus monitoring, the rear surface pattern is preferably a rectangular aperture pattern.

By using a rectangular aperture pattern in such a manner, the incident directions of the exposure light that enters the two patterns for position measurement can be made to differ substantially.

In the above described photomask for focus monitoring, when the thickness of the substrate is D, the numerical aperture is NA and the coherence, which is the interference indication of the exposed light, is $\sigma$, the part within the range where the distance from the sides of the rectangular aperture pattern, which is the rear surface pattern, is R or less, satisfying the equation $\sin(\tan^{-1}(R/D)) \geq$ INA value (=NA×$\sigma$/projection magnification), is preferably the light blocking part wherein a light blocking film is formed.

Thereby, only the illumination light from the rectangular aperture pattern can be made to enter each of the two patterns for position measurement so that the non-telecentric characteristics of the exposure light can be firmly secured.

In the above described photomask for focus monitoring, the rectangular aperture pattern is preferably a square aperture pattern.

In the case that a square aperture pattern is used in such a manner, the incident directions of the exposure light that enters the two patterns for position measurement can also be made to differ substantially.

In the above described photomask for focus monitoring, the two patterns for position measurement are preferably located, respectively, in the positions on the surface of the substrate that face the center points of the respective sides of the square aperture pattern facing each other.

Thereby, the two patterns for position measurement can be respectively illuminated with illumination light of which the distribution of the incident angle is half as in the case wherein the rear surface light blocking film, which is complementary, does not exist.

In the above described photomask for focus monitoring, when the length of a side of the square aperture pattern, which is the rear surface pattern, is a, the thickness of the substrate is D, the numerical aperture is NA and the coherence, which is the interference indication of the exposure light, is σ, the value of $\sin(\tan^{-1}(a/D))$ is preferably greater than a value twice the INA value (=NA×σ/projection magnification), which is the amount of spread of the illumination.

Thereby, the entirety of the maximum incident angle components of the illumination on the side where the aperture exists can reach the patterns for position measurement through the above square aperture pattern.

In the above described photomask for focus monitoring, when the length of a side of the square aperture pattern, which is the rear surface pattern, is a, the thickness of the substrate is D, the numerical aperture is NA and the coherence, which is the interference indication of the exposure light, is σ, the value of $\sin(\tan^{-1}(a/D))$ is preferably smaller than a value three times the INA value(=OF NA×σ/projection magnification), which is the amount of spread of the illumination.

In the case that the value of $\sin(\tan^{-1}(a/D))$ is three times greater or more, than the INA value, the square aperture pattern becomes too large and, thereby, the unit mask structure for focus monitoring becomes too large to arrange a plurality of unit mask structures, as described above, on the same mask or to carry out focus monitoring in a plurality of points within exposure field.

In the above described photomask for focus monitoring, when the length of a side of the rectangular aperture pattern, which is the rear surface pattern, is a, the thickness of the substrate is D, the numerical aperture is NA and the coherence, which is the interference indication of the exposure light, is σ, the value of $\sin(\tan^{-1}(a/D))$ is preferably greater than a value 0.2 times the INA value (=NA×σ/projection magnification), which is the amount of spread of the illumination.

When the value of $\sin(\tan^{-1}(a/D))$ is 0.2 times the INA value or less, the amount of the exposure light becomes 1/100 or less of the case of a conventional transcription and it becomes difficult to transcribe the patterns for position measurement to the photosensitive material. As a result of this, the throughput of the measurement of the focus is lowered.

In the above described photomask for focus monitoring, the rear surface pattern is preferably a rectangular pattern that allows a light blocking film to remain.

In the case that a rectangular pattern that allows a light blocking film to remain is used in such a manner, the incident directions of the exposure light that enters the two patterns for position measurement can also be made to differ substantially.

In the above described photomask for focus monitoring, when the thickness of the substrate is D, the numerical aperture is NA and the coherence, which is the interference indication of the exposed light, is σ, the part within the range where the distance from the sides of the rectangular pattern that allows a light blocking film to remain, which is the rear surface pattern, is R, or less, satisfying the equation $\sin(\tan^{-1}(R/D)) \geq$ INA value(=NA×σ/projection magnification), is preferably the light blocking part wherein a light blocking film is not provided.

Thereby, an aperture that allows the patterns for position measurement to be exposed with a sufficient amount of light can be created outside of the rectangular pattern that allows a light blocking film to remain.

In the above described photomask for focus monitoring, the rectangular pattern that allows a light blocking film to remain is preferably a square pattern that allows a light blocking film to remain.

In the case that a square pattern that allows a light blocking film to remain is used in such a manner, the incident directions of the exposure light that enters the two patterns for position measurement can also be made to differ substantially.

In the above described photomask for focus monitoring, the two patterns for position measurement are preferably located, respectively, in the positions on the surface of the substrate that face the center points of the sides, respectively facing each other, of the square pattern that allows a light blocking film to remain.

Thereby, the two patterns for position measurement can be respectively illuminated with illumination light of which the distribution of the incident angle is half as in the case wherein the rear surface light blocking film, which is complementary, does not exist.

In the above described photomask for focus monitoring, when the length of a side of the square pattern that allows a light blocking film to remain, which is the rear surface pattern, is a, the thickness of the substrate is D, the numerical aperture is NA and the coherence, which is the interference indication of the exposure light, is σ, the value of $\sin(\tan^{-1}(a/D))$ is preferably greater than a value twice the INA value(=NA×σ/projection magnification), which is the amount of spread of the illumination.

Thereby, the incident angle components of the illumination on the side where the light blocking pattern exists can be completely blocked so as not to reach the patterns for position measurement.

In the above described photomask for focus monitoring, when the length of a side of the square pattern that allows a light blocking film to remain, which is the rear surface pattern, is a, the thickness of the substrate is D, the numerical aperture is NA and the coherence, which is the interference indication of the exposure light, is σ, the value of $\sin(\tan^{-1}(a/D))$ is preferably smaller than a value three times the INA value(=NA×σ/projection magnification), which is the amount of spread of the illumination.

In the case that the value of $\sin(\tan^{-1}(a/D))$ is three times greater or more than the INA value, the square aperture pattern becomes too large and, thereby, the unit mask structure for focus monitoring becomes too large to arrange a plurality of unit mask structures, as described above, on the same mask or to carry out focus monitoring in a plurality of points within exposure field.

In the above described photomask for focus monitoring, when the length of a side of the rectangular pattern that allows a light blocking film to remain, which is the rear surface pattern, is a, the thickness of the substrate is D, the numerical aperture is NA and the coherence, which is the interference indication of the exposure light, is σ, the value of $\sin(\tan^{-1}(a/D))$ is preferably greater than a value 0.5 times the INA value(=NA×σ/projection magnification), which is the amount of spread of the illumination.

When the value of $\sin(\tan^{-1}(a/D))$ is 0.5 times the INA value or less, the light blocking part becomes small and it becomes difficult to secure the non-telecentric characteristics of the exposure light. As a result of this, the pattern detection sensitivity in focus monitoring is lowered.

In the above described photomask for focus monitoring, one of the two patterns for position measurement is preferably an inner box pattern of a box-in-box type while the other is an outer box pattern.

Thereby, the positional shift of the patterns for position measurement in the x-y plane can be easily measured.

In the above described photomask for focus monitoring, a box edge of, at least, either the inner box pattern or of the outer box pattern is preferably formed of either the line pattern, the space pattern or a plurality of hole patterns arranged at constant intervals.

A variety of patterns can be used in such a manner for a box edge of the box pattern.

In the above described photomask for focus monitoring, when a constant depending on the resist process and on the image formation conditions is $k_1$, the wavelength of the exposure light is λ and the numerical aperture is NA, the size S of the pattern in the box edge of, at least, either the inner box pattern or the outer box pattern preferably satisfies $S=k_1×λ/NA(0.3<k_1<0.6)$.

Thereby, measurement of the focus corresponding to the actual device becomes possible.

In the above described photomask for focus monitoring, when the thickness of the substrate is D, the numerical aperture is NA and the coherence, which is the interference indication of the exposure light, is σ, the distance N between the centers of the two patterns for position measurement is preferably greater than 0.5 times and smaller than 4 times the product(=INA value×D) of the INA value, which is the amount of spread of the illumination (=NA×σ/projection magnification), and D.

Thereby, the patterns for position measurement can be appropriately irradiated. In the case that the distance M between the two patterns for position measurement is 0.5 times the value of the INA value×D or less, neither of the two patterns for position measurement can be diagonally irradiated. In addition, making the distance M between the two patterns for position measurement four times the value of the INA value×D or greater does not yield substantial benefits and unnecessarily increases the dimensions of the unit mask structures for focus monitoring such that a large number of unit mask structures for focus monitoring cannot be arranged on the mask.

The above described photomask for focus monitoring is preferably further provided with a mask structure for correcting the wafer position shift amount that has two additional patterns for position measurement, formed on the surface of the substrate, for the measurement of the mutual positional relationship and a pattern formed on a light blocking film formed on the rear surface of the substrate for making substantially equal the incident directions of the exposure light that enters the above two additional patterns for position measurement.

It becomes possible to measure the shift amount of the amount of movement at the time of the carrying out of the second exposure after moving the exposed body, subsequent to the first exposure, by providing at least one mask structure for correcting the wafer position shift amount.

In the above described photomask for focus monitoring, mask structures for correcting the wafer position shift amount is preferably formed in two or more places.

It also becomes possible to measure the shift amount in the rotational direction of the exposed body by providing the mask structures for correcting the wafer position shift amount in two or more places.

In the above described photomask for focus monitoring, the maximum value of the arrangement distance between two arbitrary structures from among mask structures for correcting the wafer position shift amount that are formed in two or more places is preferably greater than ½ of the dimension in the longitudinal direction of the exposure region for one shot.

Thereby, in the case that the exposure region for one shot is exposed while being shifted in the rotational direction, the detection sensitivity of the shift amount in this rotational direction can be increased.

In the above described photomask for focus monitoring, a plurality of unit mask structures for focus monitoring are preferably formed on the substrate so that the pitch between the two neighboring unit mask structures for focus monitoring is no less than 8 mm and no more than 20 mm.

Thereby, at the required spatial distance it becomes possible to measure the distance between the optical system and the surface of the substrate.

The method of focus monitoring according to the present invention is a method of focus monitoring used in focus monitoring for measuring the positions of the exposed surface in the optical system in order to adjust the focus of the optical image vis-à-vis the exposed surface at the time of the exposure of the pattern and focus monitoring is carried out by utilizing the characteristics that the image formed on the surface of photosensitive material of the photomask pattern is moved in the direction perpendicular to the optical axis when it moves in the optical axis direction on the surface of the photosensitive material by irradiating the photomask for focus monitoring with the exposure light. The photomask for focus monitoring is provided with a substrate for the exposure light to pass through and the unit mask structures for focus monitoring. A unit mask structure for focus monitoring has two patterns for position measurement and a light blocking film. The two patterns for position measurement are used to measure the mutual positional relationship formed on the surface of the substrate. The light blocking film is formed on the rear surface of the substrate and has a rear surface pattern that makes the incident directions of the exposure light that enters the two patterns for position measurement substantially differ. When the dimension of the rear surface pattern is L and the wavelength of the exposure light is λ, L/λ becomes 10 or greater.

According to the method of focus monitoring of the present invention, the dimension L of the rear surface pattern is determined so that L/λ becomes 10 or greater, and, thereby, the dimension of the pattern can be enlarged to a degree such that the diffraction can be ignored. Due to the enlargement of the process dimension of rear surface pattern in the above manner, the fabrication of the photomask for focus monitoring is made easy.

In addition, the incident directions of the exposure light that enters the two patterns for position measurement are made to differ substantially by providing such a rear surface pattern and, thereby, a high detection sensitivity in the z direction, to the same degree as in the case wherein the σ value is reduced in the conventional illumination, can be gained. In addition, since it is not necessary to reduce the σ value, it is unnecessary to replace the illumination aperture unit at the time between focus monitoring and device pattern formation.

The above described method of focus monitoring is preferably provided with the step of applying a photoresist to the substrate as a photosensitive material, the step of exposing the applied photoresist to an image of the two patterns for position measurement of the photomask for focus monitoring, the step of forming a resist pattern by developing a patterning the exposed photoresist and the step of focus monitoring based on the mutual distance between the respective image patterns of the two patterns for position measurement that are transcribed to the resist pattern.

Focus monitoring can be carried out by measuring the mutual distance between the respective image patterns of the two patterns for position measurement in the above manner.

In the above described method of focus monitoring, the method of exposing the applied photoresist to an image of the two patterns for position measurement of the photomask for focus monitoring is preferably provided with the first exposure step of exposing a photoresist to an image of the two patterns for position measurement of the photomask for focus monitoring, the step of moving the substrate on which the photoresist is applied in the direction perpendicular to the direction of the optical axis and the second exposure step of exposing the photoresist to an image of the two patterns for position measurement of the photomask for focus monitoring. Either of the images of the two patterns for position measurement to which the photoresist is exposed in the second exposure step overlaps either of the images of the two patterns for position measurement to which the photoresist is exposed in the first exposure step.

In the case that the focus becomes misadjusted, either of the images of the two patterns for position measurement that are exposed in the first exposure step and either of the images of the two patterns for position measurement that are exposed in the second exposure step are arranged in the x-y plane so as to shift in mutually opposite directions. Therefore, focus monitoring can be carried out by measuring this shift amount in the x-y plane.

In the above described method of focus monitoring, each of the two patterns for position measurement is preferably either the inner box pattern or the outer box pattern of the box-in-box type mark.

The shift amount of each of the image patterns in the x-y plane can be easily measured by using the box-in-box type mark in such a manner.

In the above method of focus monitoring, the step of measuring the mutual distance between the respective image patterns of the two patterns for position measurement that are transcribed to the resist pattern is preferably carried out by using an overlap inspection apparatus for inspecting the positional shift of the overlap by processing the images of the two image patterns that have been read in.

Thereby, the positional shift can be measured with high precision.

In the above described method of focus monitoring, the step of measuring the mutual distance between the respective image patterns of the two patterns for position measurement transcribed to the resist pattern is preferably carried out by observing the positions of the two image patterns by using a scanning-type electron microscope.

Thereby, the positional shift can be easily measured.

In the above described method of focus monitoring, the two patterns for position measurement are preferably formed so that, at least, either of the image patterns of the two patterns for position measurement is readable by a pattern position detection mechanism integrally attached to the exposure unit.

Thereby, measurement becomes possible by means of a unit having a simple configuration.

In the above described method of focus monitoring, focus monitoring is preferably carried out by measuring the electrical resistance of the conductive layer, which is the lower layer of the resist pattern etched by using the resist pattern gained by developing the photoresist exposed through the first and second exposure steps as a mask.

Focus monitoring can be carried out by measuring the electrical characteristics in such a manner.

In the above described method of focus monitoring, error in the amount of movement of the substrate in the step of moving the substrate in the direction perpendicular to the direction of the optical axis is preferably measured. The error in the amount of movement is subtracted from the amount of positional shift between one of the images of the two patterns for position measurement that is exposed to the photoresist in the second exposure step and the other image of the two patterns for position measurement that is exposed to the photoresist in the first exposure step.

Thereby, the error in the amount of shift can be subtracted so that focus monitoring can be carried out with increased precision.

In the above described method of focus monitoring, the photomask for focus monitoring is preferably further provided with a mask structure for correcting the wafer position shift amount having two additional patterns for position measurement for measuring the relationship between the mutual positions formed on the surface of the substrate and a pattern formed on the light blocking film formed on the rear surface of the substrate for allowing the incident directions of the exposure light that enters the above additional two patterns for position measurement to become substantially equal. The above described two additional patterns for position measurement are exposed to the photoresist through the first and second exposure steps. An error in the amount of movement is measured from the amount of positional shift of the pattern formed by one of the above described two additional patterns for position measurement being exposed to the photoresist through the first exposure step relative to the pattern formed by the other of the above described two additional patterns for positional measurement being exposed to the photoresist through the second exposure step.

Thereby, the error in the amount of movement can be subtracted so that focus monitoring can be carried out with increased precision.

In the above described method of focus monitoring, patterns gained through exposing the photoresist to a plurality of shots by changing the amount of focus offset of the exposure unit are preferably used to find the relationship between the amount of positional shift of the pattern and the amount of focus shift in advance so that the amount of focus shift is found from the amount of positional shift of the measured pattern based on the above relationship.

The amount of focus shift can be corrected in such a manner.

A unit for focus monitoring of the present invention is a unit for focus monitoring used in focus monitoring for measuring the position of the exposed surface in the optical system in order to adjust the focus of the optical image vis-à-vis the exposed surface at the time of pattern exposure and is provided with a photomask for focus monitoring, an illumination optical system and a projection optical system. A pattern is formed on the photomask for focus monitoring. The illumination optical system is used to irradiate the photomask for focus monitoring with the exposure light. The projection optical system is used to project the image of the pattern of the photomask for focus monitoring onto the photosensitive body. The photomask for focus monitoring is provided with a substrate for allowing the exposure light to pass through and a unit mask structure for focus monitoring. The unit mask structure for focus monitoring has two patterns for position measurement and a light blocking film. The two patterns for position measurement are formed on the surface of the substrate and are used to measure the relationship between the mutual positions. The light blocking film is formed on the rear surface of the substrate and has the rear surface pattern for allowing the incident directions of the exposure light that enters the two patterns for position measurement to differ substantially. When the dimension of the rear surface pattern is L and the wavelength of the exposure light is $\lambda$, $L/\lambda$ becomes 10 or greater.

According to unit for focus monitoring of the present invention, the dimension L of the rear surface pattern is determined so that $L/\lambda$ becomes 10 or greater, and, therefore, a pattern of large dimensions can be gained to the degree that diffraction can be ignored. The process dimensions of the rear surface pattern are increased in such a manner and, thereby, the fabrication of the photomask for focus monitoring becomes easy.

In addition, the incident directions of the exposure light that enters the two patterns for position measurement are substantially differentiated by provided such a rear surface pattern and, thereby, a high detection sensitivity in the z direction at approximately the same level as in the case where the $\sigma$ value is reduced using the conventional illumination can be gained. In addition, since it is not necessary to reduce the $\sigma$ value, it is unnecessary to replace the illumination aperture unit at the time between focus monitoring and device pattern formation.

A manufacturing method of an electronic device of the present invention is characterized by the use of a method of focus monitoring described in any of the above described aspects.

Thereby, focus monitoring becomes possible wherein the fabrication of a photomask is easy, the replacement of the illumination aperture unit is unnecessary and the detection sensitivity in the z direction is high and, thereby, patterns can be formed at a low cost and with a high precision.

In the above described manufacturing method of an electronic device, the device that is formed by using the above described method of focus monitoring is preferably a semiconductor device.

The above described manufacturing method of an electronic device is suitable for the manufacture of a device that is able to be manufactured by using a semiconductor manufacturing process such as a thin film magnetic film or a liquid crystal display element and is also suitable for the manufacture of a semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the embodiments of the present invention are described in reference to the drawings.

First Embodiment

First, the principle of a method of focus monitoring of the present embodiment is described.

In reference to FIG. 1, in a method of focus monitoring according to the present embodiment, a photomask 5 for focus monitoring having a pattern (hereinafter referred to as rear surface pattern) $5d$ formed on a light blocking film $5c$ on the rear surface of the substrate is used. This photomask 5 has a substrate $5a$ that allows the exposure light to pass through and a light blocking film $5c$ formed on the rear surface of substrate $5a$ and, in addition, has a unit structure for focus monitoring (region Q surrounded by a broken line frame) formed of two patterns $5b_1$ and $5b_2$ for position measurement formed on the surface of substrate $5a$ and light blocking film $5c$ on the rear surface of the substrate.

Figure 2:
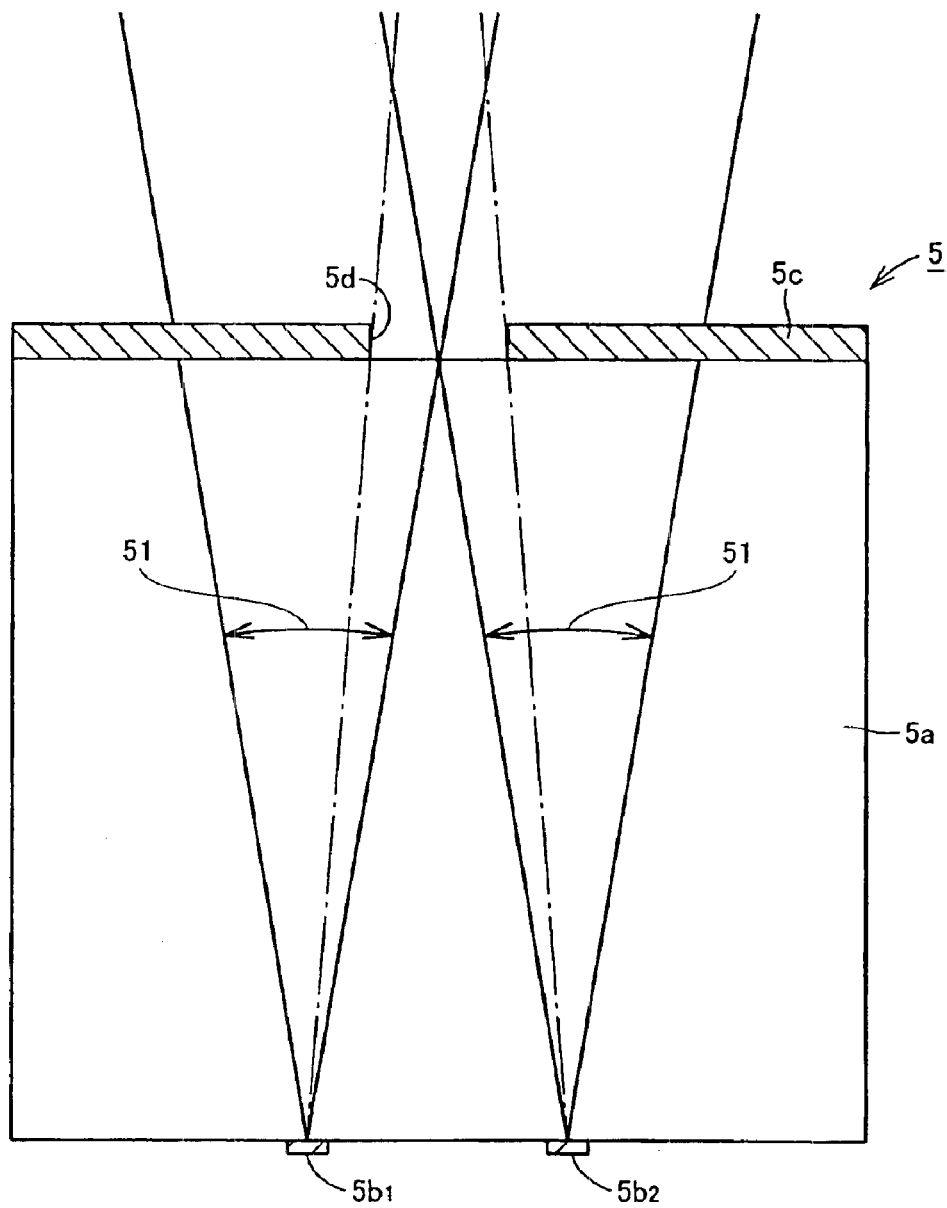
FIG. 2 is an enlarged view of the rear surface aperture pattern of the photomask of FIG. 1 for describing the function thereof.

This aperture pattern $5d$ on the rear surface of the substrate is formed so as to block a portion of exposure light 51 with which each of the two patterns, $5b_1$ and $5b_2$, for position measurement would, in the absence of light blocking film, be irradiated as shown in FIG. 2 and so as to allow the remaining portion of the exposure light to pass through so that each of the two patterns are irradiated.

Figure 1:
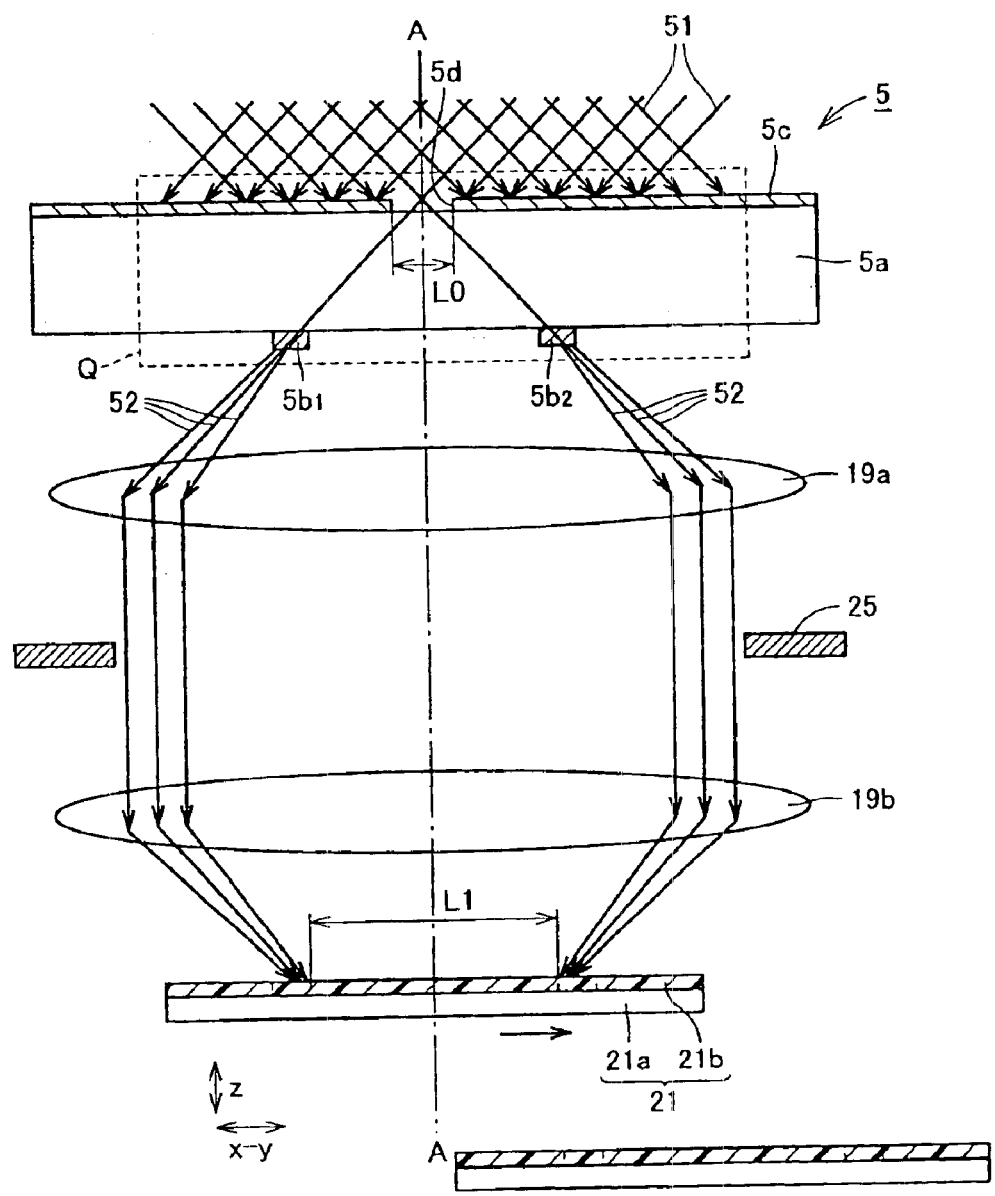
FIG. 1 is a schematic view for describing a method of focus monitoring according to a first embodiment of the present invention.

In reference to FIG. 1, patterns $5b_1$ and $5b_2$ for position measurement are arranged on both sides of the optical axis (line A—A) that passes through aperture pattern $5d$ on the rear surface of the substrate. Therefore, the inside direction of exposure light 51 that passes through aperture pattern $5d$ on the rear surface of the substrate and enters pattern $5b_1$ for position measurement and the incident direction of exposure light 51 that enters pattern $5b_2$ for position measurement are different from each other. In particular, in the case that patterns $5d_1$ and $5d_2$ for position measurement are arranged symmetrically relative to the optical axis A—A that passes through aperture pattern $5d$ on the rear surface of the substrate, the incident direction of exposure light 51 that enters pattern $5d_1$ for position measurement and the incident direction of exposure light 51 that enters pattern $5d_2$ for position measurement become symmetrical relative to the optical axis direction A—A.

The aperture dimension L0 of this aperture pattern $5d$ on the rear surface of the substrate is set so as to satisfy the condition of $L0/\lambda \geq 10$ when the wavelength of exposure light 51 with which this photomask 5 is irradiated.

In the method of focus monitoring according to the present embodiment, the patterns are irradiated exposure light 51 from the rear surface of this photomask 5. Thereby, each of the patterns, $5b_1$ and $5b_2$, for position measurement is irradiated only with diagonal components of exposure light 51 that enter photomask 5. Therefore, diffraction light 52, which is diffracted by respective patterns $5b_1$ and $5b_2$ for position measurement, passes through projection lenses $19a$ and $19b$ as well as pupil plane diaphram 25 so as to form an image on a photosensitive material (for example, photoresist) $21b$ in the diagonal direction.

The image of the pattern on the surface of photosensitive material $21a$ is formed of the incident illumination light in the diagonal direction and, thereby, when a wafer 21 is moved in the z direction (direction of optical axis A—A) the image moves in the x-y direction (direction perpendicular to optical axis A—A) on the surface of photosensitive material $21b$. Concretely, when wafer 21 is moved in the z direction so as to approach photomask 5, the respective images of patterns $5b_1$ and $5b_2$ for position measurement move away from each other on the surface of photosensitive material $21b$. In addition, when wafer 21 is moved in the z direction so as to be moved far away from photomask 5, the respective images of patterns $5b_1$ and $5b_2$ for position measurement move so as to come closer to each other on the surface of photosensitive material $21b$.

The positional relationship of the images of patterns $5b_1$ and $5b_2$ for position measurement that are formed on photosensitive material $21b$ changes relatively in the x-y plane according to the movement of wafer 21 in the z direction. By measuring this positional relationship, it becomes possible to detect the shift of focus (shift in the z direction) when the patterns are transcribed.

Next, a unit for focus monitoring and a photomask for focus monitoring according to the present embodiment are concretely described.

Figure 3:
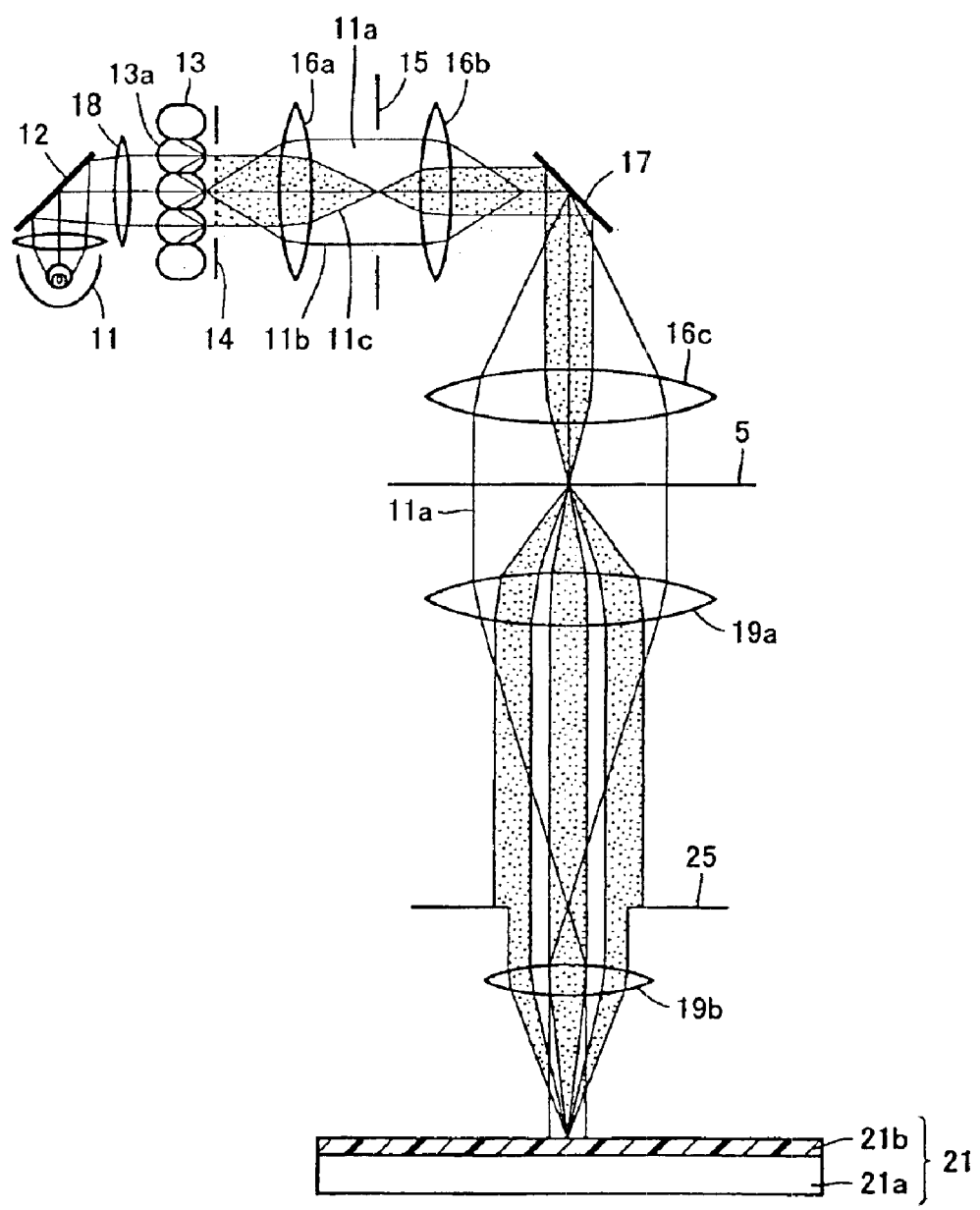
FIG. 3 is a schematic view showing the configuration of a unit for focus monitoring according to the first embodiment of the present invention.

In reference to FIG. 3, this unit for focus monitoring has a similar configuration to a scaling down projection exposure unit (stepper) and projects the scaled down pattern on photomask 5 to photoresist $21b$ on the surface of wafer 21. This unit for focus monitoring has an illumination optical system through which light passes starting from a light source 11 and reaching the pattern of photomask 5 as well as a projection optical system through which light passes starting from the pattern of photomask 5 and reaching wafer 21.

The illumination optical system has a mercury lamp 11 that is the light source, a reflecting mirror 12, a condensing lens 18, a fly-eye lens 13, an diaphram 14, condensing lenses $16a$, $16b$, $16c$, a blind diaphram 15 and a reflecting mirror 17. In addition, the projection optical system has projection lenses 19a, 19b and pupil plane diaphram 25.

In the exposure operation, as for light 11a emitted from mercury lamp 11 only the g string (wavelength: 436 nm), for example, is reflected by reflecting mirror 12 and light 11a becomes light of a single wavelength. Next, light 11a passes through condensing lens 18 and enters each of fly-eye component lenses 13a forming fly-eye lens 13 and, after that, passes through diaphram 14.

Here, a light 11b shows a light path created by one fly-eye component lens 13a while light 11c shows a light path created by fly-eye lens 13.

Light 11a that has passed through diaphram 14 passes through condensing lens 16a, a blind diaphram 15 and a condensing lens 16b so as to be reflected by reflecting mirror 17 at a predetermined angle.

The entirety of the surface of photomask 5, on which a predetermined pattern is formed, is uniformly irradiated with light 11a that is reflected by reflecting mirror 17 after the light passes through condensing lens 16c. After this, light 11a is scaled down according to a predetermined scaling factor by projection lenses 19a and 19b so as to expose photoresist 21b on semiconductor substrate 21a.

Figure 4A:
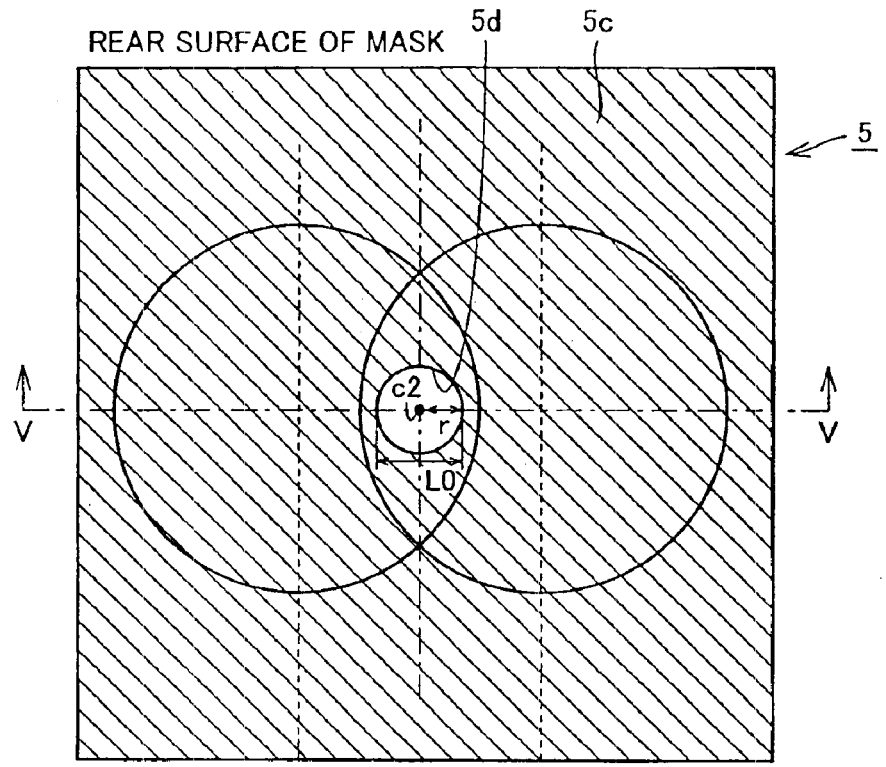
FIGS. 4A and 4B are a view of the rear surface and a view of the top surface schematically showing the configuration of the photomask for focus monitoring according to the first embodiment of the present invention.
Figure 4B:
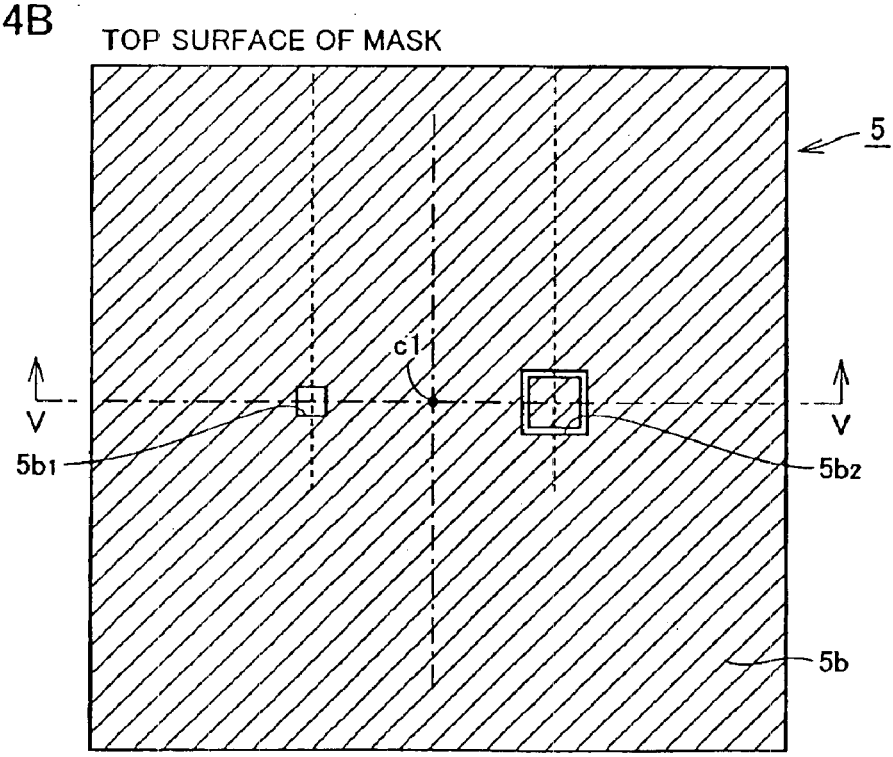
Figure 5:
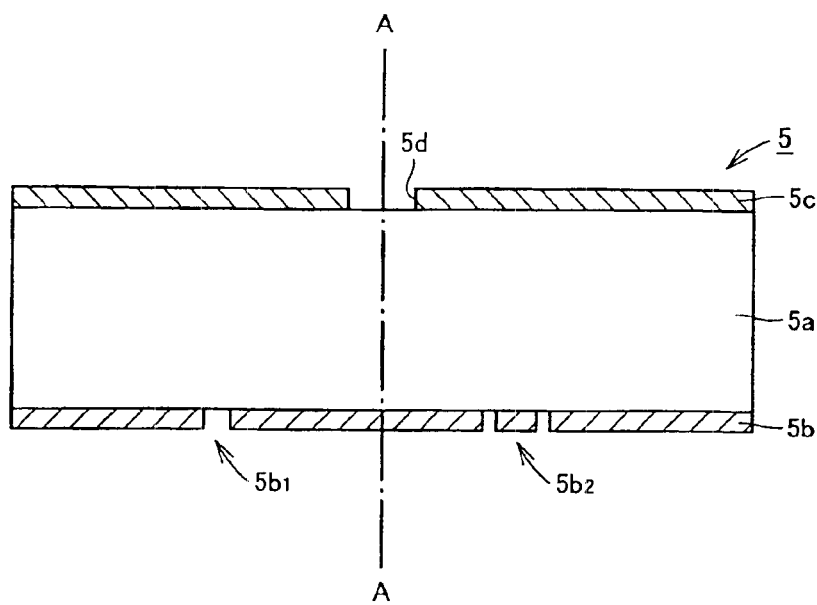
FIG. 5 is a schematic cross sectional value along line V—V of FIGS. 4A and 4B.

In reference to FIGS. 4A, 4B and 5, light blocking film 5b having two patterns $5b_1$ and $5b_2$ for position measurement is formed on the surface of substrate 5a that allows the exposure light to pass through. In addition, light blocking film 5c having a circular aperture pattern 5d is formed on the rear surface of substrate 5a. A unit mask structure for focus monitoring is formed of these two patterns $5b_1$ and $5b_2$ for position measurement and light blocking film 5c that has aperture pattern 5d on the rear surface of the substrate.

Each of the two patterns, $5b_1$ and $5b_2$, for position measurement correspond to an inner box pattern and an outer box pattern of the box-in-box type mark, respectively. Pattern $5b_1$ for position measurement that becomes the inner box pattern is an approximately square aperture pattern, while pattern $5b_2$ for position measurement that becomes the outer box pattern is an aperture pattern in a square frame form. Aperture pattern 5d on the rear surface of the substrate is formed in a circle, of which the center is point c2, on the rear surface of the substrate that is directly opposite to center point c1 of the fictitious line connecting the above two patterns $5b_1$ and $5b_2$ for position measurement.

Aperture dimension L0 (=2r) of this aperture pattern 5d on the rear surface of the substrate is set so as to satisfy the condition of $L0/\lambda \geq 10$ when the wave length of the exposure light with which this photomask 5 is irradiated is $\lambda$.

This aperture pattern 5d on the rear surface of the substrate is provided so as to be shared by two patterns $5b_1$ and $5b_2$ for position measurement. Here, "provided so as to be shared" means "provided so that both patterns $5b_1$ and $5b_2$ for position measurement can be irradiated with light from one aperture pattern 5d on the rear surface of the substrate."

In addition, "is directly opposite to" in the above means that point c2 is a point on the rear surface of photomask 5 opposite to center point c1 located on the top surface of photomask 5 in the direction of the optical axis.

Next, a concrete method of focus monitoring according to the present embodiment is described.

Figure 6:
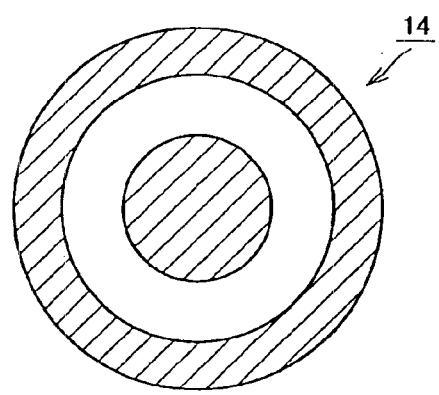
FIG. 6 is a view showing the configuration of an annular band illumination diaphram that is used as the diaphram in FIG. 3.

In the method of focus monitoring according to the present embodiment, a zonal illumination diaphram as shown in FIG. 6 is, for example, used as diaphram 14 of the unit for focus monitoring in FIG. 3. At this time, a view of aperture pattern 5d provided on the rear surface of photo-mask 5 as is seen from pattern $5b_1$ for position measurement of photomask 5 is shown in FIG. 7 while a view of aperture pattern 5d provided on the rear surface of photomask 5 as is seen from pattern $5b_2$ for position measurement of photomask 5 is shown in FIG. 8.

Figure 7:
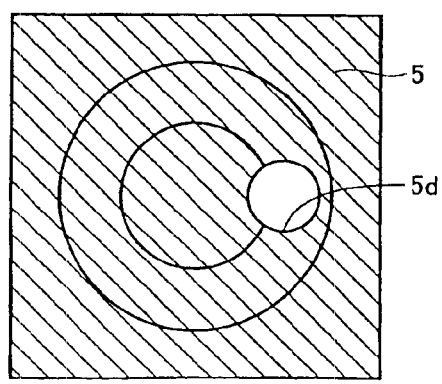
FIG. 7 is a view showing the appearance of the aperture pattern on the rear surface when the rear surface of the substrate is seen from the pattern $5b_1$ for position measurement.
Figure 8:
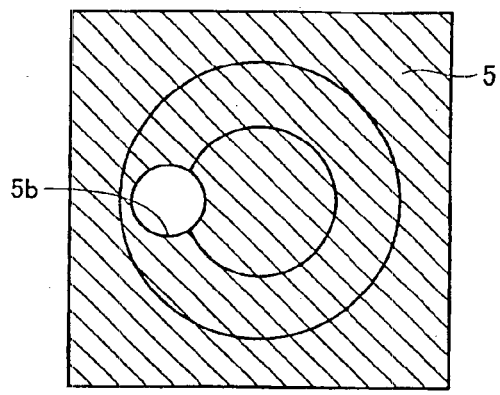
FIG. 8 is a view showing the appearance of the aperture pattern on the rear surface when the rear surface of the substrate is seen from the pattern $5b_2$ for position measurement.
Figure 9:
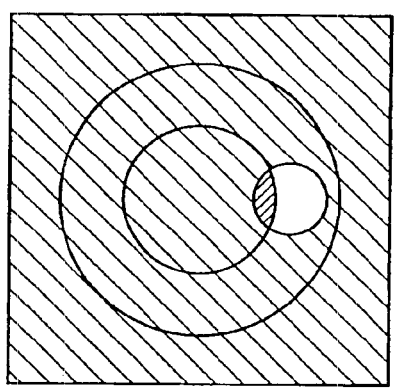
FIG. 9 is a view showing the region that allows light to pass to the pattern $5b_1$ for position measurement when the rear surface of the substrate is seen from the pattern $5b_1$ for position measurement.
Figure 10:
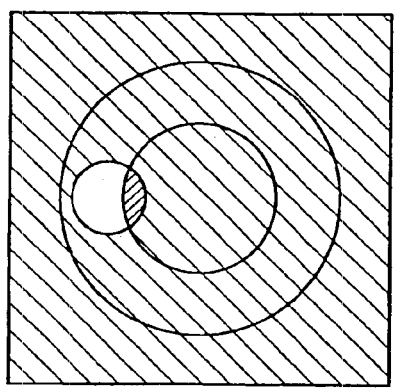
FIG. 10 is a view showing the region that allows light to pass to the pattern $5b_2$ for position measurement when the rear surface of the substrate is seen from the pattern $5b_2$ for position measurement.

As shown in FIGS. 7 and 8, aperture pattern 5d on the rear surface of the photomask 5 is circular and therefore, when a common diaphram is used as diaphram 14, each of patterns, $5b_1$ and $5b_2$, for position measurement is irradiated with light from the entirety of circular aperture pattern 5d on the rear surface of the photomask 5. In the case that zonal illumination diaphram 14 as shown in FIG. 6 is used, however, each of patterns, $5b_1$ and $5b_2$, for position measurement is irradiated with the exposure light from the remaining region of the circular region of aperture pattern 5d on the rear surface of photomask 5, except for a portion (hatched region in the direction towards the lower left) as shown in FIGS. 9 and 10. Then, the diffraction light diffracted by each of the patterns, $5b_1$ and $5b_2$, for position measurement passes through projection lenses 19a and 19b as well as pupil plane diaphram 25 so as to form an image on photoresist 21b in the diagonal direction.

Here, a concentric double circle shown in FIGS. 7 and 8 shows the angle direction in which the illumination light would enter in the absence of the light blocking film.

In the case that the box-in-box type mark pattern is exposed a double shift exposure is carried out. That is to say, after the first exposure is carried out in the above described manner, wafer 21 is moved (shifted) in the x-y plane by means of an x-y stage as shown in the bottom portion in FIG. 1 and, then, the second exposure is carried out. This second exposure is carried out in the same manner as in the first exposure. Thereby, the box-in-box pattern can be formed by, for example, placing inner box pattern $5b_1$ exposed in the first exposure in outer box pattern $5b_2$ exposed in the second exposure.

More concretely, in the first exposure, photoresist 21b is exposed in pattern $5b_1$ for position measurement, which is the inner box pattern, as shown in FIG. 1A. After this, wafer 21 is moved as described above. After this, in the second exposure, the region that has been exposed in pattern $5b_1$ for position measurement is exposed in pattern $5b_2$ for position measurement that becomes the outer box pattern as shown in FIG. 11B. Thereby, the box-in-box type pattern wherein inner box pattern 22 is positioned within outer box pattern 23 as shown in FIGS. 12a and 12b is formed on photoresist 21b.

Here, light beams for forming an optical image wherein inner box pattern 22, in the above described box-in-box, is formed, enter photoresist 21b in the direction towards the lower right as shown in FIG. 1 while light beams for forming an optical image wherein outer box pattern 23 is formed enter photoresist 21b in the direction towards the lower left. Therefore, in the case that there is a focus shift at the time of exposure, inner box pattern 22 and outer box pattern 23 are formed so as to shift away from each other.

Figures 12A, 12B:
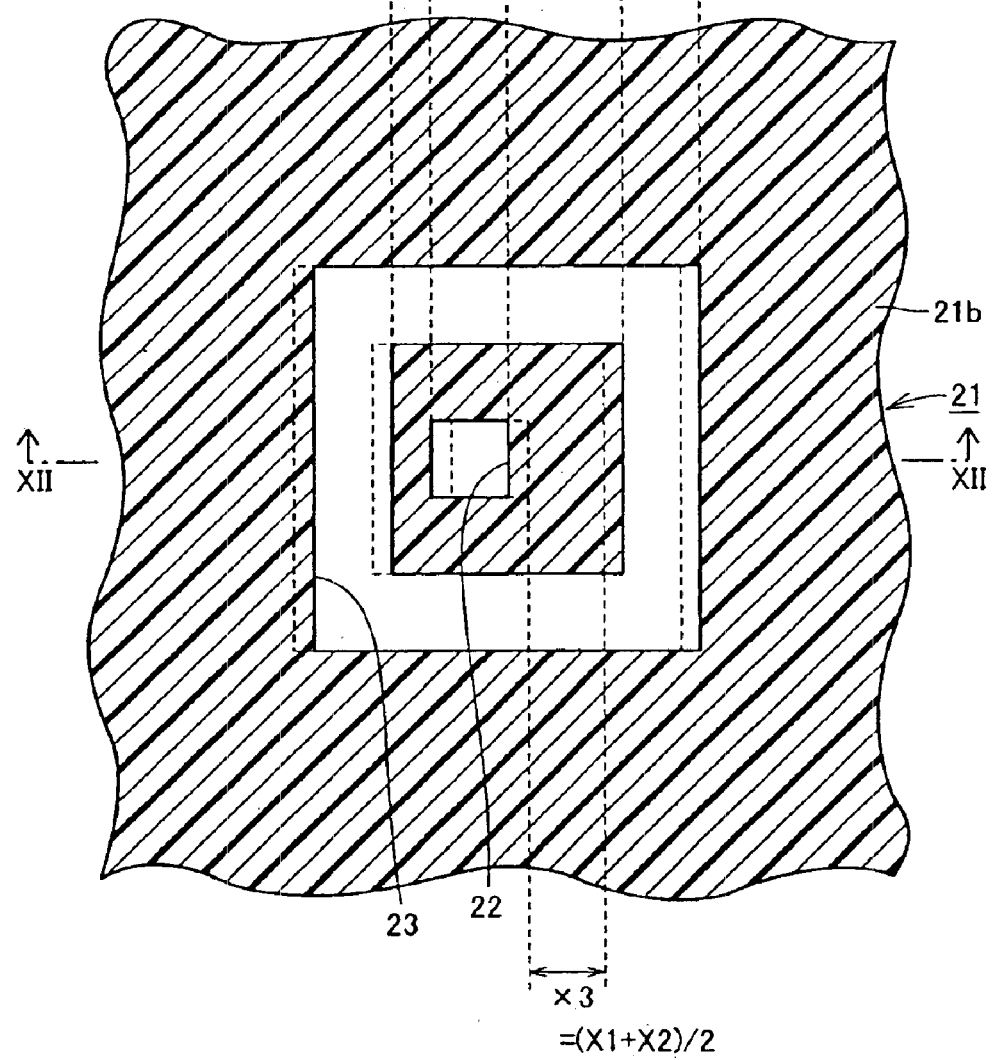
FIGS. 12A and 12B are a cross sectional view and a plan view showing the appearance of the photoresist wherein a box-in-box pattern is formed.

In FIG. 1, in the case that wafer 21 is shifted toward the photomask 5 side, for example, from the optimal focus position at the time of exposure, inner box pattern 22 is formed in a position shifted toward the right side from the position at the time of optimal focus while outer box pattern 23 is formed in a position shifted to the left side from the position at the time of optimal focus as shown in FIG. 12B.

Here, in FIG. 12B, each of the positions of inner box pattern 22 and outer box pattern 23 at the time of optimal focus is shown by dotted lines while each of the positions of inner box pattern 22 and outer box pattern 23 under the condition wherein there is a focus shift is shown by solid lines.

Next, intervals x1 and x2 between inner box pattern 22 and outer box pattern 23 that have been created in the above manner are measured. Interval x3(=(x1+x2)/2) between inner box pattern 22 and outer box pattern 23 at the time of optimal focus is derived from these values. The difference between the above interval x3 and interval x1 or x2 is derived and, thereby, the amount of lateral movement (amount of positional shift) of inner box pattern 22 and outer box pattern 23 can be found.

By comparing this amount of lateral movement with the relationship between the amount of lateral movement that has been measured in advance and the focus, it becomes possible to detect the focus shift. Thereafter, the position of wafer 21 in the z direction is adjusted based on this focus shift so that the optical focus can be gained.

Here, the above described relationship between the amount of lateral movement and the focus can be gained by finding, in advance, the relationship between the amount of positional shift and the amount of focus shift using a plurality of shot patterns to which the photoresist is exposed while changing the focus offset amount of the exposure unit.

Figure 11A:
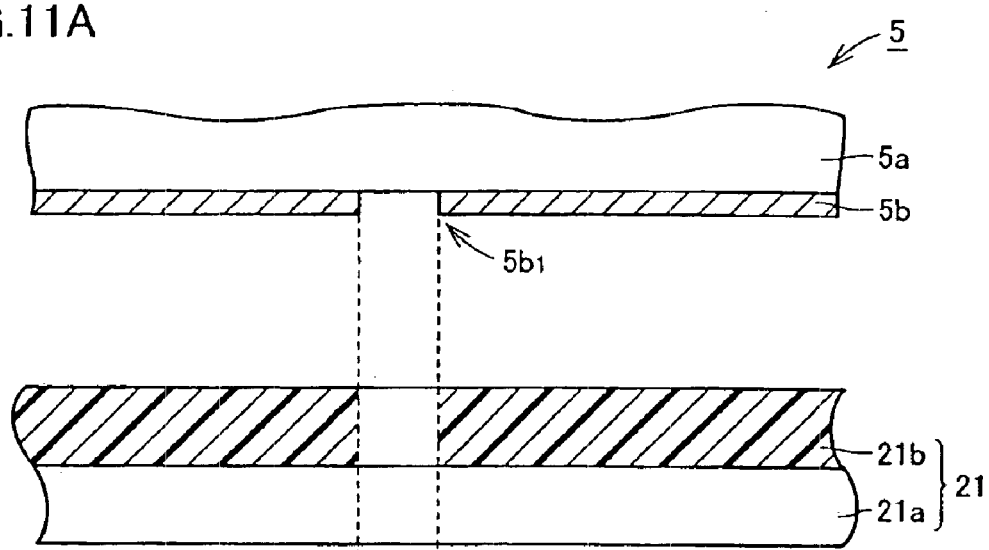
FIGS. 11A and 11B are views for describing the steps of double exposure according to the order of steps.
Figure 11B:
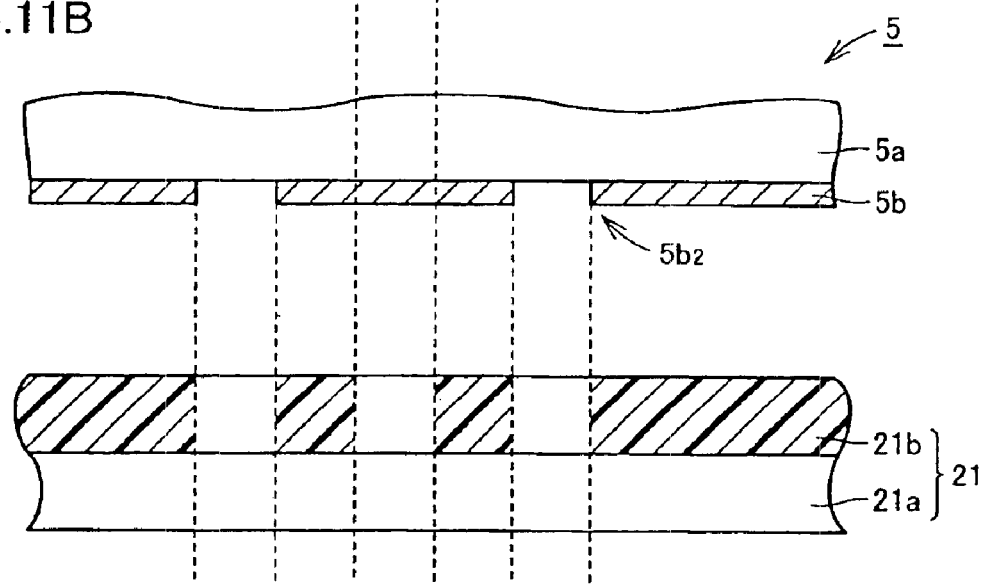

In addition, though in FIGS. 11A and 11B, a case wherein photoresist 21b is developed after a double exposure is described, photoresist 21b may be patterned by repeating the step of development after an exposure twice. That is to say, photoresist 21b may be patterned according to the steps of first exposure→first development→movement of wafer 21→second exposure→second development.

Figure 13A:
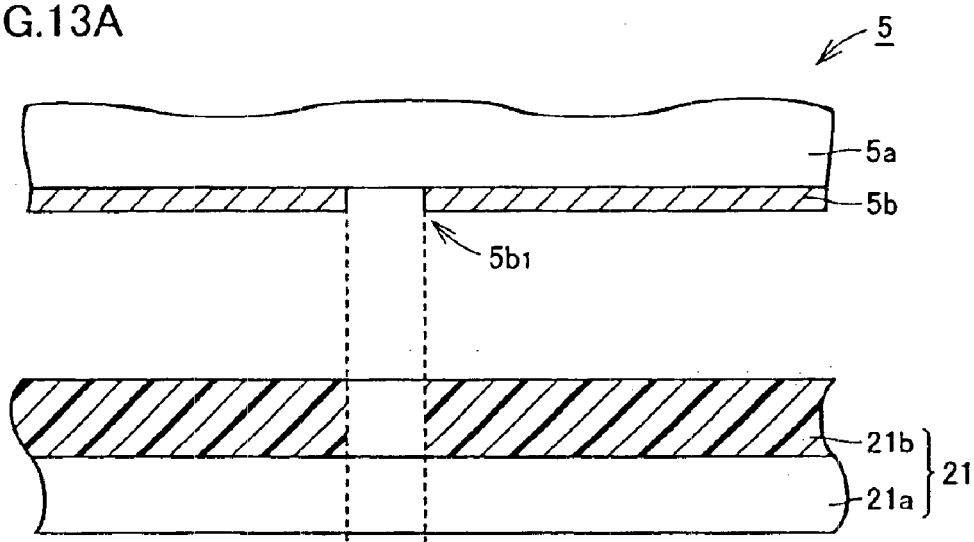
FIGS. 13A, 13B and 13C are figures for describing the steps of twice repeating the exposure and the development according to the order of the steps.
Figure 13B:
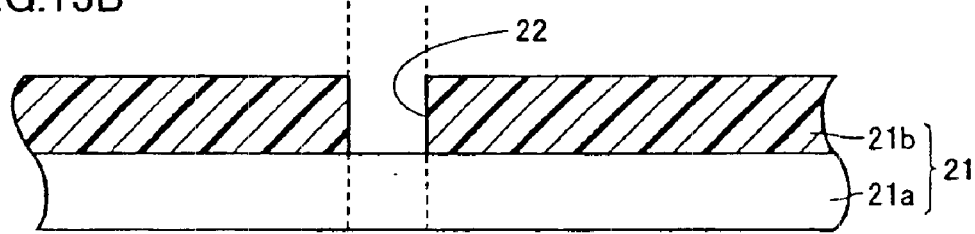
Figure 13C:
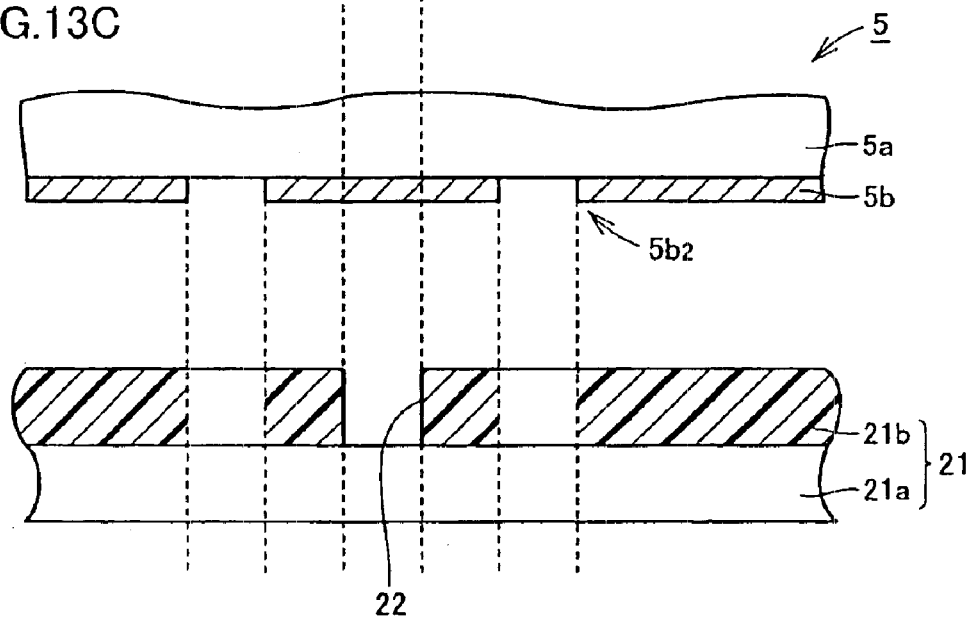

In reference to FIG. 13A, photoresist 21b is, first, exposed to pattern $5b_1$ for position measurement that becomes the inner box pattern through the first exposure. After this, the first development is carried out. Thereby, inner box pattern 22 is formed on photoresist 21b as shown in FIG. 13B. Wafer 21 is moved in the lateral direction in the x-y plane under the condition wherein the above inner box pattern 22 is formed. Then, as shown in FIG. 13C, the exposure of pattern 5b2 for position measurement, which becomes the outer box pattern, is carried out as the second exposure so as to overlap the region wherein inner box pattern 22 is formed. After this, outer box pattern 23 is formed as shown in FIGS. 12A and 12B by carrying out the second development on photoresist 21b so that the resist pattern is formed.

Here, in the case that the step of development after the exposure is repeated twice in the above manner, the process for focus monitoring after development is the same as in the above described case wherein two exposures are carried out before one development is carried out.

Next, a method for correcting an error in the positioning of wafer 21 that occurs when wafer 21 is moved between the above described first exposure and second exposure is described.

In a double exposure with shift wherein the first pattern formed through the first exposure is overlapped with the second pattern that is formed in a different position on the mask is formed through the second exposure, wafer 21 is moved by the distance corresponding to the positional relationship between the above described first pattern and second pattern on the mask before the second exposure is carried out. At this time, however, the amount of movement of the wafer must be precisely of the above described distance or the above described first pattern and second pattern will be formed in the condition wherein they are shifted from each other. As described above, in the present method wherein a focus shift is detected due to the mutual positional shift of the first pattern and second pattern, the shift due to this error in the amount of movement of the wafer is recognized as a focus shift so that an error will be caused in the measurement of the actual amount of focus shift.

Figure 14:
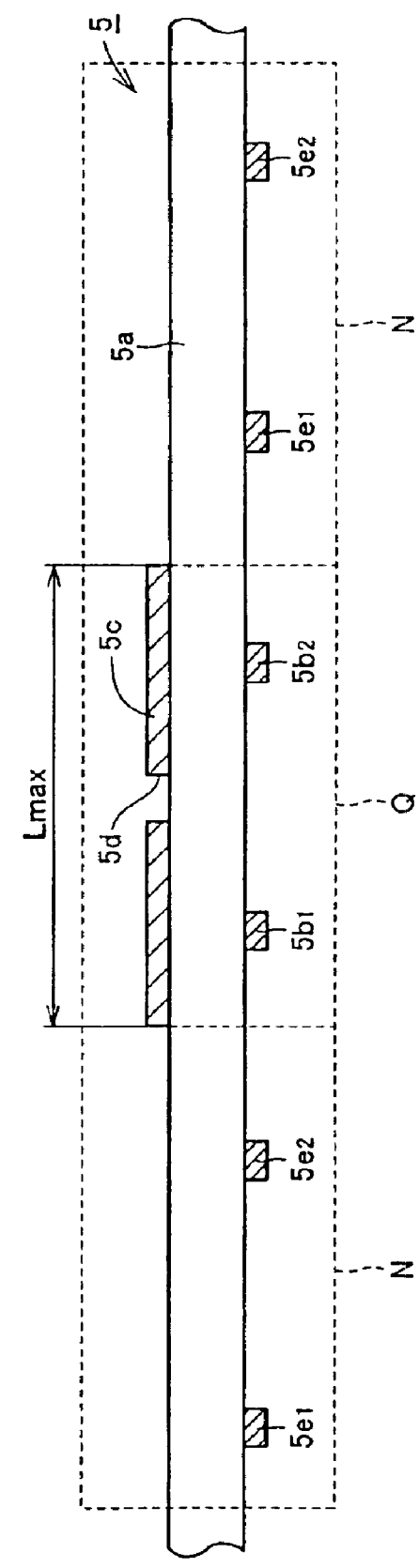
FIG. 14 is a cross sectional view schematically showing the configuration of the photomask for focus monitoring for precisely carrying out positioning at the time of the movement of the wafer.

FIG. 14 is a cross sectional view schematically showing the configuration of a photomask for focus monitoring that is used to measure this error in the amount of movement of the wafer by using another mask structure that is additionally formed on the same mask and that is used to correct the apparent focus shift due this error in the amount of movement of the wafer. In reference to FIG. 14, two pairs, or more, of the mask structures N for correcting the amount of shift in the wafer position are formed in the above photomask 5 in addition to the unit mask structure Q for focus monitoring that has the above described patterns $5b_1$ and $5b_2$ for position measurement and a light blocking film 5c having aperture pattern 5d on the rear surface of the photomask.

This mask structure N for correcting the amount of shift in wafer position has a pair of patterns, $5e_1$ and $5e_2$, for position measurement that is formed on the top surface of substrate 5a. In this mask structure N for correcting the amount of shift in wafer position, a large aperture pattern is positioned on the rear surface side of substrate 5a, wherein a light blocking film is not formed, in order to allow the respective incident directions of the exposure light that enters this pair of patterns $5e_1$ and $5e_2$ for measurement to be substantially equal.

Figure 15:
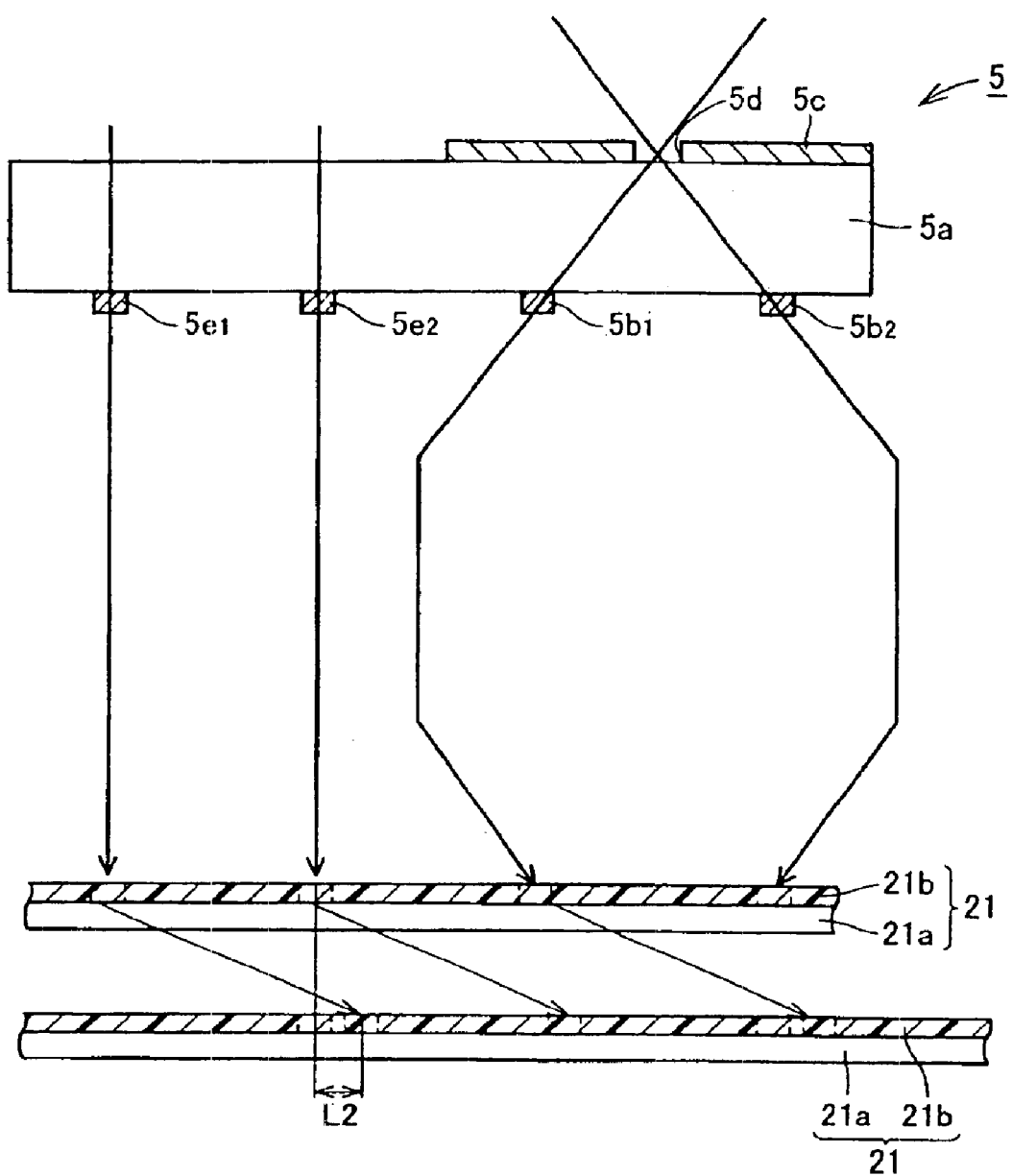
FIG. 15 is a view for describing positioning of the wafer by using the photomask shown in FIG. 14.

The correction of the apparent focus shift due to the error in the amount of movement of the wafer by using photomask 5 as shown in the above described FIG. 14 is carried out as shown in FIG. 15. In reference to FIG. 15, the first exposure is carried out by using photomask 5 for focus monitoring having a pair of patterns $5e_1$ and $5e_2$ for position measurement. At this time, though two patterns $5b_1$ and $5b_2$ for position measurement are irradiated with exposure light in the diagonal direction, the pair of patterns $5e_1$ and $5e_2$ for position measurement becomes, as a whole, the same as in the case wherein only the illumination components in the direction of the optical axis exist as shown in the figure due to the symmetrical distribution of illumination relative to the optical axis.

After this first exposure, photoresist 21b is developed, or is not developed, before wafer 21 is moved. This movement is carried out so that the exposure region of pattern $5b_2$ for position measurement overlaps, due to the second exposure, the region that is exposed to pattern $5b_1$ for position measurement due to the first exposure and so that the exposure region of pattern $5e_2$ for position measurement overlaps, due to the second exposure, the region that is exposed to pattern $5e_1$ for position measurement due to the first exposure.

After this movement, the second exposure is carried out in the same manner as the first exposure. After this, photoresist 21b is developed. Then, the amount of positional shift L2 is measured between the image pattern of pattern $5e_1$ for position measurement formed according to the first exposure of the developed resist pattern 21b and the image pattern of pattern $5e_2$ for position measurement formed according to the second exposure. This amount of positional shift L2 shows an error in the movement of wafer 21 because the image formed of mask patterns $5e_1$ and $5e_2$ does not shift in the lateral direction due to the movement of the focus. It becomes possible to precisely measure the amount of lateral movement due to defocusing by subtracting the error in the movement, detected as described above, from the above found amount of lateral movement (amount of positional shift) of two patterns $5b_1$ and $5b_2$ for position measurement.

Here, though in the above the case wherein the box-in-box type pattern is used is described, focus monitoring can be carried out according to the following method without using the box-in-box type pattern.

In reference to FIG. 1, the image formed on photoresist 21b of patterns $5b_1$ and $5b_2$ for position measurement is moved in the lateral direction (x-y direction) in the figure due to the movement of the wafer 21 in the z direction. Therefore, the interval L1 of the patterns of the image formed of patterns $5b_1$ and $5b_2$ for position measurement is measured so as to be compared with the relationship between the position of wafer 21 in the z direction that has been measured in advance and interval L1 and, thereby, it becomes possible to detect the focus shift.

In addition, focus monitoring can also be carried out by measuring the electrical resistance of the pattern as follows.

Figure 16A:
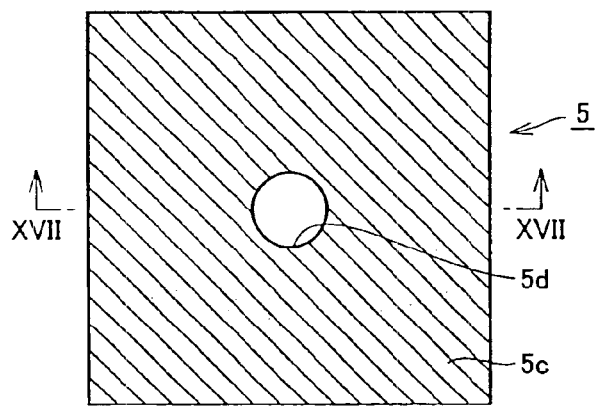
FIGS. 16A and 16B are a view of the rear surface and a view of the top surface showing the configuration of a photomask for focus monitoring for carrying out focus monitoring by measuring the electrical resistance of the pattern.
Figure 16B:
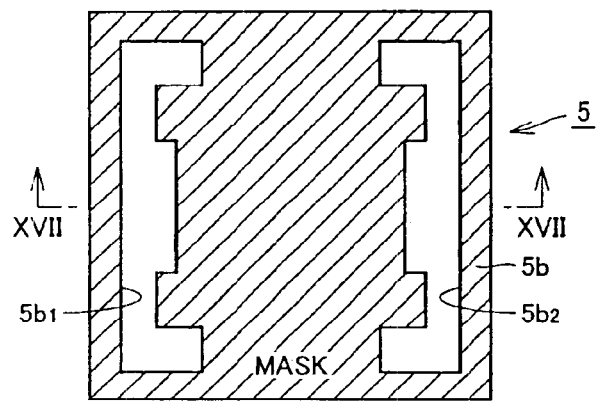
Figure 17:
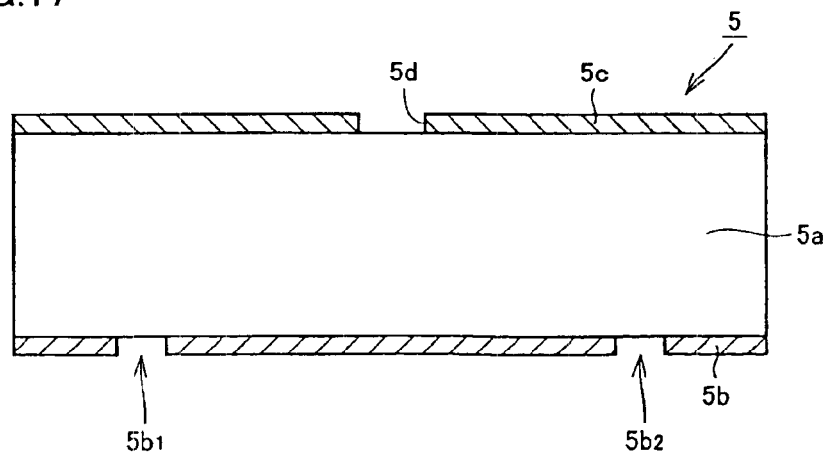
FIG. 17 is a schematic cross sectional view along line XVII—XVII in FIGS. 16A and 16B.

In reference to FIGS. 16A, 16B and 17, a light blocking film 5c having an aperture pattern 5d on the rear surface of a substrate 5a in the same manner as in the configuration of FIGS. 4A and 4B is formed on a photomask 5. In addition, a light blocking film 5b having two aperture patterns $5b_1$ and $5b_2$ that are arranged in an approximately symmetrical manner relative to aperture pattern 5b on the rear surface of the substrate is formed on the top surface of substrate 5a.

Figure 18A:
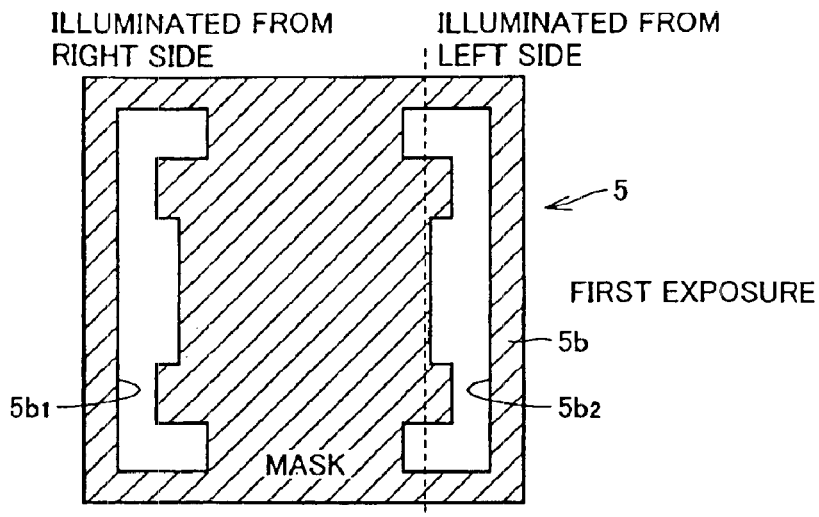
FIGS. 18A, 18B and 18C are figures for describing a method for measuring focus shift by using the electrical resistance value.
Figure 18B:
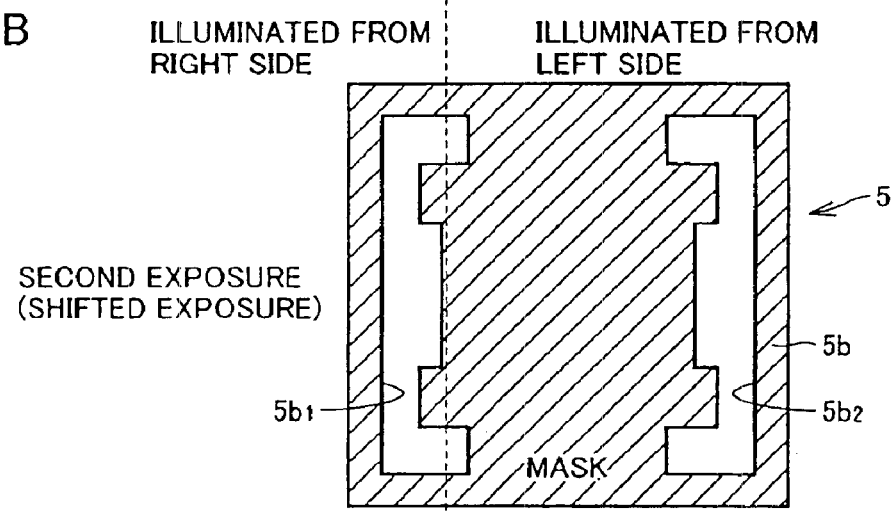
Figure 18C:
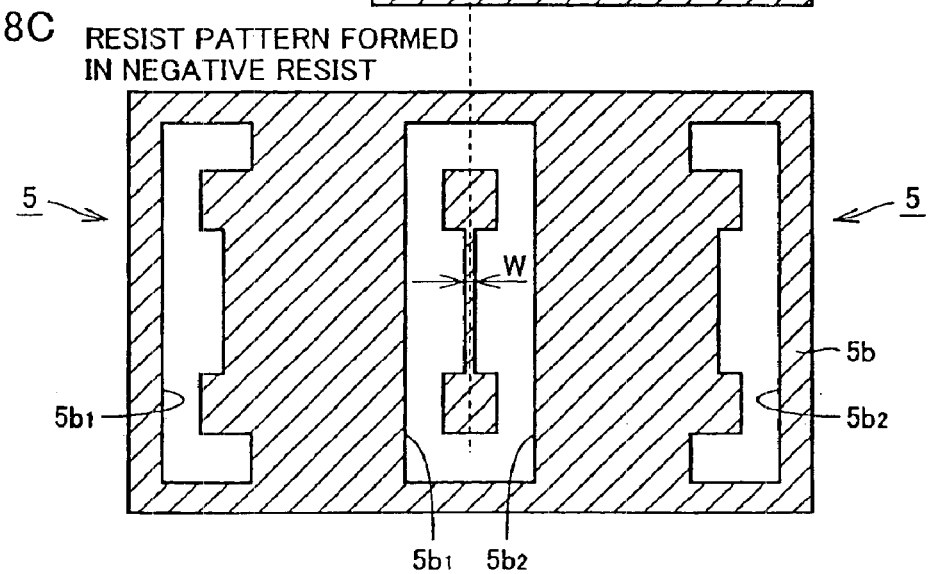

A double exposure with shift is carried out on photoresist 21b according to the principle shown in FIG. 1 by using the above described photomask 5. Concretely, wafer 21 is moved in the lateral direction (x-y direction) after the first exposure is carried out as shown in FIG. 18A and, then, a second exposure is carried out as shown in FIG. 18B. Due to this double exposure with shift, a pattern, as shown in FIG. 18C, is transcribed onto the photoresist (negative type). Furthermore, the conductive film that is the lower layer of the resist pattern is etched and patterned by using the resist pattern to which the above pattern is transcribed as a mask.

Thereby, the pattern of FIG. 18C is transcribed to the conductive film. The right edge of the fine line portion (portion of line width W) of the pattern in the center of FIG. 18C, which is transcribed onto the conductive film, is formed of aperture pattern $5b_2$ due to the first exposure while the left edge is formed of aperture pattern $5b_1$ due to the second exposure. Therefore, in the case that a positional shift is caused by a shift in focus between the transcription position of the pattern due to the first exposure and the transcription position of the pattern due to the second exposure, the line width W of the fine line portion fluctuates. Since the resistance value of the pattern of this conductive layer changes because of the fluctuation of this line width W, it becomes possible to measure the shift in focus by measuring this resistance value.

The present inventors measured the mutual position shift of the two patterns for position measurement at the time when the height of the wafer is actually changed in the z direction by using the method of the present embodiment. The result thereof is shown in FIG. 19.

Here, this measurement is carried out by setting the numerical aperture NA in the exposure unit for exposing a photoresist to photomask for focus monitoring at 0.68 and by using a zonal illumination of $\sigma_{in}/\sigma_{out}=0.65/0.85$.

Figure 19:
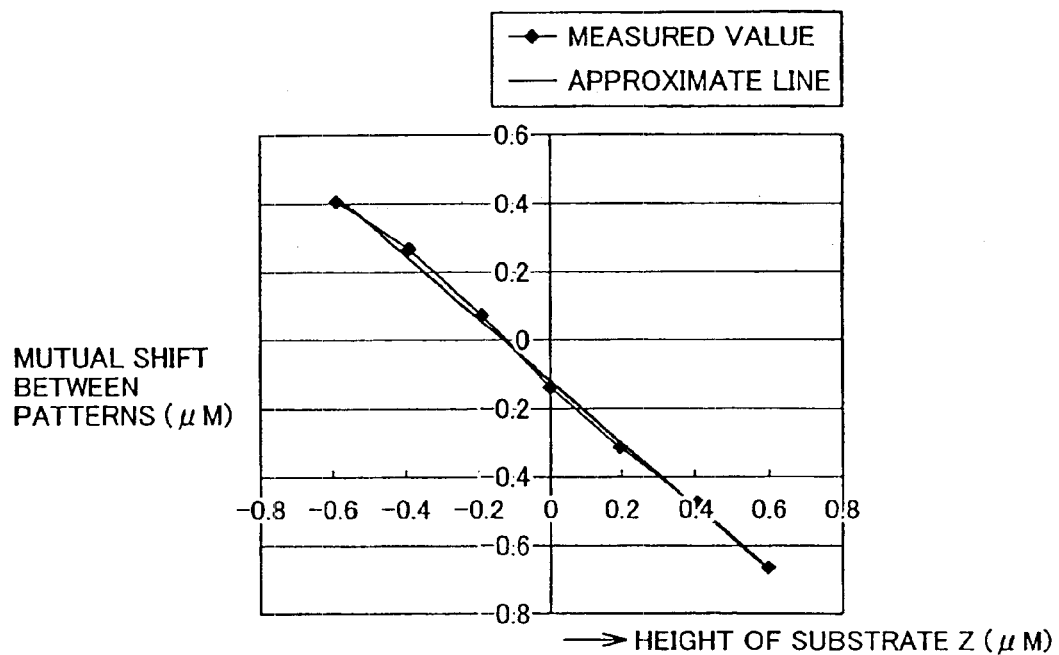
FIG. 19 is a graph showing the relationship between the mutual shift of the patterns and the height of the substrate according to the first embodiment of the present invention.

In reference to FIG. 19, it can be seen that when the height of the wafer changes 1 μm in the z direction, the patterns move vis-à-vis each other by approximately 0.9 μm. Thereby, it can be seen that the z detection sensitivity in the method of focus monitoring in the present embodiment is 0.9, which is more sensitive than the z detection sensitivity in conventional phase shift focusing monitor.

Next, the size of radius r of aperture pattern 5d on the rear surface of photomask 5, shown in FIG. 4, is described.

Figure 20:
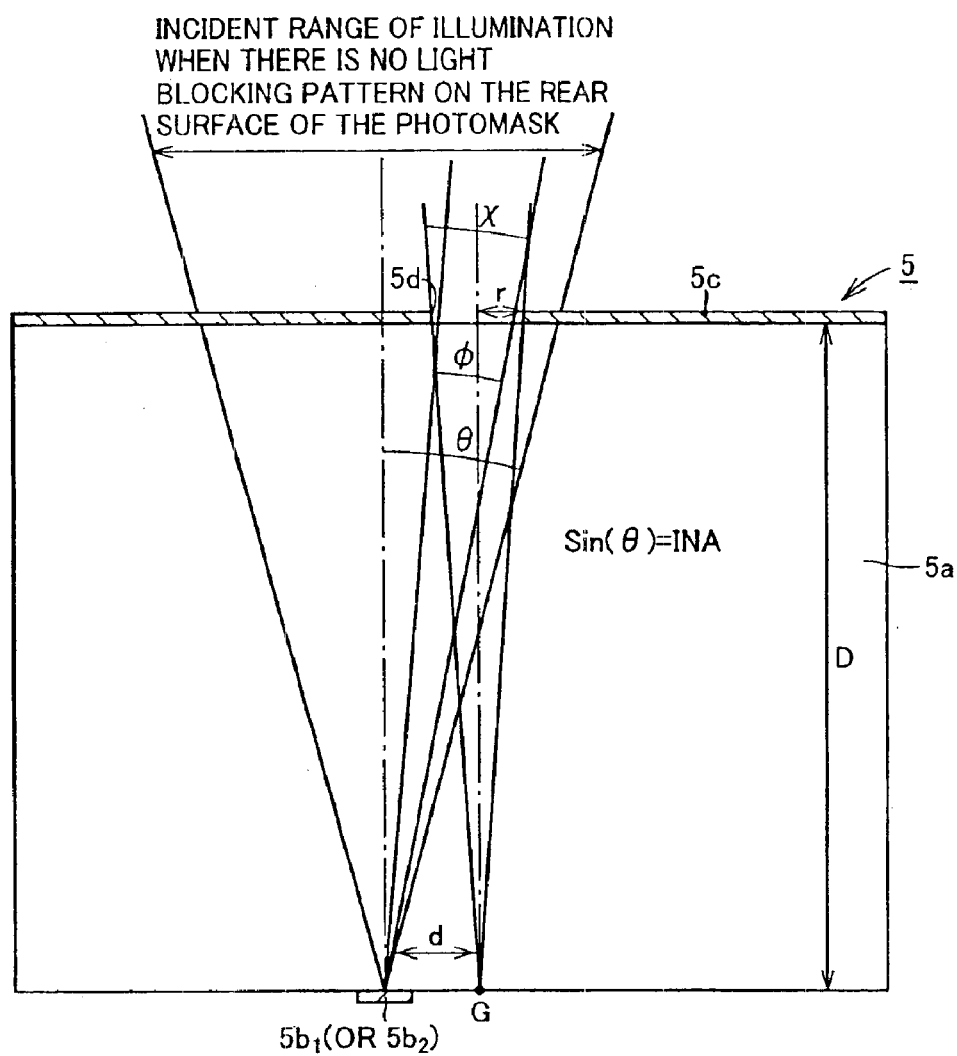
FIG. 20 is an enlarged cross sectional view showing a portion of the photomask shown in FIGS. 4A, 4B and 5.

In reference to FIG. 20, when the aperture radius of the aperture pattern 5d on the rear surface of the substrate is r, the thickness of substrate 5a is D, the numerical aperture is NA and the coherence, which is the interference indication of the exposure light, is σ, it is preferable for the value of $\sin(\tan^{-1}(r/D))$ to be smaller than the INA value ($=NA\times\sigma/$projection magnification), which is the amount of illumination spread.

The above described $\sin(\tan^{-1}(r/D))$ indicates the scale of the spread of light components with which pattern $5b_1$ (or $5b_2$) for position measurement is irradiated through aperture pattern 5d on the rear surface of the photomask. This is described in the following.

In reference to FIG. 20, first, the angle of light with which pattern $5b_1$ (or $5b_2$) for position measurement is irradiated through aperture pattern 5d on the rear surface of the photomask is denoted as ø, the scale of this spread of light components can be represented as $\sin(ø/2)$. This ø becomes approximately equal to the angle χ of the light that proceeds in the direction of the optical axis through aperture pattern 5d on the rear surface of the photomask. This is because radius r of aperture pattern 5d on the rear surface of the photomask is sufficiently small in comparison with thickness D of substrate $5_a$ (D>>r) and because distance d between point G on the top surface that is directly opposite the center of aperture pattern 5d on the rear surface of the photomask and the center of pattern $5b_1$ (or $5b_2$) for position measurement is sufficiently small in comparison with thickness D of substrate 5a (D>>d).

Then, the scale of the spread of light components that enter in the direction of the optical axis through aperture pattern 5d on the rear surface of the photomask can be represented as $\sin(χ/2)$ where this χ/2 is equal to $\tan^{-1}(r/D)$.

As described above, the scale $\sin(ø/2)$ of the spread of the light components with which pattern $5b_1$ (or $5b_2$) for position measurement through aperture pattern 5d on the rear surface of the photomask becomes equal to $\sin(\tan^{-1}(r/D))$ as shown in the following equation.

$$\sin(ø/2)=\sin(χ/2)=\sin(\tan^{-1}(r/D))$$

In addition, the INA value that is the amount of spread of illumination is represented as $\sin(θ)$ in FIG. 20. Accordingly, when $\sin(\tan^{-1}(r/D))$ is smaller than the INA value it shows radius r of aperture pattern 5d on the rear surface of the photomask that can block a portion of the light components (angle 2θ) that enter, in the direction of the optical axis, to pattern $5b_1$ (or $5b_2$) for position measurement.

That is to say, in the case that the value of $\sin(\tan^{-1}(r/D))$ is the INA value, or greater, a portion of the exposure light that enters pattern $5b_1$ (or $5b_2$) for position measurement cannot be blocked, depending on the arrangement position of aperture pattern 5d on the rear surface of the photomask, so that the incident directions of the exposure light that enters two patterns $5b_1$ and $5b_2$ for position measurement cannot be made to differ.

In addition, it is preferable for the value of $\sin(\tan^{-1}(r/D))$ to be greater than 0.1 times the INA value. This is because in the case that the value of $\sin(\tan^{-1}(r/D))$ is 0.1 times the INA value, or less, the amount of exposure light becomes 1/100, or less, of the case of the conventional transcription so that it becomes difficult to transcribe pattern $5b_1$ (or $5b_2$) for position measurement onto photosensitive material and the throughput of the measurement for focus is lowered.

Here, though in the present embodiment the configuration wherein one aperture pattern $5d$ on the rear surface of the photomask is provided so as to be shared by two patterns $5b_1$ and $5b_2$ for position measurement is described, the configuration of the photomask is not limited to this but, rather, each of the two aperture patterns on the rear surface of the photomask is provided so as to correspond to each of the two patterns for position measurement as described in the following second embodiment.

Second Embodiment

Figure 21A:
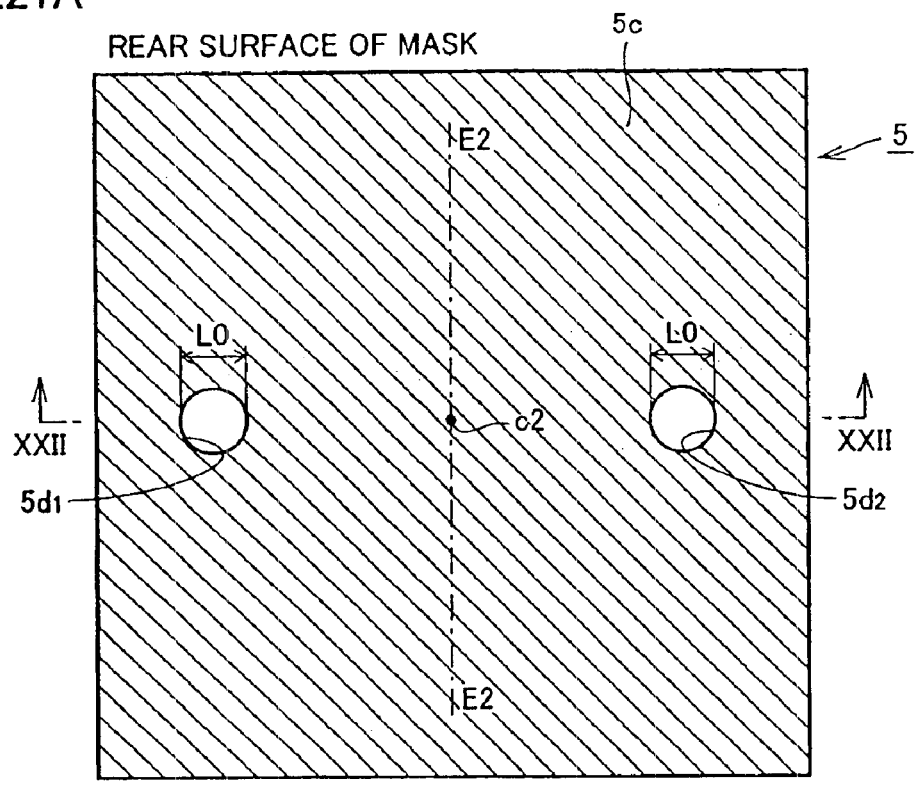
FIGS. 21A and 21B are a view of the rear surface and a view of the top surface schematically showing the configuration of a photomask for focus monitoring according to a second embodiment of the present invention.
Figure 21B:
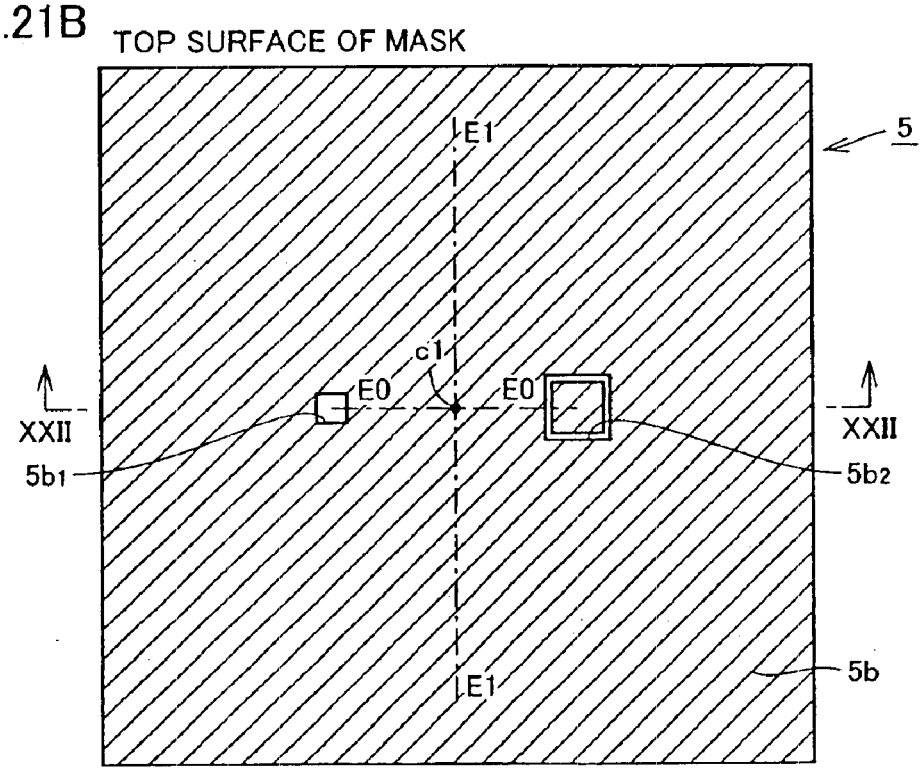
Figure 22:
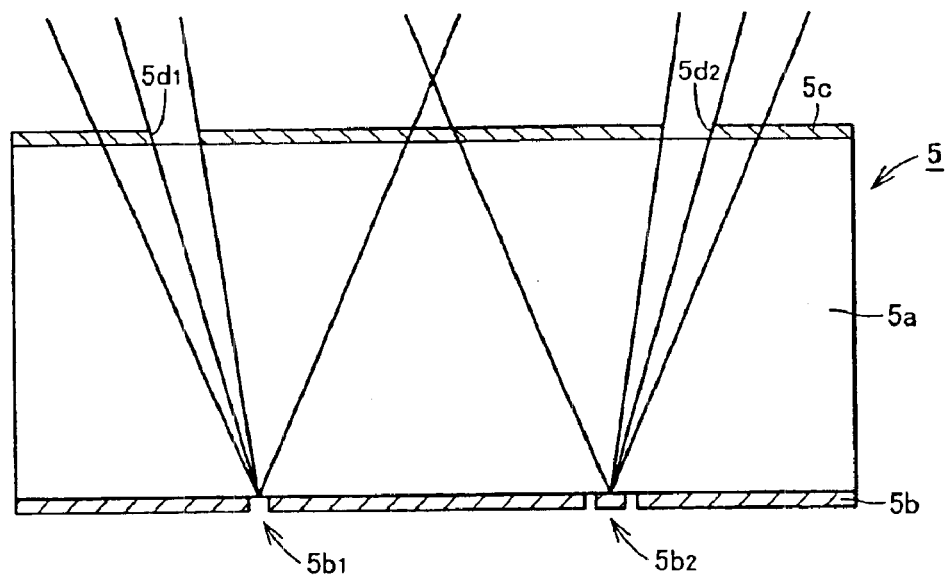
FIG. 22 is a schematic cross sectional view along line XXII—XXII in FIGS. 21A and 21B.

In reference to FIGS. 21A, 21B and 22, this photomask 5 for focus monitoring is provided with aperture patterns $5d_1$ and $5d_2$ on the rear surface so as to correspond, respectively, to two patterns $5b_1$ and $5b_2$ for position measurement. Thereby, as shown in FIG. 22, each of the patterns, $5b_1$ and $5b_2$, for position measurement is irradiated with light components that have passed through the differing aperture patterns $5d_1$ and $5d_2$ on the rear surface of the photomask.

Each of the diameters L0 of these two aperture patterns, $5d_1$ and $5d_2$, on the rear surface of the photomask is formed so as to satisfy the condition of $L0/\lambda \geq 10$ when the wavelength of the exposure light that irradiates this photomask 5 is $\lambda$.

Two aperture patterns $5d_1$ and $5d_2$ on the rear surface of the photomask are symmetrically arranged relative to point c2 on the rear surface that is directly opposite to the central point c1 of the fictitious line (E0—E0) that connects two patterns $5b_1$ and $5b_2$ for position measurement. In addition, two aperture patterns $5d_1$ and $5d_2$ on the rear surface of the photomask are symmetrically arranged relative to the fictitious line (E2—E2) that is drawn by projecting the line (E1—E1) that is perpendicular to, and divides into two equal segments, the fictitious line (E0—E0) connecting two patterns $5b_1$ and $5b_2$ for position measurement onto the rear surface of the photomask.

In addition, the distance between each of the two aperture patterns, $5d_1$ and $5d_2$, on the rear surface of the photomask and the fictitious line (E2—E2) is set so as to be longer than the distance between each of the two patterns, $5b_1$ and $5b_2$, for position measurement and the fictitious line (E1—E1). Therefore, pattern $5b_1$ for position measurement is irradiated with light only from aperture pattern $5d_1$ on the rear surface of the photomask while pattern $5b_2$ for position measurement is irradiated with light only from aperture pattern $5d_2$ on the rear surface of the photomask.

Figure 23:
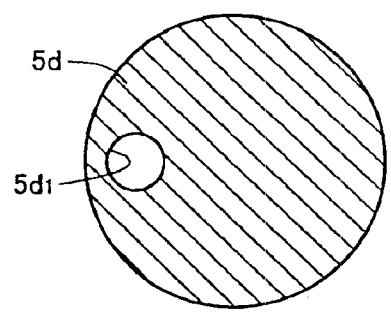
FIG. 23 is a view for describing wherein an aperture pattern $5d_1$ on the rear surface is solely distributed within a range wherein pattern $5b_1$ for position measurement can be irradiated with the exposure light when the rear surface of the substrate $5a$ is seen from the pattern $5b_1$ for position measurement.
Figure 24:
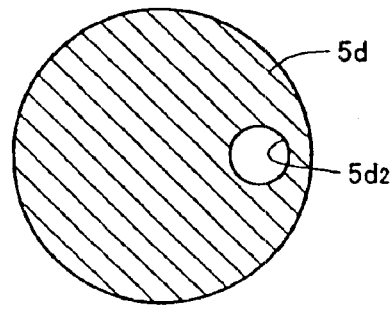
FIG. 24 is a view for describing wherein an aperture pattern $5d_2$ on the rear surface is solely distributed within a range wherein pattern $5b_2$ for position measurement can be irradiated with the exposure light when the rear surface of the substrate $5a$ is seen from the pattern $5b_2$ for position measurement.

That is to say, as shown in FIG. 23, only aperture pattern $5d_1$ on the rear surface of the substrate is distributed within the range from which pattern $5b_1$ for position measurement can be irradiated with exposure light on the rear surface of substrate $5a$ as is seen from pattern $5b_1$ for position measurement. In addition, as shown in FIG. 24, only aperture pattern $5d_2$ on the rear surface of the substrate is distributed within the range from which pattern $5b_2$ for position measurement can be irradiated with exposure light on the rear surface of substrate $5a$ as is seen from pattern $5b_2$ for position measurement.

In the case that photomask 5 shown in FIGS. 21A, 21B and 22 is used, the respective two patterns $5b_1$ and $5b_2$ for measurement can be irradiated with components of the exposure light of differing diagonal directions. Therefore, it is possible to carry out focus monitoring in the same manner as the case wherein photomask 5, shown in FIGS. 4A and 4B, is used.

In addition, the photomask for focusing may have a configuration wherein the respective two patterns $5b_1$ and $5b_2$ for measurement are illuminated from two aperture patterns $5d_1$ and $5d_2$ on the rear surface of the photomask as described in the following third embodiment.

Third Embodiment

Figure 25A:
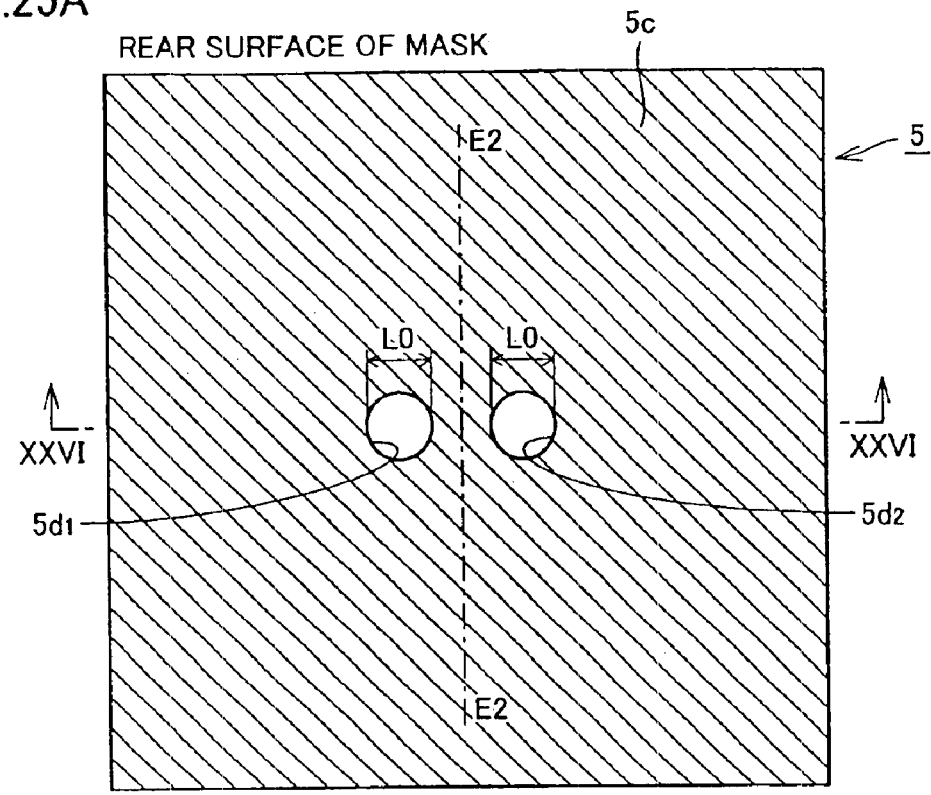
FIGS. 25A and 25B are a view of the rear surface and a view of the top surface of a photomask showing the configuration, which is the configuration of a photomask for focus monitoring according to a third embodiment of the present invention, wherein the two respective patterns for measurement are illuminated from the two aperture patterns on the rear surface.
Figure 25B:
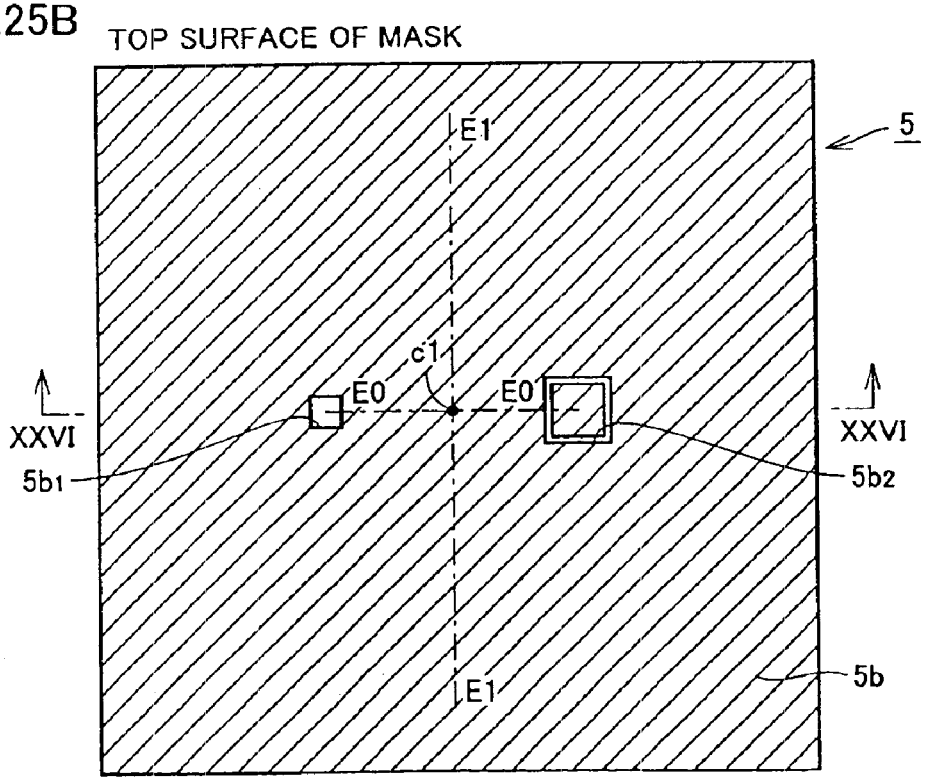
Figure 26:
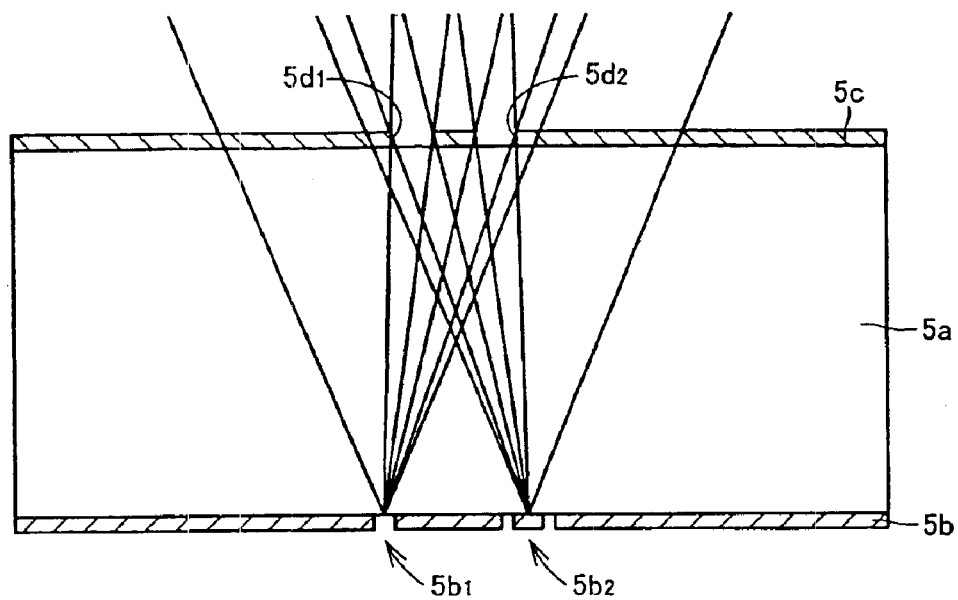
FIG. 26 is a schematic cross sectional view along line XXVI—XXVI in FIGS. 25A and 25B.

In reference to FIGS. 25A, 25B and 26, in this photomask 5, the distance between each of the two aperture patterns, $5d_1$ and $5d_2$, on the rear surface of the photomask and the fictitious line (E2—E2) is set to be shorter than the distance between each of the two patterns, $5b_1$ and $5b_2$, for position measurement and the fictitious line (E1—E1).

Since two aperture patterns, $5d_1$ and $5d_2$, on the rear surface of the photomask are arranged in such a manner, pattern $5b_1$ for position measurement is irradiated with the exposure light that has passed through both aperture patterns $5d_1$ and $5d_2$ on the rear surface of the photomask as shown in FIG. 26 while pattern $5b_2$ for position measurement is also irradiated with the exposure light that has passed to aperture pattern, $5d_1$ and $5d_2$, on the rear surface of the photomask.

Figure 27:
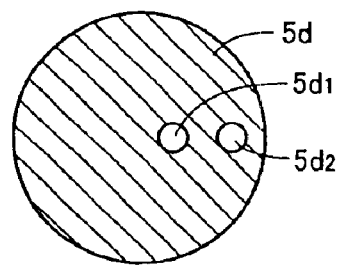
FIG. 27 is a view for describing wherein aperture patterns $5d_1$ and $5d_2$ on the rear surface are distributed within a range wherein pattern $5b_1$ for position measurement can be irradiated with the exposure light when the rear surface of the substrate $5a$ is seen from the pattern $5b_1$ for position measurement.
Figure 28:
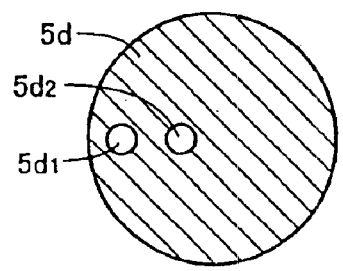
FIG. 28 is a view for describing wherein aperture patterns $5d_1$ and $5d_2$ on the rear surface are distributed within a range wherein pattern $5b_2$ for position measurement can be irradiated with the exposure light when the rear surface of the substrate $5a$ is seen from the pattern $5b_2$ for position measurement.

That is to say, as shown in FIG. 27, aperture patterns $5d_1$ and $5d_2$ on the rear surface of the photomask are distributed within the range wherein pattern $5b_1$ for position measurement on the rear surface of substrate $5a$ can be irradiated with the exposure light as can be seen from pattern $5b_1$ for position measurement. In addition, as shown in FIG. 28, aperture patterns $5d_1$ and $5d_2$ on the rear surface of the photomask are distributed within the range wherein pattern $5b_2$ for position measurement on the rear surface of substrate $5a$ can be irradiated with the exposure light as can be seen from pattern $5b_2$ for position measurement.

The parts of the configuration other than the above are approximately the same as the configuration shown in FIGS. 21A, 21B and 22 and, therefore, the same symbols are attached to the same members, of which the descriptions are omitted.

In this photomask 5 shown in FIGS. 25A, 25B and 26, each of the two patterns, $5b_1$ and $5b_2$, for position measurement can be irradiated with the components of exposure light of differing diagonal directions and, therefore, it is possible to carry out focus monitoring in the same manner as in the case wherein photomask 5 shown in FIGS. 4A and 4B is used.

In addition, though a circular aperture pattern is described as a pattern on the rear surface of the photomask in reference to FIGS. 4A, 4B and 5, a circular pattern that allows a light blocking film to remain as described in the following fourth embodiment may be used.

Fourth Embodiment

Figure 29A:
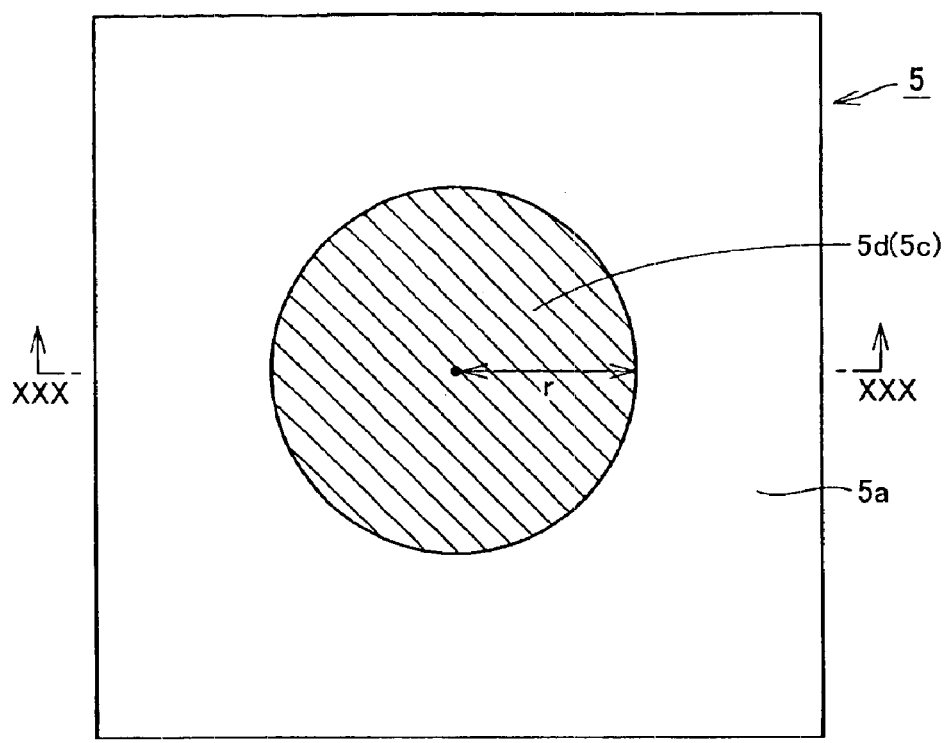
FIGS. 29A and 29B are a view of the rear surface and a view of the top surface schematically showing the configuration of a photomask for focus monitoring, which is the configuration of a photomask for focus monitoring according to a fourth embodiment of the present invention, wherein a pattern on the rear surface is a circular pattern that allows a light blocking film remain.
Figure 29B:
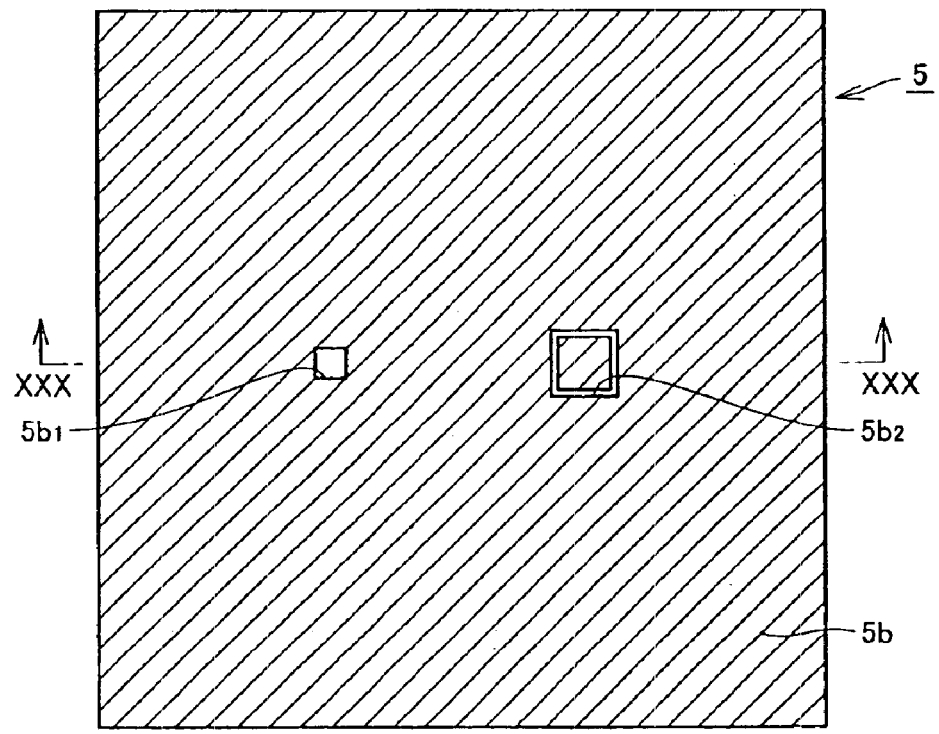
Figure 30:
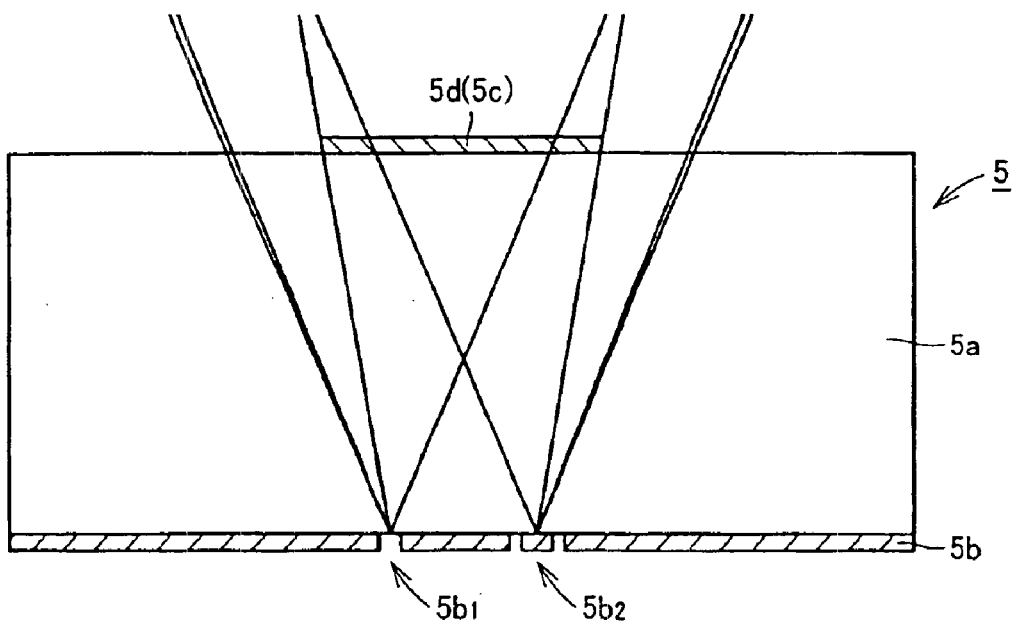
FIG. 30 is a schematic cross sectional view along line XXX—XXX in FIGS. 29A and 29B.

In reference to FIGS. 29A, 29B and 30, a light blocking film $5c$ on which a circular pattern $5d$ that allows a light blocking film to remain is formed on the rear surface of a substrate $5a$. In addition, two patterns $5b_1$ and $5b_2$ for position measurement are arranged within the top surface region of substrate $5a$, which opposes the region wherein the above pattern $5d$ is formed allowing a light blocking film to remain.

The diameter $2r$ of this pattern $5d$ that allows a light blocking film to remain is formed so as to satisfy the condition of $2r/\lambda \geq 10$ when the wavelength of the exposure light with which this photomask 5 is irradiated is $\lambda$.

Here, the parts of the configuration other than the above are approximately the same as the configuration of the above described photomask of FIGS. 4A, 4B and 5 and, therefore, the same symbols are attached to the same members, of which the descriptions are omitted.

In this photomask 5 both of the two patterns, $5b_1$ and $5b_2$, for position measurement are arranged within the top surface region of substrate 5a that is directly opposite to the region wherein a circular pattern 5d that allows a light blocking film to remain is formed. Therefore, as shown in FIG. 30, each of these two patterns, 5b, and $5b_2$, for position measurement is irradiated with components of the exposure light of differing diagonal directions.

Figure 31:
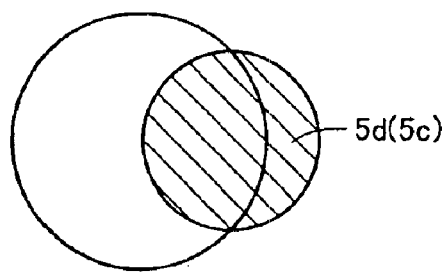
FIG. 31 is a view for describing wherein pattern $5d$ is located so as to allow a light blocking film to remain solely in a portion within a region wherein pattern $5b_1$ for position measurement can be irradiated with the exposure light when the rear surface of substrate $5a$ is seen from pattern $5b_1$ for position measurement.
Figure 32:
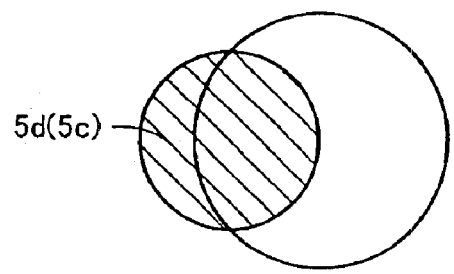
FIG. 32 is a view for describing wherein pattern $5d$ is located so as to allow a light blocking film to remain solely in a portion within a region wherein pattern $5b_2$ for position measurement can be irradiated with the exposure light when the rear surface of substrate $5a$ is seen from pattern $5b_2$ for position measurement.

That is to say, as shown in FIG. 31, pattern 5d that allows a light blocking film to remain is positioned only in a portion within the region that allows the irradiation of pattern $5b_1$ for position measurement with the exposure light on the rear surface of substrate 5a as is seen from pattern $5b_1$ for position measurement. In addition, as shown in FIG. 32, pattern 5d that allows a light blocking film to remain is positioned only in a portion within the region that allows the irradiation of pattern $5b_2$ for position measurement with the exposure light on the rear surface of substrate 5a as is seen from pattern $5b_2$ for position measurement.

With the configuration of this photomask 5, it becomes possible to irradiate both of the two patterns, $5b_1$ and $5b_2$, for position measurement with the exposure light of differing diagonal directions as described above and, therefore, it becomes possible to carry out focus monitoring in the same manner as with photomask 5 shown in FIGS. 4A, 4B and 5.

Here, it is preferable for the value of $\sin(\tan^{-1}(r/D))$ to be smaller than the INA value when the radius of pattern 5d that allows a light blocking film to remain is denoted as r. This is because, in the case that the value of $\sin(\tan^{-1}(r/D))$ is of the INA value, or greater, some portion of pattern 5d that allows a light blocking film to remain arranged in a specific position cannot be irradiated with a portion of the exposure light that enters patterns $5b_1$ and $5b_2$ for position measurement so that the incident directions of the exposure light that enters two patterns, $5b_1$ and $5b_2$, for position measurement cannot be made to differ.

In addition, it is preferable for the value of $\sin(\tan^{-1}(r/D))$ to be greater than 0.5 times the INA value. In the case that the value of $\sin(\tan^{-1}(r/D))$ is 0.5 times the INA value, or smaller, the light blocking portion becomes too small and, therefore, it becomes difficult to secure the non-telecentric characteristics of the exposure light so that the detection sensitivity of the patterns in focus monitoring is lowered.

In addition, though a circular aperture pattern is described as a pattern on the rear surface of the photomask in FIGS. 4A, 4B and 5, a rectangular light blocking pattern may be used as described in the following fifth embodiment.

Fifth Embodiment

Figure 33A:
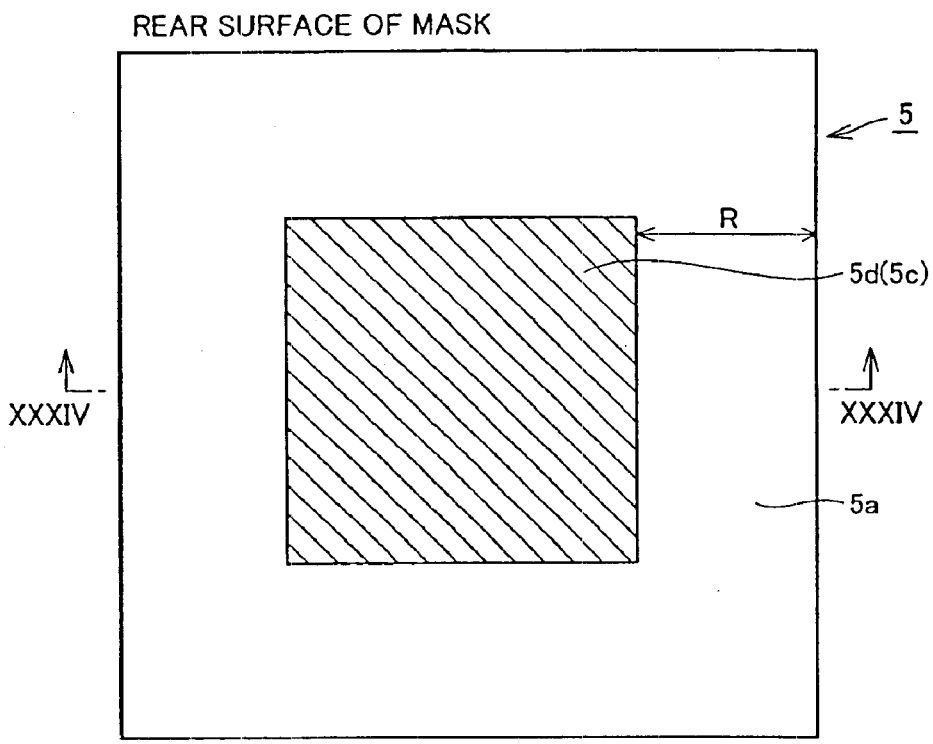
FIGS. 33A and 33B are a view of the rear surface and a view of the top surface schematically showing the configuration of a photomask for focus monitoring, which is the configuration of a photomask for focus monitoring according to a fifth embodiment of the present invention, wherein a pattern on the rear surface is a rectangular pattern that allows a light blocking film to remain.
Figure 33B:
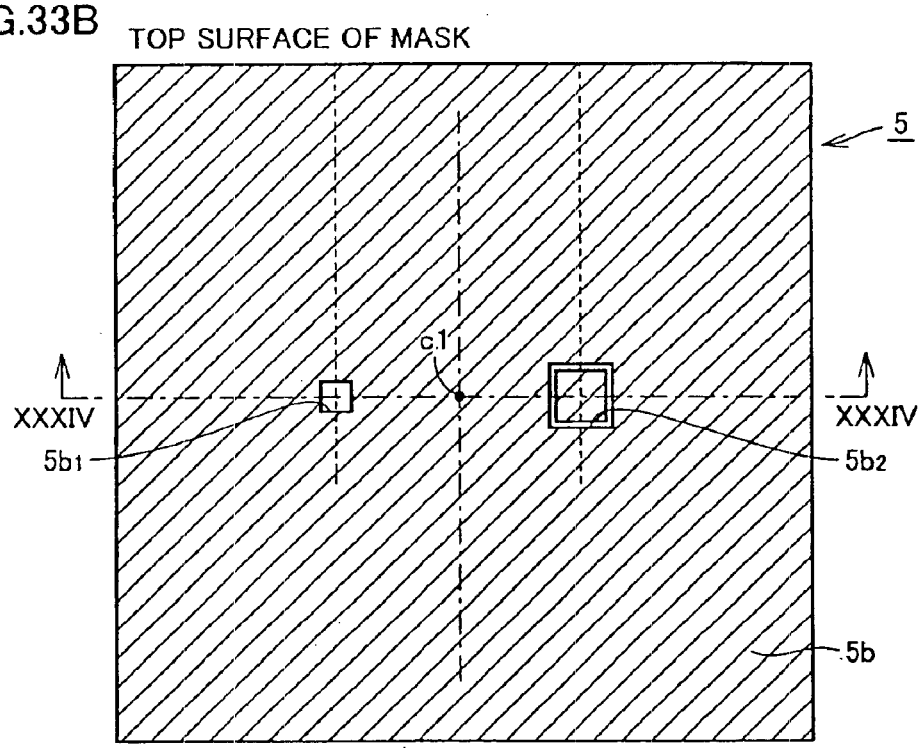
Figure 34:
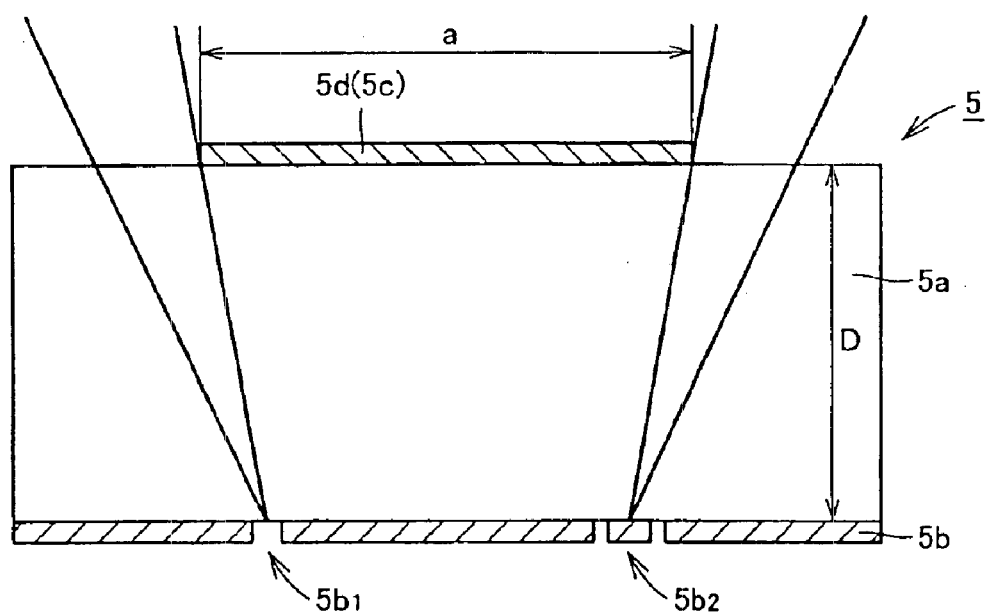
FIG. 34 is a schematic cross sectional view along line XXXIV—XXXIV in FIGS. 33A and 33B.

In reference to FIGS. 33A, 33B and 34, a light blocking film 5c, on which a rectangular pattern 5d that allows a light blocking film to remain is formed, is formed on the rear surface of a substrate 5a. In addition, two patterns, $5b_1$ and $5b_2$, for position measurement are arranged within the top surface region of substrate 5a that is directly opposite to the region wherein the above pattern 5d that allows a light blocking film to remain is formed.

The length a of one side of this pattern 5d that allows a light blocking film to remain is formed so as to satisfy the condition of $a/\lambda \geq 10$ when the wavelength of the exposure light, with which this photomask 5 is irradiated, is $\lambda$.

Here, the parts of the configuration other than the above are approximately the same as the above described configuration of photomask 5 of FIGS. 4A, 4B and 5 and, therefore, the same symbols are attached to the same members, of which the descriptions are omitted.

Both of the two patterns, $5b_1$ and $5b_2$, for position measurement are arranged within the top surface region of substrate 5a that is directly opposite to the region wherein a rectangular pattern 5d that allows a light blocking film to remain is formed in this photomask 5. Therefore, each of these two patterns, $5b_1$ and $5b_2$, for position measurement is irradiated with components of the exposure light of differing diagonal directions as shown in FIG. 34.

That is to say, pattern 5d that allows a light blocking film to remain is positioned in only a portion within the region on the rear surface of substrate 5a wherein pattern $5b_1$ for position measurement can be irradiated with the exposure light as is seen from pattern $5b_1$ for position measurement. In addition, pattern 5d that allows a light blocking film to remain is positioned in only a portion within the region on the rear surface of substrate 5a wherein pattern $5b_2$ for position measurement can be irradiated with the exposure light as is seen from pattern $5b_2$ for position measurement.

With the configuration of this photomask 5, it becomes possible to irradiate the both of the above described two patterns, $5b_1$ and $5b_2$, for position measurement with the exposure light of differing diagonal directions and, therefore, it becomes possible to carry out focus monitoring in the same manner as with photomask 5 shown in FIGS. 4A, 4B and 5.

Here, it is preferable for pattern 5d that allows a light blocking film to remain to have an aperture wherein a light blocking film is not formed within the range of R wherein the distance R vis-à-vis a side that forms the external form of pattern 5d that allows a light blocking film to remain satisfies the relationship of $\sin(\tan^{-1}(R/D)) \geq$ INA value.

In addition, when the length of the shorter sides of pattern 5d that allows a light blocking film to remain is denoted as a, it is preferable for the value of $\sin(\tan^{-1}(a/D))$ to be greater than 0.5 times in the INA value. In the case that the value of $\sin(\tan^{-1}(a/D))$ is 0.5 times the INA value, or smaller, the light blocking portion becomes too small and, therefore, it becomes difficult to secure the non-telecentric characteristics of the exposure light so that the detection sensitivity of the patterns in focus monitoring is lowered.

In addition, though a circular aperture pattern is described as a pattern on the rear surface of the photomask in reference to FIGS. 4A, 4B and 5, a rectangular aperture pattern may be used as described in the following sixth embodiment.

Sixth Embodiment

Figure 35A:
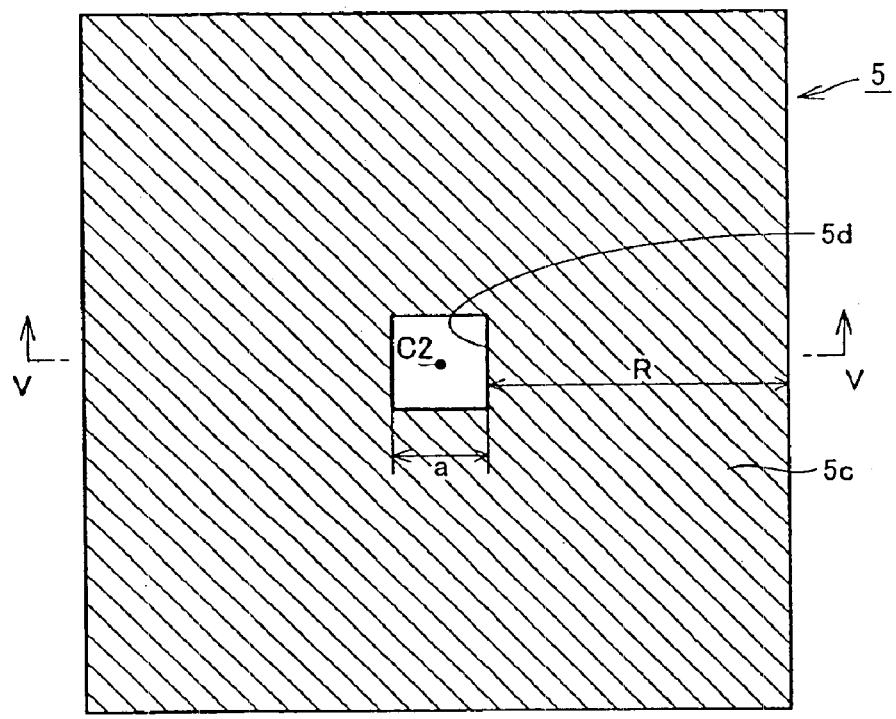
FIGS. 35A and 35B are a view of the rear surface and a view of the top surface schematically showing the configuration of a photomask for focus monitoring, which is the configuration of a photomask for focus monitoring according to a sixth embodiment of the present invention, wherein a pattern on the rear surface is a rectangular aperture pattern.
Figure 35B:
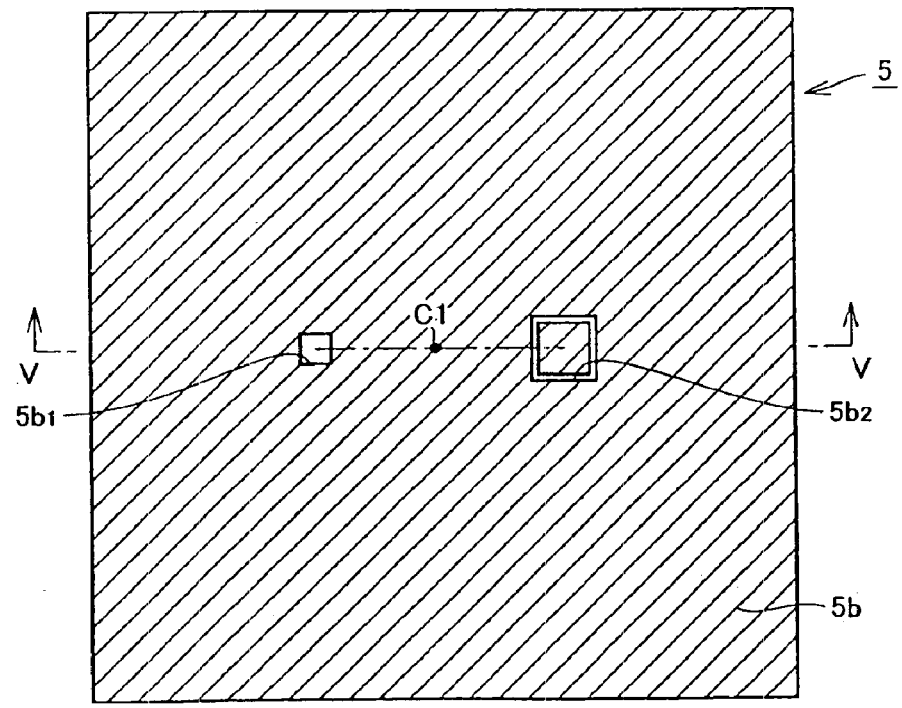

In reference to FIGS. 35A and 35B, a light blocking film 5c that forms a rectangular aperture pattern 5d is formed on the rear surface of a substrate 5a. Rectangular aperture pattern 5d is formed in a rectangular form (for example, square form) of which the center is point c2 on the rear surface that is directly opposite to the center point c1 of the fictitious line connecting the above two patterns $5b_1$ and $5b_2$ for position measurement. In addition, the cross section corresponding to line V—V in FIGS. 35A and 35B is the same as of the configuration in FIG. 5.

The length a of one side of the above rectangular aperture pattern 5d is formed so as to satisfy the condition of $a/\lambda \geq 10$ wherein the wavelength of the exposure light with which this photomask 5 is irradiated is $\lambda$.

Here, the other parts of the configuration are approximately the same as the configuration of the above described photomask in FIGS. 4A, 4B and 5 and, therefore, the same symbols are attached to the same members, of which the descriptions are omitted.

In this photomask 5, patterns $5b_1$ and $5b_2$ for position measurement are arranged on both sides, respectively, of the optical axis (line A—A) that passes through rectangular aperture pattern 5d. Therefore, the incident direction of the exposure light that enters pattern $5b_1$ for position measurement after passing through rectangular aperture pattern 5d and the incident direction of the exposure light that enters pattern $5b_2$ for position measurement differ from each other. In particular, in the case that patterns $5b_1$ and $5b_2$ for position measurement are symmetrically arranged relative to the optical axis A—A that passes through rectangular aperture pattern 5d, the incident direction of the exposure light that enters pattern $5b_1$ for position measurement and the incident direction of the exposure light that enters pattern $5b_2$ for position measurement are mutually symmetric relative to the direction of the optical axis A—A In such a manner each of the two patterns, $5b_1$ and $5b_2$, for position measurement is irradiated with a differing component of the diagonal direction of the exposure light.

It becomes possible to irradiate both of the two patterns $5b_1$ and $5b_2$ for position measurement with exposure light from differing diagonal directions as described above in the configuration of the above photomask 5 and, therefore, it becomes possible to carry out focus monitoring in the same manner as in photomask 5 shown in FIGS. 4A, 4B and 5.

Here, it is preferable for the light blocking portion to be a light blocking film that is formed within a range wherein distance R vis-à-vis a side that forms the external form of rectangular aperture pattern 5d satisfies the relationship of $\sin(\tan^{-1}(R/D)) \geq INA$ value. Thereby, illumination light from rectangular aperture pattern 5d alone can be allowed to enter each of the two patterns $5b_1$ and $5b_2$ for position measurement so that the non-telecentric characteristics of the exposure light can be firmly secured.

In addition, it is preferable for the value of $\sin(\tan^{-1}(a/D))$ to be greater than 0.2 times the INA value wherein the length of the shorter side of rectangular aperture pattern 5d is a. In the case that the value of $\sin(\tan^{-1}(a/D))$ is 0.2 times the INA value, or smaller, the amount of the exposure light becomes approximately $\frac{1}{100}$ of the case of a conventional transcription and it becomes difficult to transcribe a pattern for position measurement to a photoresist so that the throughput of the measurement of the focus is lowered.

Seventh Embodiment

Figure 36A:
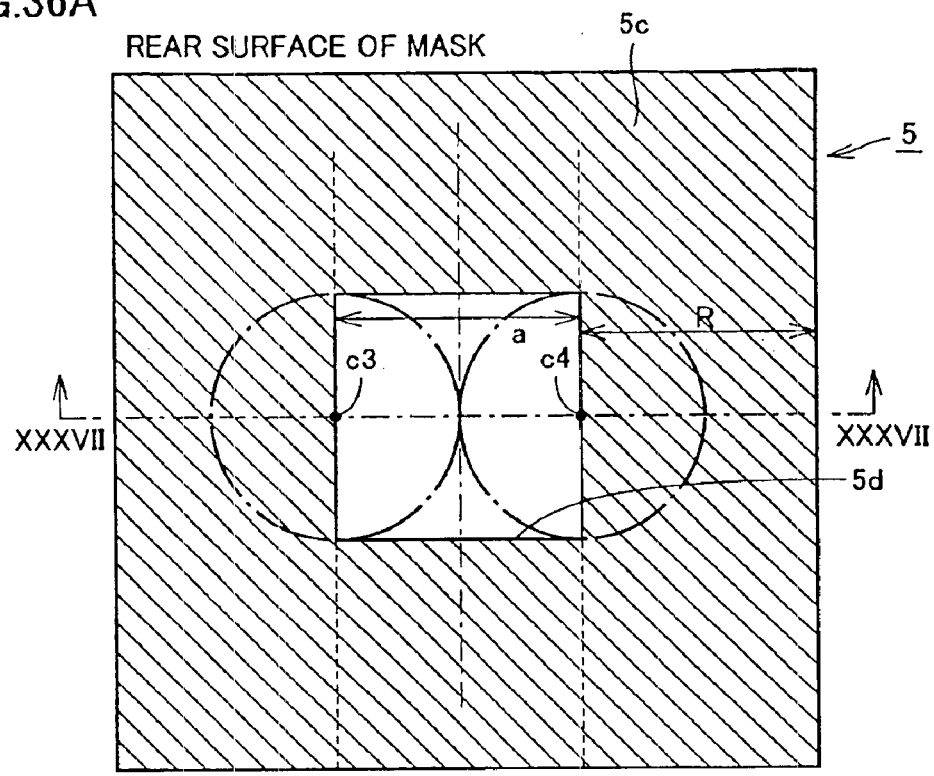
FIGS. 36A and 36B are a view of the rear surface and a view of the top surface schematically showing the configuration of a photomask used in a method of focus monitoring according to a seventh embodiment of the present invention.
Figure 36B:
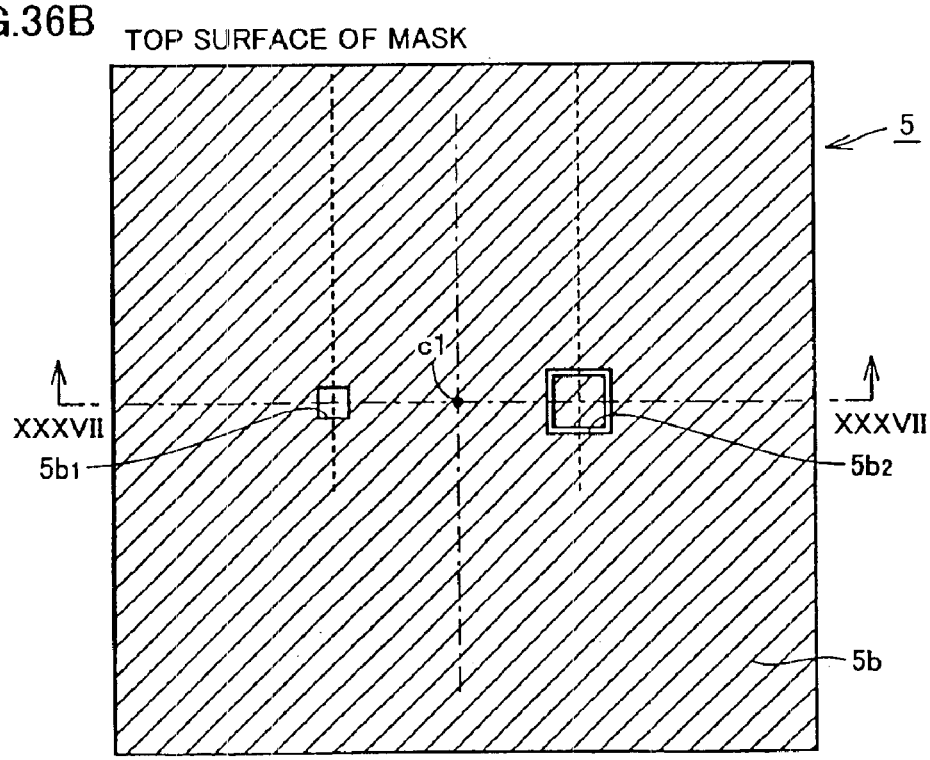
Figure 37:
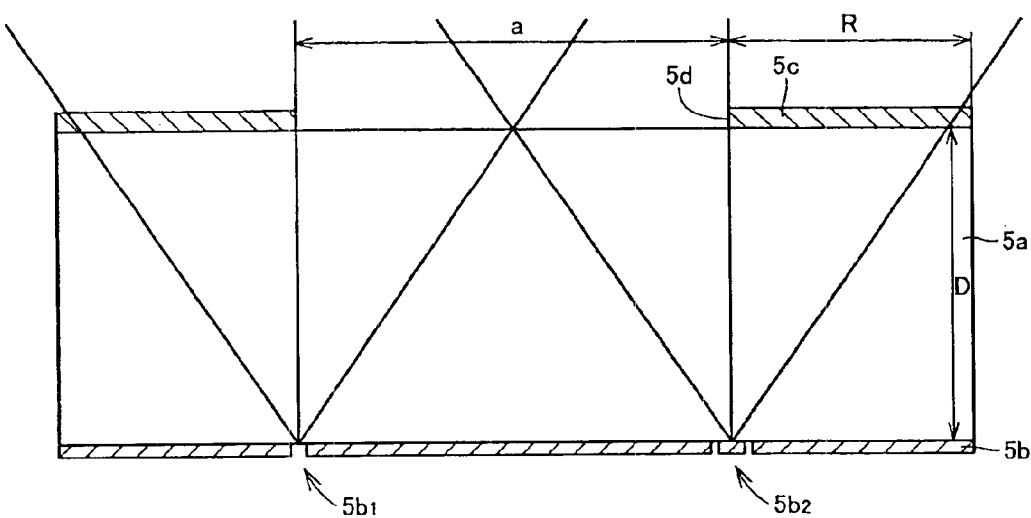
FIG. 37 is a schematic cross sectional view along line XXXVII—XXXVII in FIGS. 36A and 36B.

In reference to FIGS. 36A, 36B and 37, a photomask 5 for focus monitoring of the present embodiment is different from the configuration shown in FIGS. 35A and 35B in the point that each of patterns $5b_1$ and $5b_2$ for position measurement is positioned on the top surface side of substrate 5a that is directly opposite to the middle point (c3, c4) of each of the two sides facing each other of square aperture pattern 5d.

Here, the other parts of the configuration are approximately the same as the configuration of the above described FIGS. 35A and 35B and, therefore, the same symbols are attached to the same members, of which the descriptions are omitted.

In the present embodiment each other of the two patterns, $5b_1$ and $5b_2$, for position measurement is positioned on the top surface side of substrate 5a that is directly opposite to the center point (c3, c4) of a side square aperture pattern 5d. Therefore, approximately half of the complementary exposure light with which each of two patterns, $5b_1$ and $5b_2$, for position measurement is irradiated as shown in FIG. 37 is blocked by a light blocking film 5c, while each of the patterns, $5b_1$ and $5b_2$, for position measurement is irradiated with only the remaining half.

Figure 38:
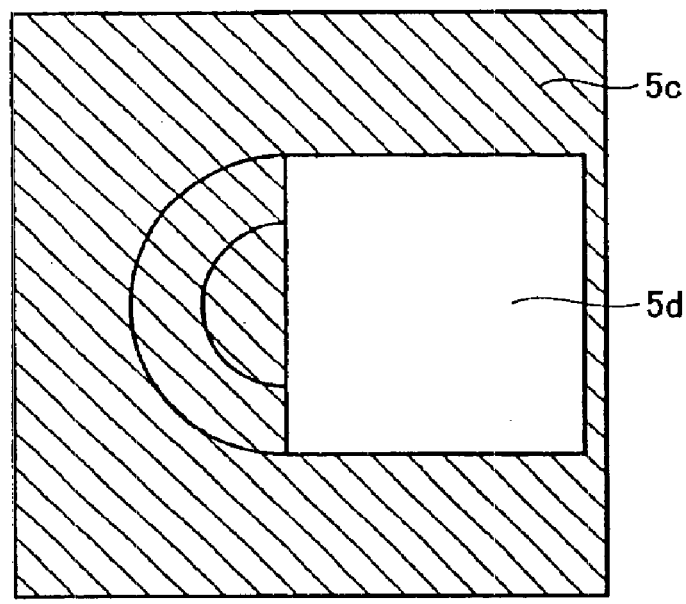
FIG. 38 is a view showing the position of a square aperture pattern $5d$ in the case that the rear surface of substrate $5a$ is seen from pattern $5b_1$ for position measurement.
Figure 39:
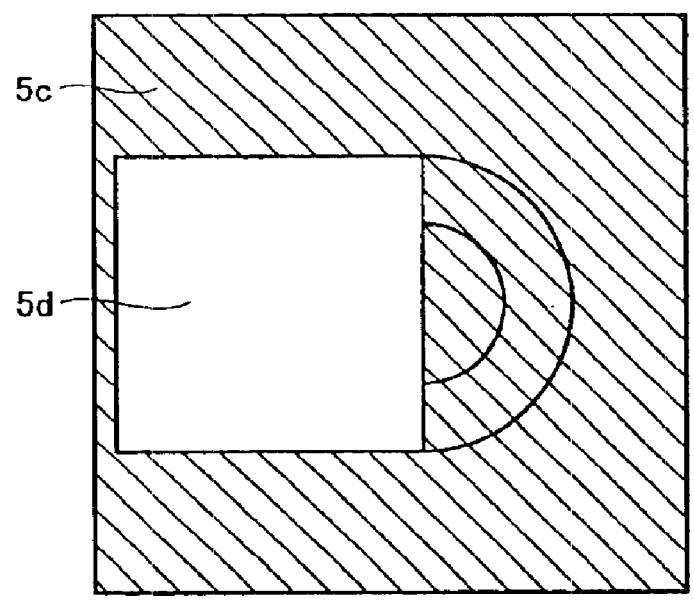
FIG. 39 is a view showing the position of a square aperture pattern $5d$ in the case that the rear surface of substrate $5a$ is seen from pattern $5b_2$ for position measurement.
Figure 40:
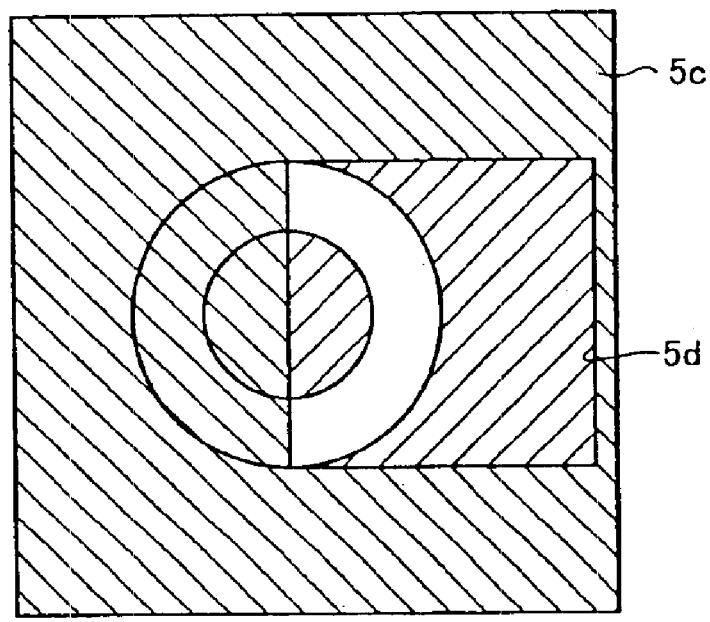
FIG. 40 is a view showing that the light for illuminating pattern $5b_1$ for position measurement is only the illumination light of the right half of the zonal illumination.
Figure 41:
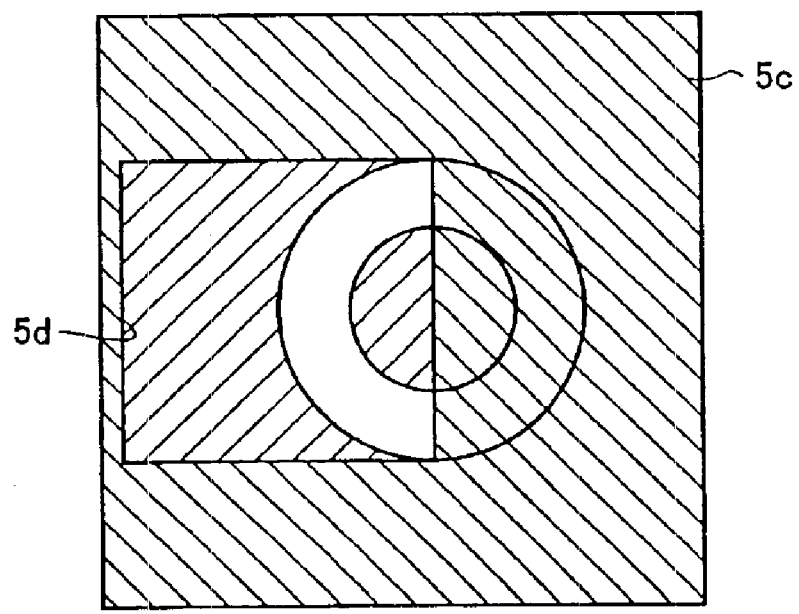
FIG. 41 is a view showing that the light for illuminating pattern $5b_2$ for position measurement is only the illumination light of the left half of the zonal illumination.

In addition, square aperture pattern 5d is positioned as shown in FIG. 38 on the rear surface side of substrate 5a as seen from pattern $5b_1$ for position measurement in this photomask 5. In addition, square aperture pattern 5d is positioned as shown in FIG. 39 on the rear surface side of substrate 5a as seen from pattern $5b_2$ for position measurement. Therefore, in the case that a zonal illumination diaphram 14 shown in FIG. 6 is used as an diaphram 14 of FIG. 3, the light that illuminates pattern $5b_1$ for position measurement is solely the illumination light of the right half of the zonal illumination as shown in FIG. 40 and the exposure light with which pattern $5b_2$ for position measurement is irradiated is solely the illumination light of the left half of the zonal illumination as shown in FIG. 41.

Thereby, the respective patterns, $5b_1$ and $5b_2$, for position measurement are irradiated with the light from diagonal directions differing from each other and it becomes possible to carry out focus monitoring in the same manner as in the first embodiment.

In the case that photomask 5 shown in FIGS. 36A, 36B and 37 is exposed, it is preferable for the light blocking film to be formed in a light blocking portion within the range R wherein the distance vis-à-vis the side that forms the external form of aperture pattern 5d on the rear surface of the photomask satisfies $\sin(\tan^{-1}(R/D)) \geq INA$ value when the thickness of substrate 5a is D, the numerical aperture is NA, and the coherence that is the interference index of the exposure light is σ. Thereby, only the illumination light from square aperture pattern 5d is allowed to enter into each of the two patterns, $5b_1$ and $5b_2$, for position measurement so that the non-telecentric characteristics of the exposure light can be firmly secured.

In addition, it is preferable for the value of $\sin(\tan^{-1}(a/D))$ to be greater than two times the INA value when the length of one side of square aperture pattern 5d is a. Thereby, it is possible for the illumination light components that enter patterns $5b_1$ and $5b_2$ for position measurement on the top surface of the photomask to be always approximately half of the entirety of the illumination with respect to an arbitrary illumination form.

In addition, it is preferable for the value of $\sin(\tan^{-1}(a/D))$ to be smaller than three times the INA value. In the case that the value of $\sin(\tan^{-1}(a/D))$ is three times the INA value, or greater, square aperture pattern 5d on the rear surface of the photomask becomes too large so that it becomes difficult to arrange a large number of unit mask structures for focus monitoring on the mask.

Figure 42A:
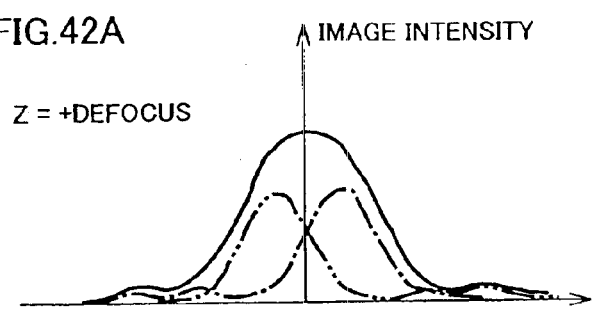
FIGS. 42A, 42B and 42C are graphs showing a change in the image intensity due to a change in focus position in the case that one pattern is illuminated by using half illumination of the right and left sides, respectively.
Figure 42B:
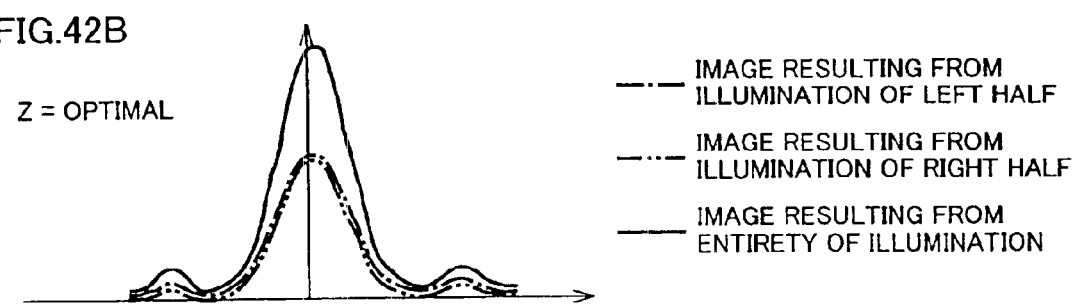
Figure 42C:
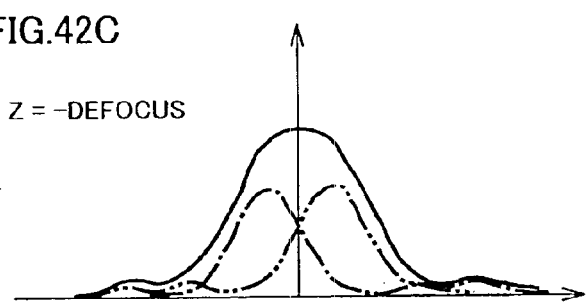

In the case that one pattern is illuminated by using each of the half illuminations of the right and left sides such as, for example, a photomask of the present embodiment, the change in the image intensity due to change in the focus position becomes as shown in FIGS. 42A, 42B and 42C. In reference to FIGS. 42A, 42B and 42C, the intensity of the image resulting from the total illumination of the half illumination on the right side and the half illumination on the left side varies depending on the position of the wafer in the z direction. That is to say, when the wafer is in the defocused position, the image resulting from the half illumination on the right side and the image resulting from the half illumination on the left side cause mutual positional shift so that the intensity of the image resulting from the entirety of the illumination becomes small. Contrarily, in the case that the wafer is in the optimally focused position, the image resulting from the half illumination on the right side and the image resulting from the half illumination on the left side do not cause a positional shift so that they approximately agree with each other and, therefore, the image resulting from the entirety of the illumination attains optimal sharpness and the image intensity becomes of the maximum.

In the case that the exposure is carried out by using such half illuminations on the right and left sides, the optimally focused position (height position in the z direction wherein the positions of the images resulting from the respective half illuminations agree with each other) agrees with the optimally focused position (height position in the z direction wherein the intensity of the dimension/image, or the like, becomes of the extreme value) of the actual transcription resulting from the total illumination. This is described in detail in the following.

The position of the optimal focus for the image formation becomes displaced from the optimal focus position in the ideal lens system because of the lens aberration. The lens aberration is represented as a phase error in the diaphram plane. This phase error can be considered by being divided into even aberration wherein the same values are gained in two points that are symmetrical relative to the center and odd aberration wherein the signs of the values are made opposite to each other. As for the even aberration and odd aberration, a change in focus is caused by the even aberration. On the other hand, the odd aberration causes a shift in the image in the lateral direction.

Figure 43:
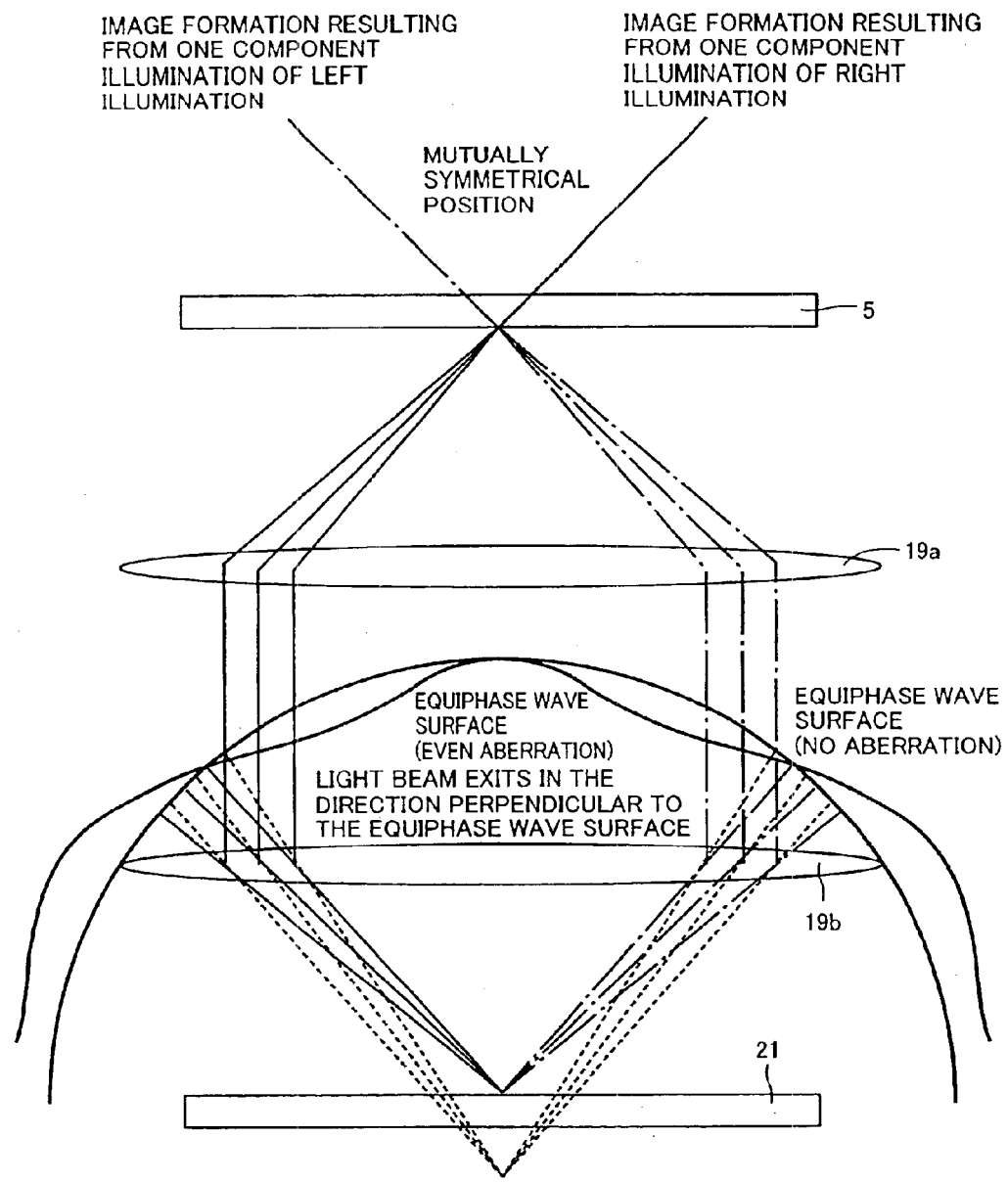
FIG. 43 is a view showing the appearance of an image formed by one element illumination from among the respective half illumination when only the even aberration exists.

In reference to FIG. 43, each component illumination of the half illumination of the right side and the half illumination of the left side are mutually positioned according to rotational symmetry relative to the diaphram center in the diaphram plane. As shown in the figure, the rays are in the normal direction relative to the equiphase wave surface. In addition, the positions of the respective half illumination on the right side and left side are symmetrical and the diffracted light is generated symmetrically around the 0 order diffracted light (non-refracted illumination light) by means of the non-phase shift mask. Therefore, in the image formations resulting from the respective component illuminations, the optimal focus positions shift by the same amount in the z direction as shown by the dotted line. That is to say, in these shifted optimal focus positions, the mutual positional shift of the patterns formed by the half illumination on the left side and the half illumination on the right side becomes 0 and becomes the same as the ideal condition (no aberration and optimal focus).

On the other hand, the total illumination is the sum of the half illumination on the left side and the half illumination on the right side. Therefore, the case of image formation resulting from the total illumination is considered in the same manner as the case wherein a pattern is irradiated by being divided into the half illumination on the left side and the half illumination on the right side. Accordingly, in the case that only the even aberration exits, the optimal focus position resulting from the total illumination shifts as shown by the dotted line of FIG. 43. Accordingly, even when there is an even aberration, the optimal focus positions wherein images are separately formed by the half illumination on the left side and the half illumination on the right side and the optimal focus position wherein the images formed by the total illumination become the same. Accordingly, it is understood that the even aberration does not cause a difference between the optimal focus according to the present method of focus monitoring and the optimal focus in the actual transcription resulting from the total illumination.

Next, the effects of the odd aberration are considered.

Figure 44:
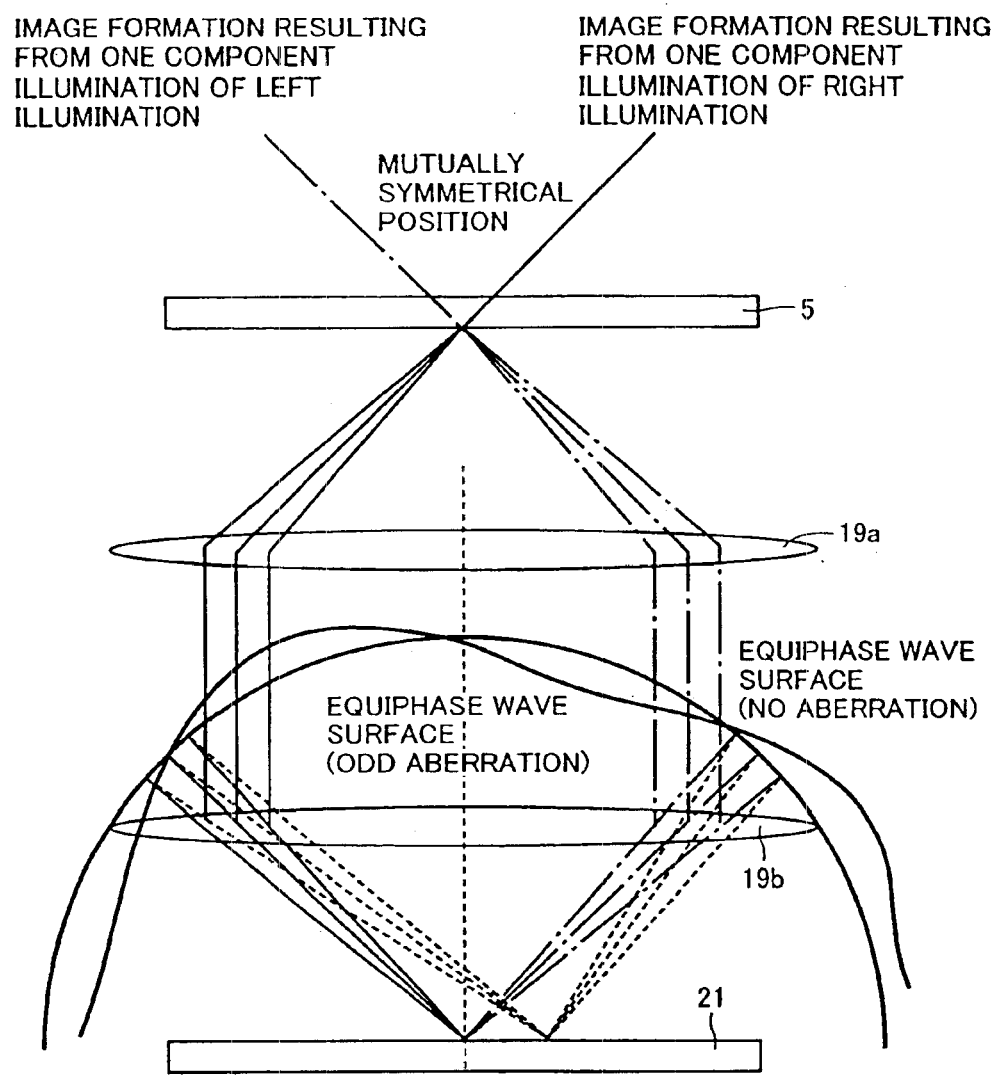
FIG. 44 is a view showing the appearance of an image formed by one element illumination from among the respective half illumination when only the odd aberration exists.

In the actual image formation it is necessary to consider the lateral shift of a pattern due to the odd aberration. As shown in FIG. 44 when respective component illuminations that form the half illumination on the left side and the half illumination on the right side is considered, the images resulting from the two component illuminations laterally shift by the same amount and in the same direction due to the symmetry of the diffracted light and the aberration. That is to say, the pattern formed by the half illumination on the left side and the pattern formed by the half illumination on the right side do not relatively shift in the lateral direction due to the odd aberration.

It is understood from the above that the odd aberration does not cause a disturbance to the measurement of the optimal focus position according to the method of focus monitoring of the present embodiment.

As described above, the optimal focus position is determined solely by the even aberration, even when the odd aberration exists, and the optimal focus position of the image resulting from the total illumination and the substrate position in the z direction, wherein relative positional shift between the respective patterns resulting from the half illumination on the left side and the half illumination on the right side becomes 0 as in the present embodiment, agree with each other.

Next, the working effects of focus monitoring in the method of focus monitoring according to the present embodiment are described by using a conceptual diagram.

Figure 45:
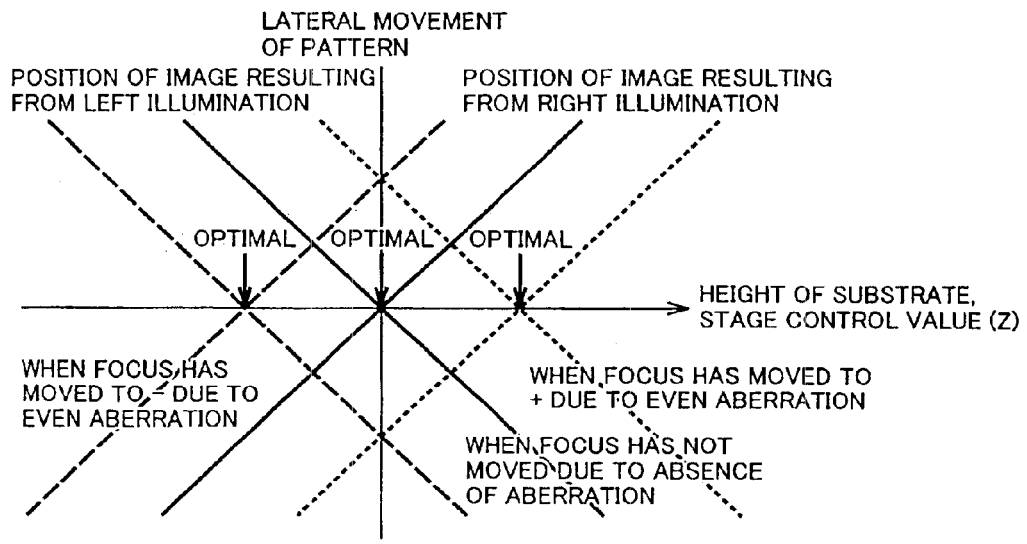
FIG. 45 is a view showing the motion of the transcription position of a mask pattern in a method of focus monitoring according to the seventh embodiment of the present invention in the case that only the even aberration exists.

FIG. 45 is a diagram showing the behavior of the transcription positions of the mask pattern in the method of focus monitoring according to the seventh embodiment of the present invention when only the even aberration exists, wherein the lateral shift of the image patterns formed by the half illumination on the left side and the half illumination on the right side is shown as a function of the height (distance vis-à-vis the optical system) of the surface of the transcribed substrate.

In reference to FIG. 45, a solid line, a dotted line and a broken line that extend from the upper left to the lower right show the positions of the images resulting from the half illumination on the left side while a solid line, a dotted line and a broken line a that extend from the upper right to the lower left are lines showing the positions of the images resulting from the half illumination on the right side. In the case that the even aberration exists, the height wherein the lateral shift of the pattern becomes 0 changes in the same manner for either pattern resulting from the half illumination on the left side or the pattern resulting from the half illumination on the right side.

Figure 46:
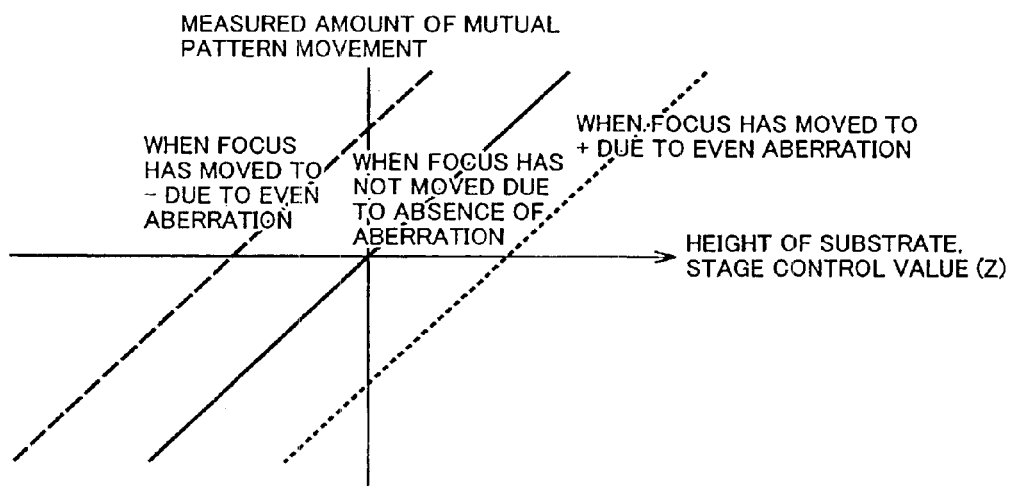
FIG. 46 is a view representing, as a relation of the substrate height, the mutual positional shift of the patterns resulting respectively from the half illumination, of the right and left sides, that is an experimental measurement amount in the case that only the even aberration exists.

In reference to FIG. 46, it is understood that the position of the optimal focus can be found from the substrate height wherein the relative shift becomes 0.

Figure 47:
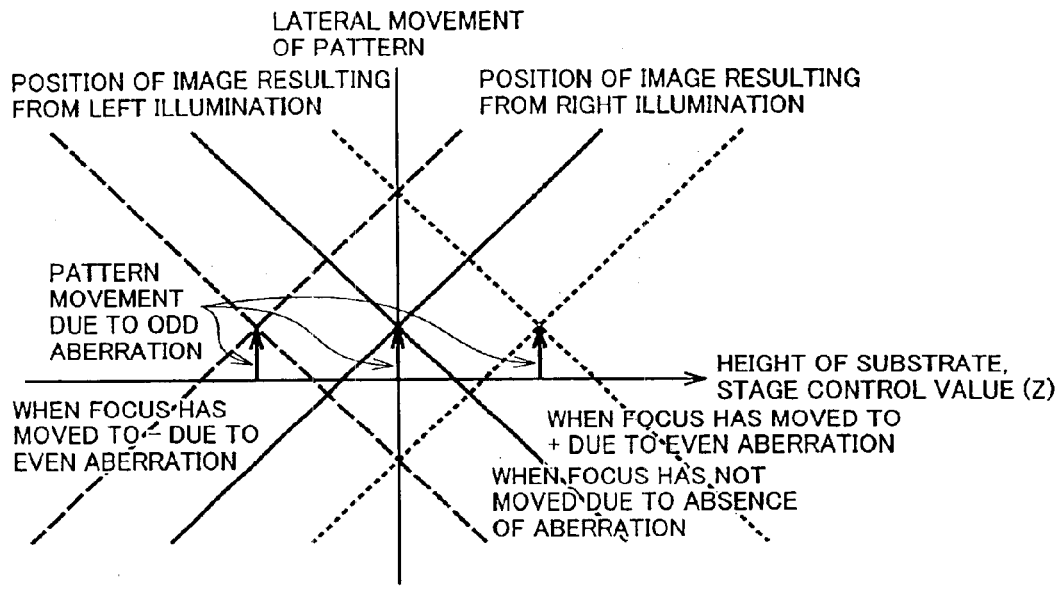
FIG. 47 is a view showing the motion of the transcription position of a mask pattern in the method of focus monitoring according to the seventh embodiment of the present invention in the case that the odd aberration also exists, in addition to the even aberration.

In reference to FIG. 47, either the pattern resulting from the half illumination on the right side or the pattern resulting from the half illumination on the left side shifts by the same amount and in the same direction due to the odd aberration. Therefore, in the case that the odd aberration exists, a condition is gained wherein the condition of the optimal focus has shifted by a specific amount in the upward or downward direction in the figure in comparison with the case wherein the even aberration alone exists as shown in FIG. 45.

Figure 48:
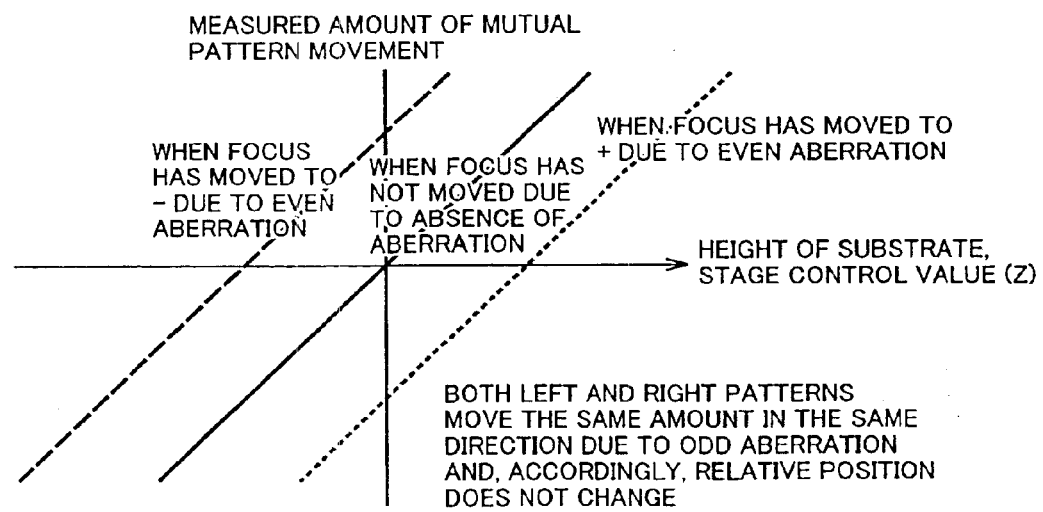
FIG. 48 is a view representing, as a relation of the substrate height, the mutual positional shift of patterns resulting respectively from half illumination of the right and left sides that are the experimental measurement amount in the case that the odd aberration also exists, in addition to the even aberration.

In addition, the mutual positional shift of the patterns resulting from the respective half illuminations on the right side and the left side that is the experimental measurement amount becomes the same as in the case that (FIG. 46) wherein there is no odd aberration since the pattern resulting from the half illumination on the right side and the pattern resulting from the half illumination on the left side laterally shift in the same manner according to the amount of aberration, as shown in FIG. 48.

Figure 49A:
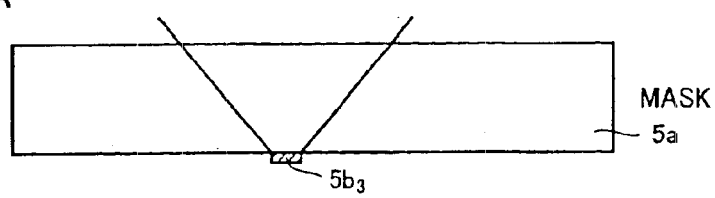
FIGS. 49A and 49B are a view showing the appearance of irradiation with the exposure light of the pattern in the actually transcribed pattern and a graph showing the relationship between the stage control value of the substrate height and the pattern dimensions.
Figure 49B:
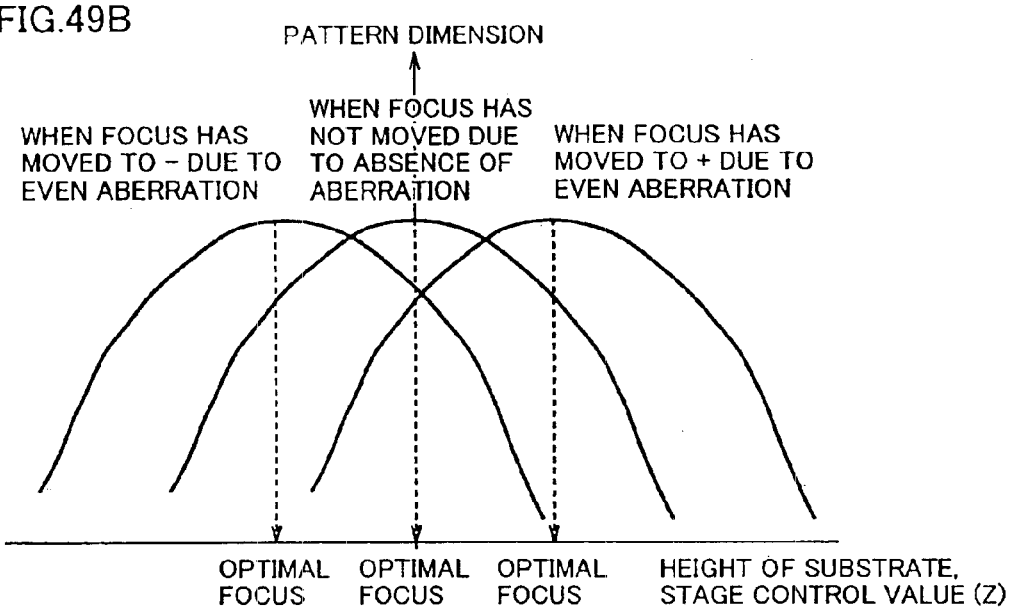

The behavior of the actual transcription pattern that corresponds to the behavior of the above described focus monitoring is shown in FIGS. 49A and 49B by citing an example of the CD (critical dimension)-focus characteristics.

In reference to FIG. 49A, the total illumination is the same as the simultaneous illuminations of pattern $5b_3$ of the above described half illumination on the right side and the half illumination on the left side. Then, in this case, as shown in FIG. 49B, it is understood that the position of the optimal focus, in the case that the even aberration exists, fluctuates in the direction of the optical axis (z direction) in comparison with the case wherein the even aberration does not exist. Though the optimal focus position can be found by using the CD-focus characteristics in the above manner, it is necessary, for example, to find the peak position of such moderate characteristics so that a large amount of labor is required and the precision is lowered.

As described above, even in the case that the exposure is carried out by using the half illuminations on the left and right sides, the position of the optimal focus agrees with the optimal focus position of the actual transcription resulting from the total illumination. Thereby, the optimal focus position of the actual transcription resulting from the total illumination can be found by using the half illuminations on the left and right sides. That is to say, though the position of the optimal focus in the actual transcription must be found from the contrast of the images in the case that it is found from the actual transcription pattern, it can be found from the relative positional shift of the two images of the patterns by using the method of focus monitoring of the present embodiment and, therefore, it becomes possible to find in a simpler manner and with a higher precision than in the case that it is found from the actual transcription pattern.

Though in the present embodiment, the case is described wherein aperture pattern $5d$ in a rectangular form (square form) on the rear surface of the photomask is used, the form of the rear surface pattern is not limited to this but, rather, a pattern such as is described in the following eighth embodiment may be used.

Eighth Embodiment

Figure 50A:
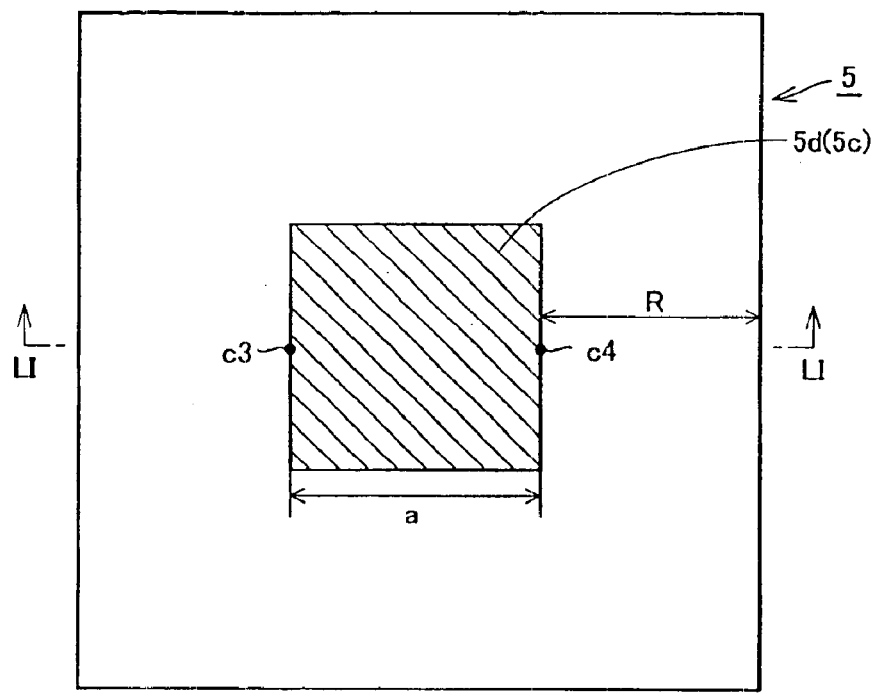
FIGS. 50A and 50B are a view of the rear surface and a view of the top surface schematically showing another configuration of the photomask used in a method of focus monitoring according to an eighth embodiment of the present invention.
Figure 50B:
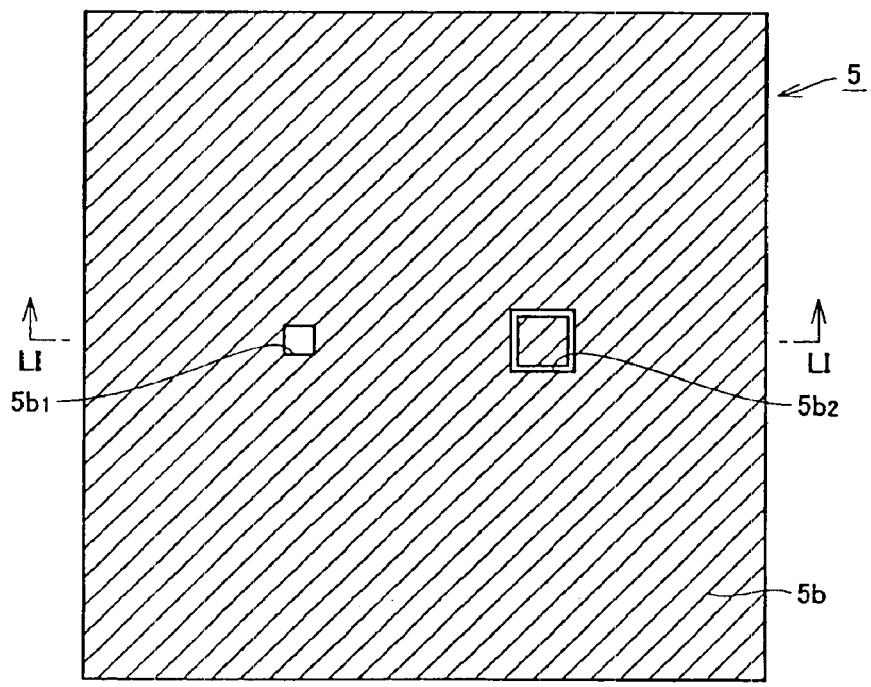
Figure 51:
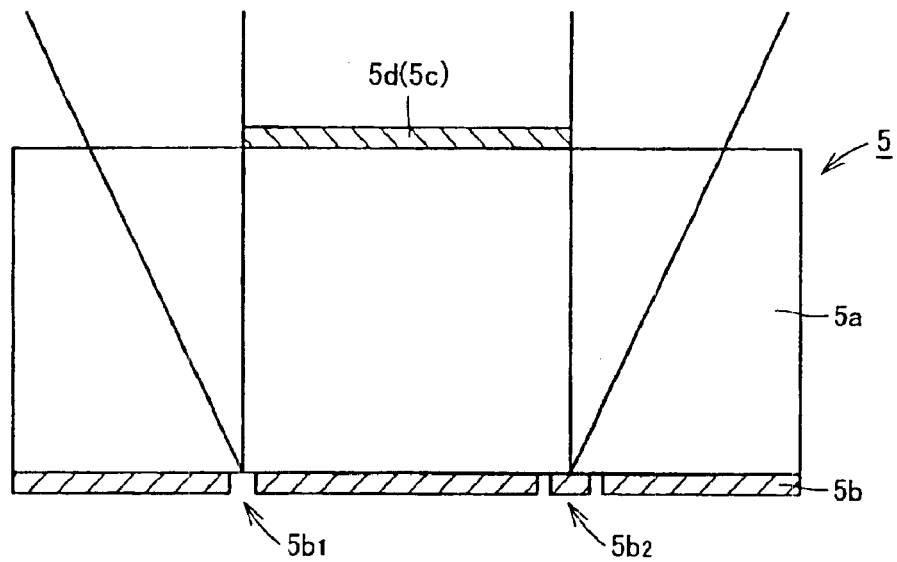
FIG. 51 is a schematic cross sectional view along line LI—LI in FIGS. 50A and 50B.

In reference to FIGS. 50A, 50B and 51, a photomask 5 of the present embodiment is different from photomask 5 shown in FIGS. 36A, 36B and 37 in the point that a pattern $5d$, which allows a light blocking film to remain in a rectangular form (for example, square form), is formed of a light blocking film $5c$ as a rear surface pattern.

In the case that this pattern $5d$ that allows a light blocking film to remain is in a square form, two patterns $5b_1$ and $5b_2$ for position measurement are respectively arranged in positions on the top surface side that are directly opposite to the center points (c3, c4) of the two sides that facing each other in the above square.

Here, the other parts of the configuration are approximately the same as the above described configuration in FIGS. 36A, 36B and 37 and, therefore, the same symbols are attached to the same members, of which the descriptions are omitted.

It is preferable for the value of $\sin(\tan^{-1}(a/D))$ to be larger than two times the INA value wherein the length of one side of the square of the above pattern that allows a light blocking film to remain on the rear surface is a. Thereby, the instant angle component of the illumination on the side where a light blocking pattern exists can be completely blocked so as not to reach patterns $5b_1$ and $5b_2$ for position measurement.

In addition, it is preferable for the value of $\sin(\tan^{-1}(a/D))$ to be smaller than three times the INA value. In the case that the value of $\sin(\tan^{-1}(a/D))$ is three times the INA value, or greater, the lift blocking pattern becomes large when this is not necessary, the dimensions of the unit mask structures Q for focus monitoring become large so that a great number of the above described structures Q cannot be arranged on the mask and, therefore, it is desirable to make the above value three times, or smaller.

Each of patterns $5b_1$ and $5b_2$ for position measurement can be irradiated with the half illumination as shown in FIG. 51 with the photomask shown in FIGS. 50A, 50B and 51. Therefore, it is possible to carry out focus monitoring in the same manner as with photomask 5 shown in FIGS. 36A, 36B and 37.

Though in the above described first to eighth embodiments, pattern $5b_1$ for position measurement is a square aperture pattern used as an inner box pattern while pattern $5b_2$ for position measurement is an aperture pattern in a square frame form used as an outer box pattern, two patterns, $5b_1$ and $5b_2$, for position measurement are not limited to these forms.

Figure 52:
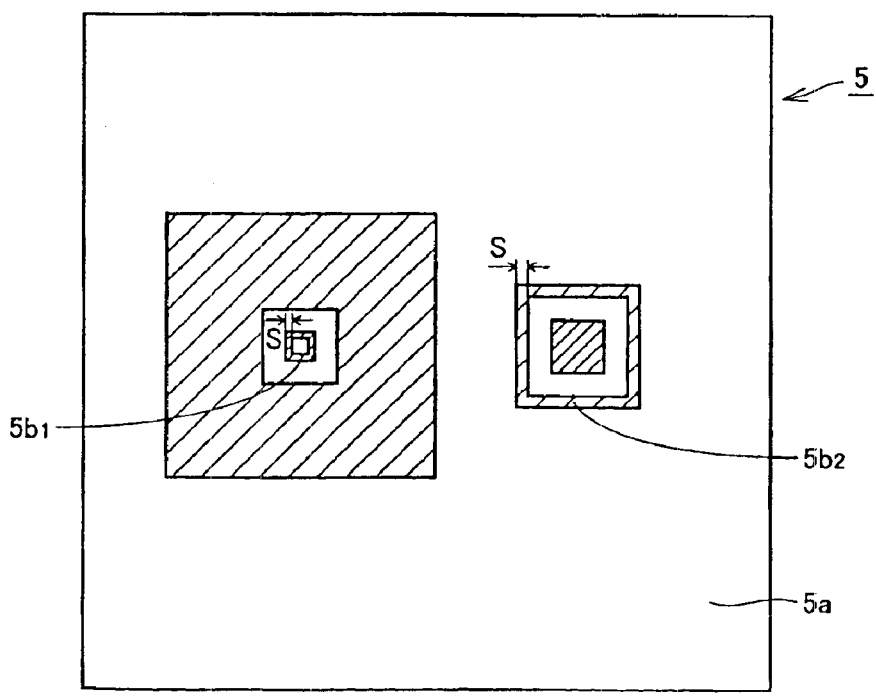
FIG. 52 is a view showing the pattern for position measurement as a line pattern formed of a remaining light blocking film in a square frame form.
Figure 53:
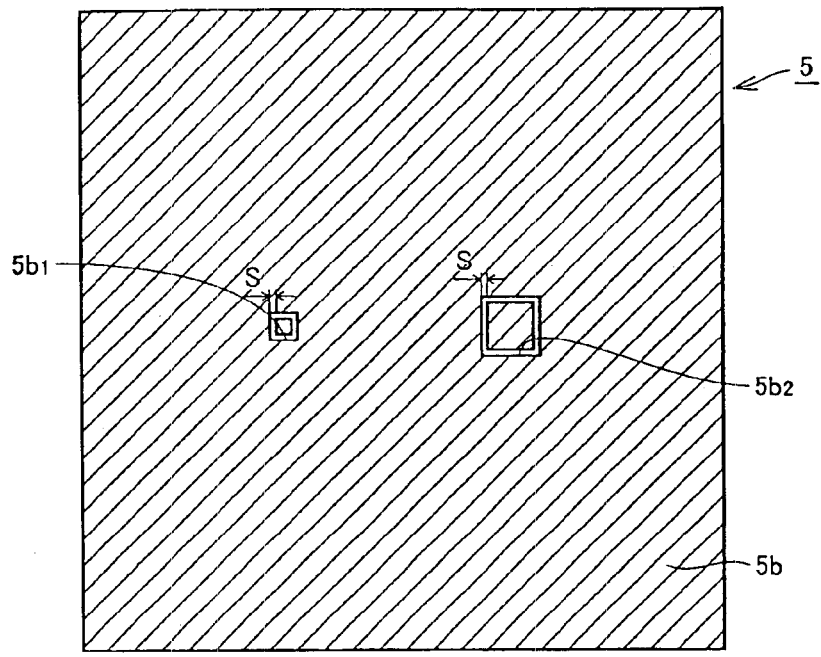
FIG. 53 is a view showing the pattern for position measurement as a space pattern formed of a square aperture in a frame form.
Figure 54:
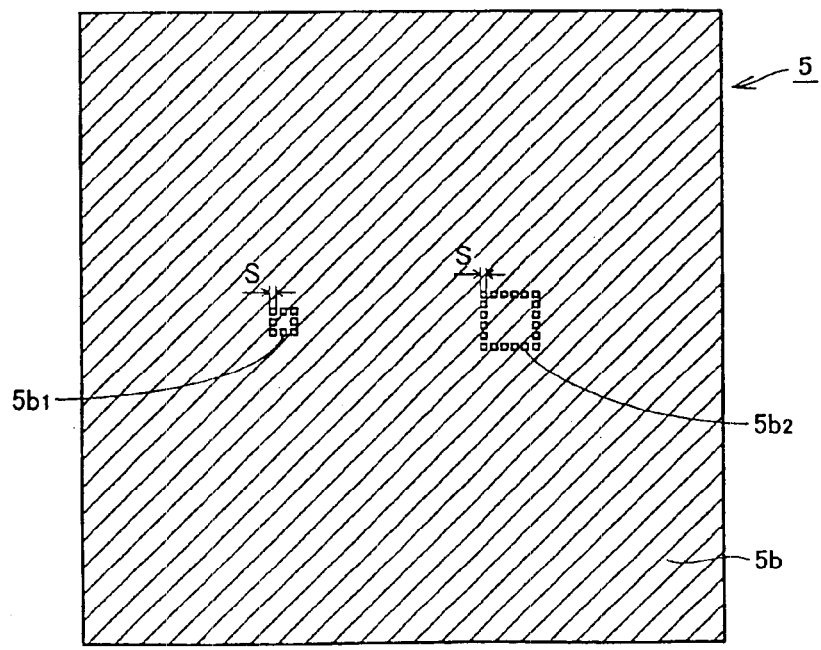
FIG. 54 is a view showing the pattern for position measurement as a pattern wherein a plurality of hole patterns are arranged in a square form.

Two patterns, $5b_1$ and $5b_2$, for position measurement may be line patterns that have a light blocking film remaining in a square frame form as shown in FIG. 52, may be space patterns formed as apertures in square frame forms as shown in FIG. 53 or may be patterns wherein a plurality of hole patterns are arranged in a square form as shown in FIG. 54.

In addition, in the first to eighth embodiments, it is preferable for the size S of the pattern in the box edge of, at least, either the inner box pattern or the outer box pattern to satisfy $S=k_1\times\lambda/NA(0.3<k_1<0.6)$ when the constant, which depends on the resist process and the image formation conditions, is $k_1$, the wavelength of the exposure light is $\lambda$ and the numerical aperture is NA. Thereby, the measurement of focus corresponding to the actual device becomes possible.

Figure 55:
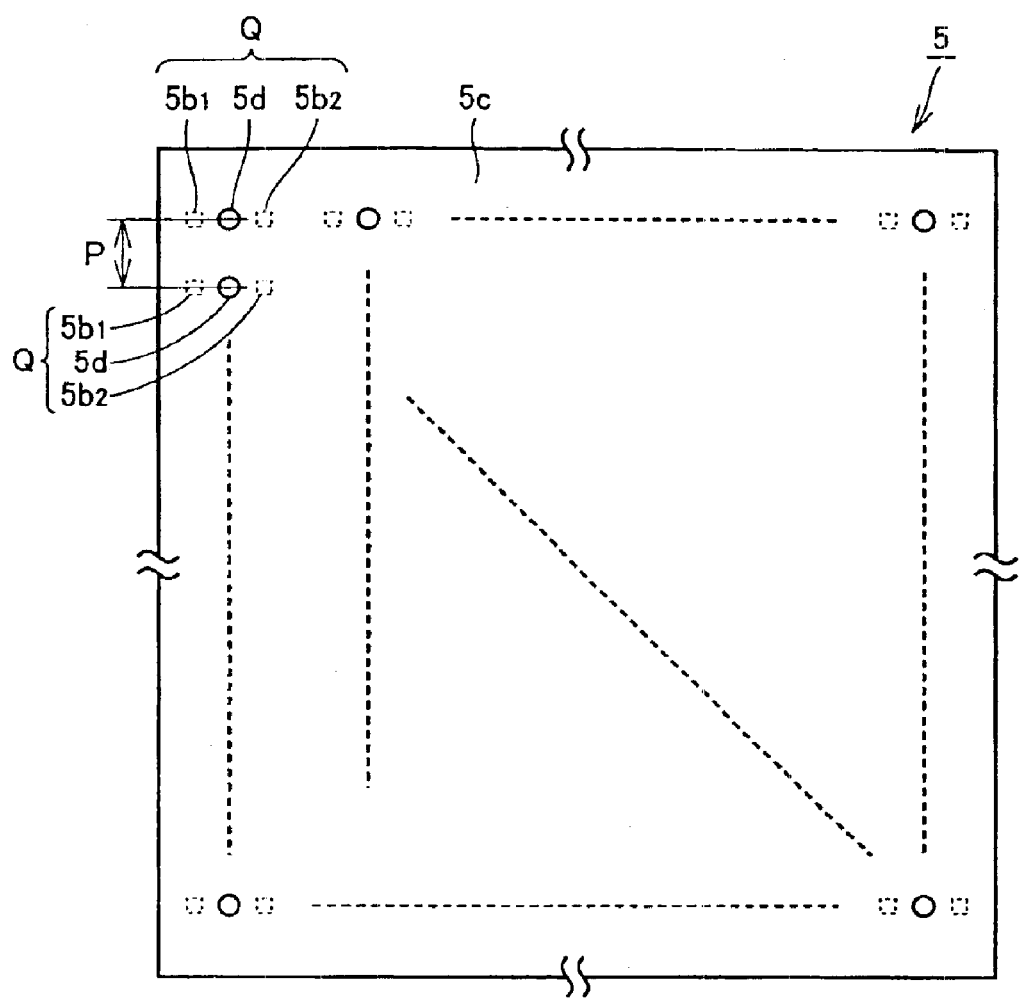
FIG. 55 is a view showing the appearance wherein a plurality of unit focus monitor structures are arranged in a photomask.
Figure 56:
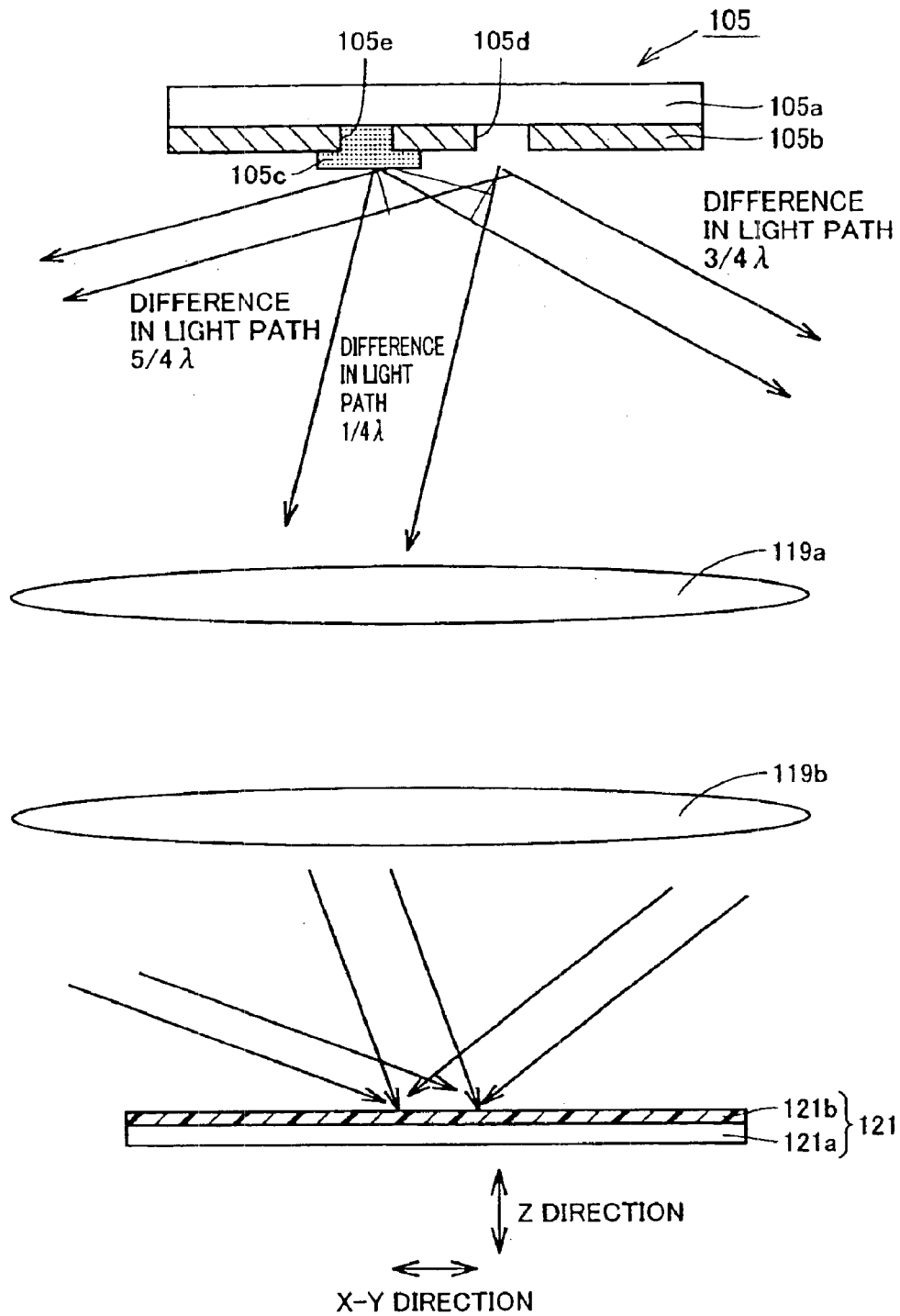
FIG. 56 is a view for describing a method of phase shift focus monitoring according to a prior art.
Figure 57:
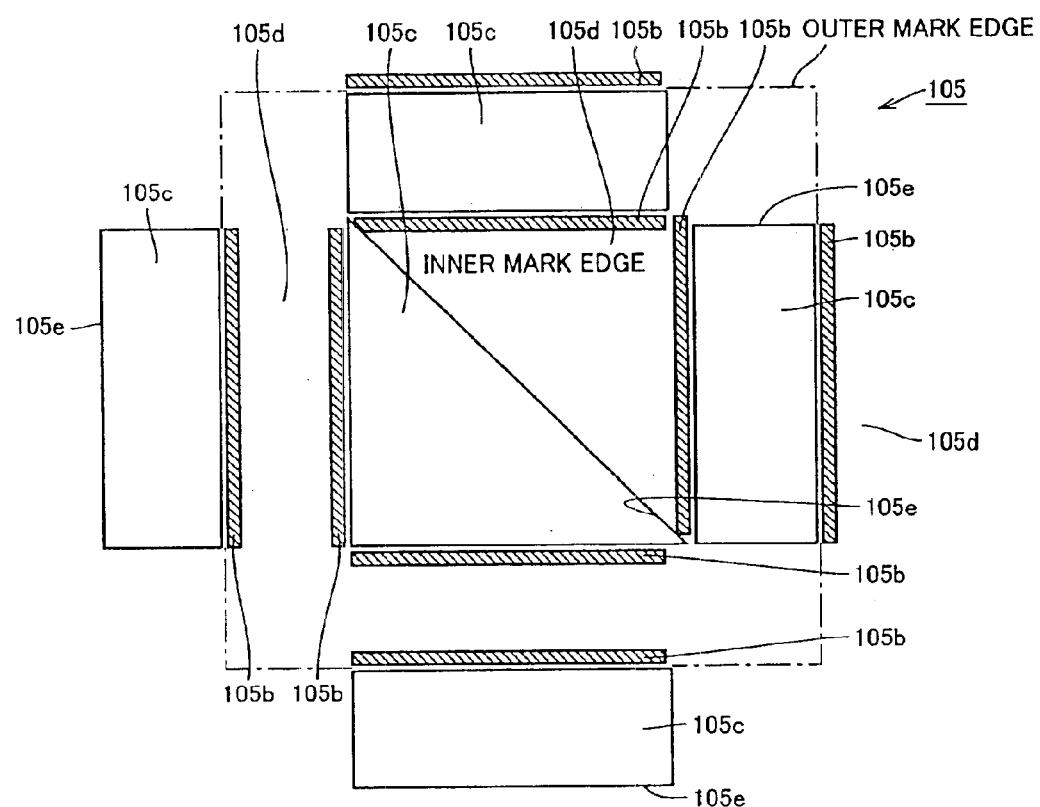
FIG. 57 is a view showing the configuration of a photomask used in the method of phase shift focus monitoring according to the prior art.
Figure 58:
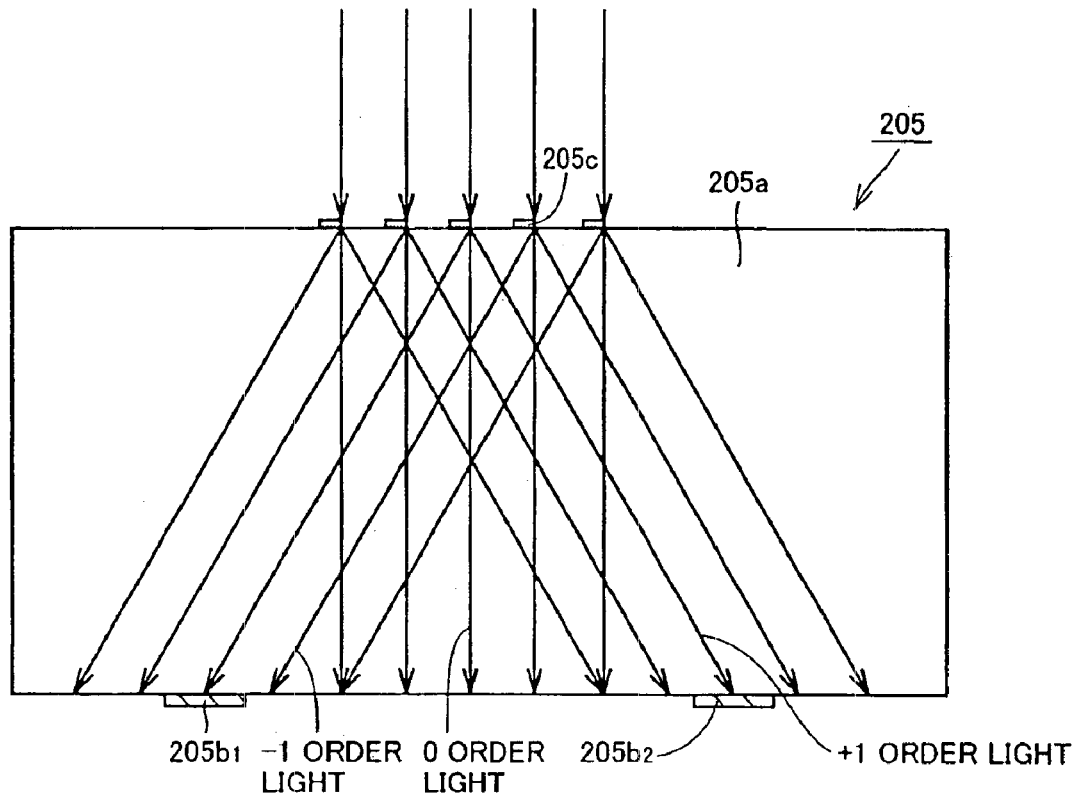
FIG. 58 is a schematic cross sectional view showing the configuration of a photo mask used in the method of focus monitoring disclosed in Japanese Patent Laying-Open No. 6-120116(1994)
Figure 59:
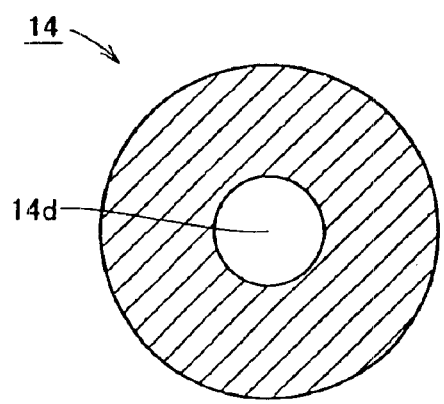
FIG. 59 is a view showing the configuration of an illumination diaphram used in the method of phase shift focus monitoring according to the prior art.

In addition, a plurality of focus monitoring unit mask structures Q provided with two patterns, $5b_1$ and $5b_2$, for position measurement shown in FIGS. 4A and 4B and aperture pattern $5d$ on the rear surface of the photomask may be arranged in photomask 5 as shown in FIG. 55. In this case, it is preferable for the pitch P between focus monitoring unit mask structures Q to be no less than 8 mm and no more than 20 mm. This is because such an arrangement makes it possible to sequentially measure the focus distribution within the exposure field.

In addition, in the first to eighth embodiments, it is preferable for distance M between two patterns, $5b_1$ and $5b_2$, for position measurement to be greater than 0.5 times, and smaller than four times, the product (=INA value×D) of the INA value (=NA×σ/projection magnification) that is the amount of spread of illumination and D when the thickness of the substrate is D, the numerical aperture is NA and the coherence that is the interference indication of the exposure light is σ. Thereby, the patterns for position measurement can be appropriately irradiated. In the case that distance M between the two patterns for position measurement is 0.5 times the INA value×D, or less, the difference of the incident angles of the illumination light with which the two patterns for position measurement are irradiated cannot be sufficiently secured. In addition, increasing the distance M between the two patterns for position measurement to four times the INA value×D, or greater, is substantially meaningless and a large number of structures cannot be arranged on the mask since unit mask structures for focus monitoring become large.

In addition, in FIG. 14, the maximum value Lmax of the distance between arbitrary mask structures N for correcting the amount of wafer position shift is greater than ½ of the dimension of the longitudinal direction of the exposure region for one shot when the pattern is transcribed to the photosensitive material. Thereby, in the case that the exposure region for one shot is exposed while being shifted in the rotational direction, the detection sensitivity of the shift amount in the rotational direction can be increased.

In addition, in the first to eighth embodiments, it is preferable for the step of measuring the distance between the respective image patterns of two patterns, $5b_1$ and $5b_2$, for position measurement that have been transcribed to the resist pattern to be carried out by using an overlap inspection unit for inspecting the positional shift of the overlapping by processing the images of the two image patterns that have been read in. Thereby, the positional shift can be measured with a high precision.

In addition, in the first to eighth embodiments, it is preferable for the step of measuring the distance between the mutual image patterns of two patterns, $5b_1$ and $5b_2$, for position measurement that have been transcribed to the resist pattern to be carried out by observing the positions of the two image patterns by means of a scanning-type electron microscope. Thereby, the positional shift can be easily measured.

In addition, in the first to eighth embodiments, it is preferable for two patterns, $5b_1$ and $5b_2$, for position measurement to be constructed so that the image pattern of, at least, either two patterns, $5b_1$ and $5b_2$, for position measurement becomes readable by means of a pattern position measurement mechanism that is integrally attached to the exposure unit. Thereby, measurement becomes possible by means of a unit of a simple configuration.

In addition, though a zonal illumination diaphram is described as illumination diaphram 14 in the above description, illumination diaphram 14 is not limited to this but, rather, it may be a modified illumination such as a quadruple polar illumination diaphram or an ordinary illumination other than the zonal illumination.

An actual transcription can be carried out with a precise focus in reference to the results gained in the first to sixth embodiments.

Here, the photoresist on the wafer surface is developed after being exposed with the optimal focus gained according to the method of focus monitoring of the above described seventh and eighth embodiments, thereby, the photoresist is patterned so that processes, such as etching or ion injection, can be carried out on the film that is the lower layer of the resist pattern by using the resist pattern so as to manufacture a desired semiconductor device with a high precision.

In addition, by utilizing a method of focus monitoring according to the present invention, other devices (units) such as a thin film magnetic head or a liquid crystal display element in addition to a semiconductor device can be formed with a high precision.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of focus monitoring used for focus monitoring that measures the position of an exposed surface in an optical system in order to adjust the focus of an optical image on the exposed surface at the time of pattern exposure, wherein focus monitoring is carried out by utilizing the characteristics wherein an image of the pattern of a photomask for focus monitoring formed on said photosensitive material surface by irradiating said photomask with the exposure light moves in the direction perpendicular to the optical axis when said photosensitive material surface is moved in the direction of said optical axis, wherein said photomask for focus monitoring comprises a substrate that allows the exposure light to pass through and unit mask structures for focus monitoring, wherein said unit mask structure for focus monitoring has:

two patterns for position measurement for measuring the mutual positional relationship formed on the surface of said substrate; and a light blocking film that is formed on the rear surface of said substrate and that has a rear surface pattern for substantially differentiating the incident directions, relative to said substrate, of the exposure light that enters said two patterns for position measurement, and wherein $L/\lambda$ is 10, or greater, wherein the dimension of said rear surface pattern is L and the wavelength of the exposure light is $\lambda$.

2. The method of focus monitoring according to claim 1, characterized by comprising the steps of:

applying a photoresist as said photosensitive material to the substrate;

exposing said applied photoresist to images of said two patterns for position measurement of said photomask for focus monitoring;

patterning said exposed photoresist through development so as to form a resist pattern; and focus monitoring based on the mutual distance between image patterns of said respective two patterns for position measurement that have been transcribed to the resist pattern.

3. The method of focus monitoring according to claim 2, characterized in that said step of exposing said applied photoresist to the images of said two patterns for position measurement of said photomask for focus monitoring comprises:

the first exposure step of exposing said photoresist to the images of said two patterns for position measurement of said photomask for focus monitoring;

the step of moving said substrate to which said photoresist is applied in the direction perpendicular to said direction of the optical axis; and the second exposure step of exposing said photoresist to the images of said two patterns for position measurement of said photomask for focus monitoring, wherein either of one of the images of said two patterns for position measurement to which said photoresist is exposed in said second exposure step overlaps the other one of the images of said two patterns for position measurement to said photoresist is exposed in said first exposure step.

4. A manufacturing method for an electronic device, characterized in that the method of focus monitoring according to claim 1 is used.

* * * * *